United States Patent [19]
Arimoto

[11] Patent Number: 5,798,976
[45] Date of Patent: Aug. 25, 1998

[54] SEMICONDUCTOR MEMORY DEVICE WITH REDUCED CURRENT CONSUMPTION IN DATA HOLDING MODE

[75] Inventor: Kazutami Arimoto, Hyogo, Japan

[73] Assignee: Mitsubishi Denki Kabushiki Kaisha, Tokyo, Japan

[21] Appl. No.: 768,078

[22] Filed: Dec. 16, 1996

[30] Foreign Application Priority Data

Dec. 18, 1995 [JP] Japan .................. 7-328740

[51] Int. Cl.[6] .................................. G11C 7/00
[52] U.S. Cl. ............ 365/222; 365/230.03; 365/226
[58] Field of Search ............... 365/222, 230.03, 365/226, 189.05

[56] References Cited

U.S. PATENT DOCUMENTS

| 5,410,507 | 4/1995 | Tazunoki et al. ............ 365/222 X |
| 5,535,169 | 7/1996 | Endo et al. ................. 365/230.03 |
| 5,537,564 | 7/1996 | Hazanchuk et al. ...... 365/230.03 X |
| 5,596,545 | 1/1997 | Lin ............................ 365/222 X |

FOREIGN PATENT DOCUMENTS

| 5-6669 | 1/1993 | Japan . |
| 6-103758 | 4/1994 | Japan . |
| 7-220469 | 8/1995 | Japan . |
| 7-220470 | 8/1995 | Japan . |

OTHER PUBLICATIONS

Yoshimoto, Masahiko, et al: "A 64Kb Full CMOS RAM with Divided word Line Structure", 1983 IEEE International Solid–State Circuit Conference. pp. 58–59. No Month.
Takashima, D., et al: "A Novel Power–Off Mode for a Battery–Backup DRAM", 1995 Symposium on VLSI Circuits of Technical Papers, pp. 109–110. No Month.
Kitsukawa, Goro, et al: "256Mb DRAM Technologies for File Applications", 1993 IEEE International Solid–State Circuits Conference. pp. 48–49. No Month.

Primary Examiner—Huan Hoang
Attorney, Agent, or Firm—McDermott, Will & Emery

[57] ABSTRACT

In a normal operation mode, a dynamic random access memory DRAM has a plurality of memory mats simultaneously selected. During a refresh operation, refreshing is effected simultaneously on a plurality of memory sub-arrays in one of the memory mats. A control signal only for one memory mat is required to be driven, so that a current consumption in a data holding mode can be reduced. Further, by reducing a circuit operation speed, a peak current can be reduced.

16 Claims, 26 Drawing Sheets

{ CAa,CAb : DEGENERATED
{ RAa,RAb : NON-DEGENERATED ( ) BITS IN PARENTHESES INDICATE
THOSE IN DATA HOLDING MODE

NORMAL MODE : CAa, CAb, RAa, RAb
↓ ↓ ↓ ↓
DATA HOLDING MODE : RAa, RAb, CAa, CAb

TO A CORRESPONDING
MEMORY MAT
(PERIPHERAL CIRCUITRY,
MEMORY ARRAY)

FIG.20A
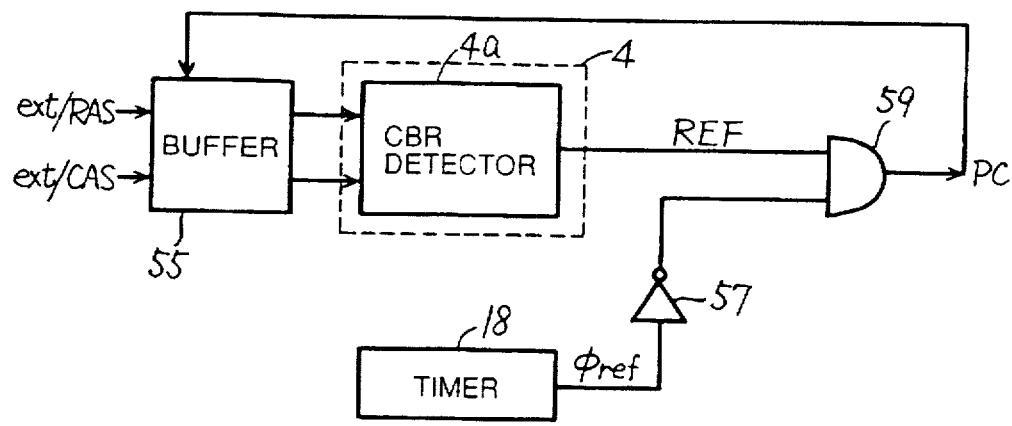
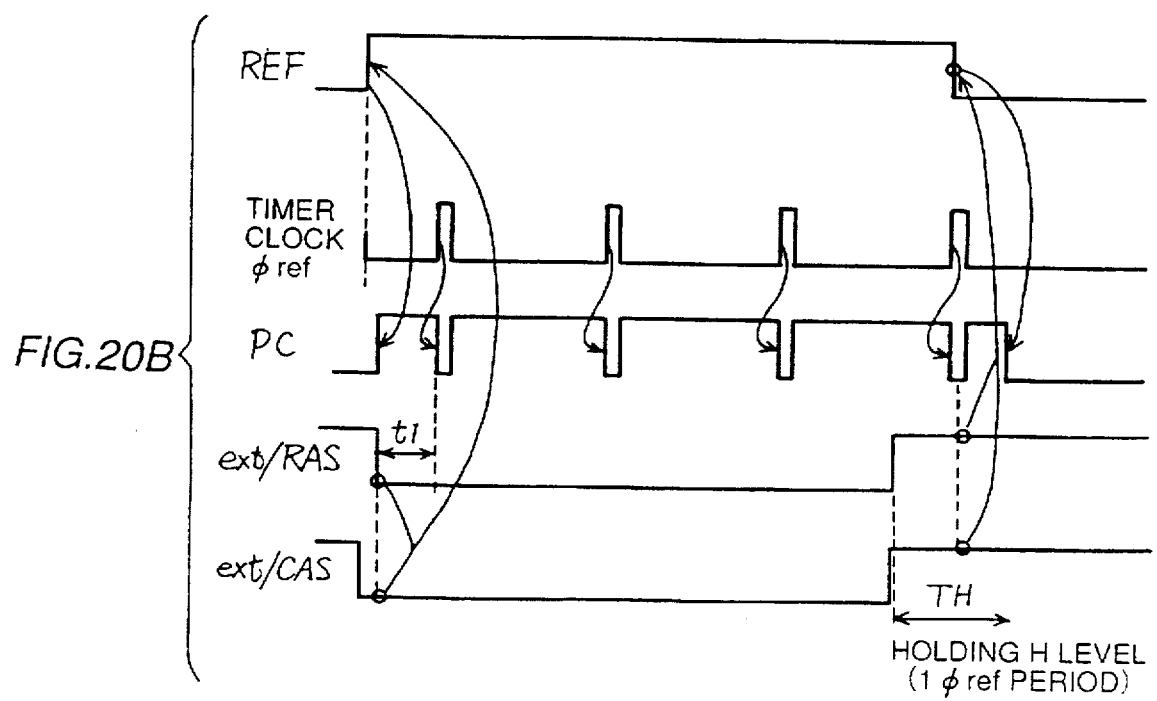
FIG.20B

FIG.21A
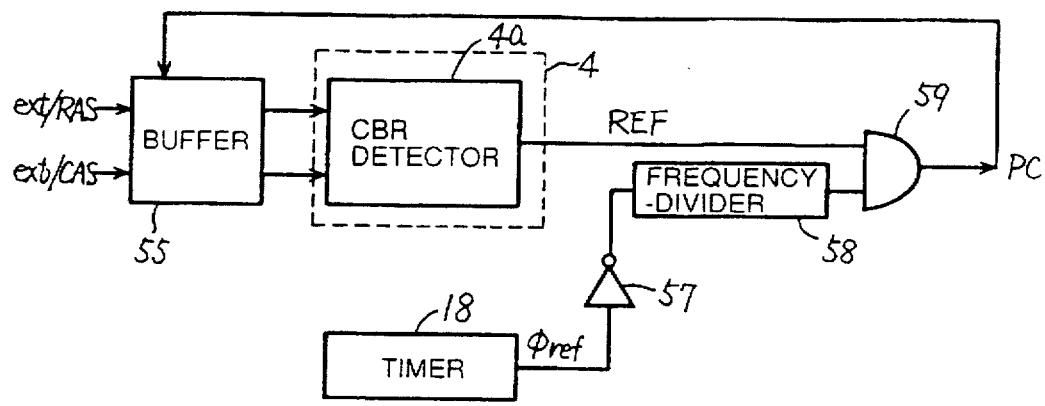
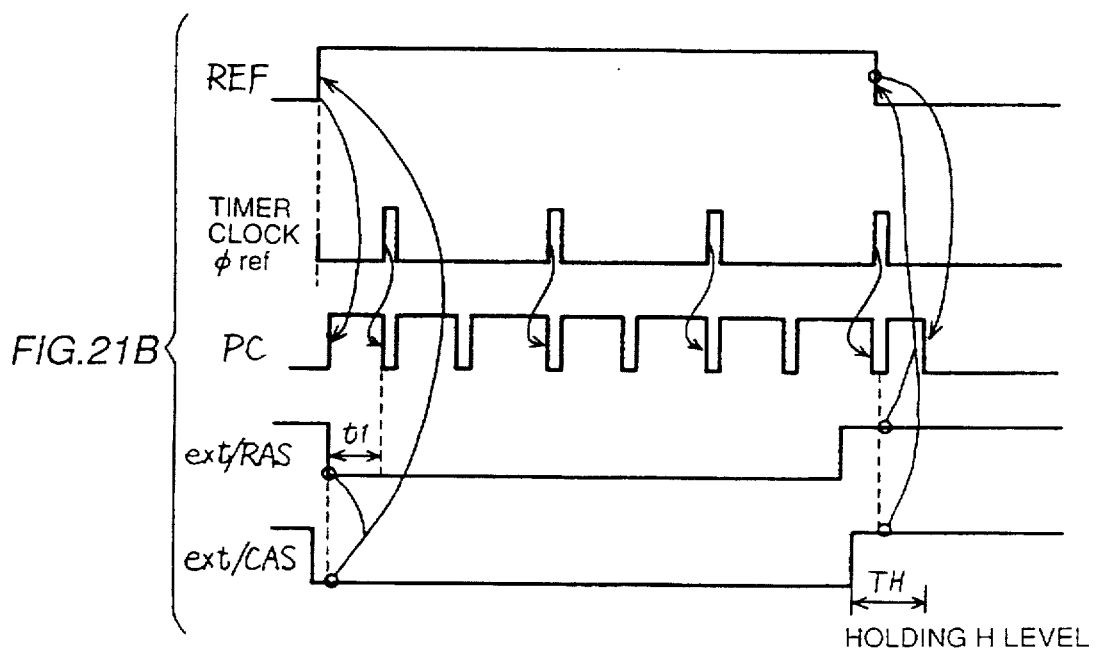
FIG.21B

MSi,RAi,RAj:UNCHANGED DURING BURST REFRESHING

SEMICONDUCTOR MEMORY DEVICE WITH REDUCED CURRENT CONSUMPTION IN DATA HOLDING MODE

BACKGROUND OF THE INVENTION

1. Field of the Invention

The present invention relates to a semiconductor memory device, and in particular to a structure for reducing a current consumption in a data holding mode for holding data stored in a dynamic memory cell.

2. Description of the Background Art

In a dynamic semiconductor memory device (which will be referred as a DRAM), a memory cell of one bit is formed of one MOS transistor (insulated gate field-effect transistor) and one capacitor. The DRAM has been widely used as a storage device of a large storage capacity, because an area occupied by a memory cell of one bit is smaller and a cost per bit is lower as compared to a static random access memory (SRAM) in which a memory cell of one bit requires a plurality of transistor elements.

The DRAM stores information in a form of electric charges. In order to prevent destruction of storage data which may be caused by reduction in quantity of the accumulated charges due to current leakage, it is necessary to perform refreshing for periodically reading and rewriting storage data from and into the memory cell.

In recent years, DRAMs have been widely used as main storage devices of portable terminals such as a laptop computer. Information equipments such as a portable terminal utilize a battery as an operation power source, and it is necessary to minimize a current consumption of the portable terminal in order to maximize a battery life. Even during a period in which information processing is not performed in the portable terminal, it is necessary to refresh periodically storage data of the DRAM. Such an operation mode is called "data holding mode" that only the refreshing of storage data of the memory cell is internally performed without performing input/output of data to and from the DRAM as described above.

In connection with this data holding mode, it has been attempted to reduce a current consumption, for example, by lowering a power supply voltage of the DRAM and/or increasing a length of period between refresh operations.

However, in order to increase the battery life in the battery-powered equipments, it is now required to reduce further the data holding current consumed in the data holding mode (i.e., current during the refreshing and current during standby).

SUMMARY OF THE INVENTION

An object of the invention is to provide a semiconductor memory device in which a current consumption in the data holding mode is reduced to a higher extent.

A semiconductor memory device according to the invention includes a plurality of memory mats each having a plurality of memory cells arranged in a matrix form, a detecting circuit for detecting, in accordance with an externally applied signal, designation of a data holding mode different from a normal operation mode for performing data input/output, and a mat changing circuit responsive to detection of the data holding mode by the detecting circuit to set the number of the selected memory mats among the plurality of memory mats to a value different from that of the memory mats selected in the normal operation mode.

Preferably, a plurality of memory blocks in each of the memory mats are simultaneously refreshed during refreshing.

Alternatively, in each of the memory mats, word lines are successively selected at a sub-array level in accordance with a frequency-divided signal of a refresh request signal.

Preferably, in the data holding mode, a power supply voltage is applied only to a portion related to the refresh operation and remaining portion is isolated from a power supply.

According to the above structure, a circuit operation is performed only at the necessary portion in the data holding operation, so that a portion consuming the current is reduced, and thus the current consumption is reduced.

Even when the power supply potential is not supplied to the memory mats, an intermediate potential may always be applied to the memory mats, whereby it is possible to prevent a biasing in a forward direction between a gate and a source of an access transistor in the memory cell. Thereby, a leak current through this access transistor is reduced, and storage data in a memory cell can be accurately held for a long term.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 20A shows a structure of a portion generating a power-cut designating signal;

FIG. 20B shows an operation waveform of the structure of FIG. 20A;

FIG. 21A shows a structure of a modification of the embodiment 3 of the invention;

FIG. 21B shows an operation waveform of the structure of FIG. 21A;

DESCRIPTION OF THE PREFERRED EMBODIMENTS

[Embodiment 1]

Figure 1A:
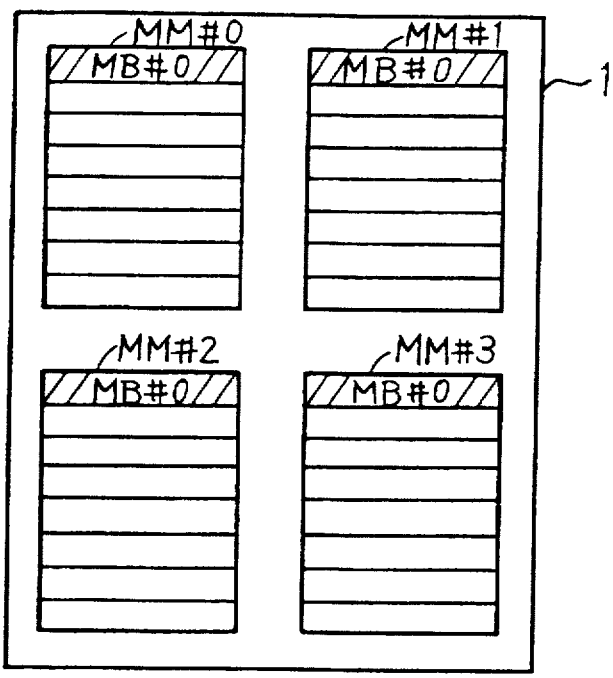
FIGS. 1A and 1B show an operation principle of a DRAM according to an embodiment 1 of the invention.
Figure 1B:
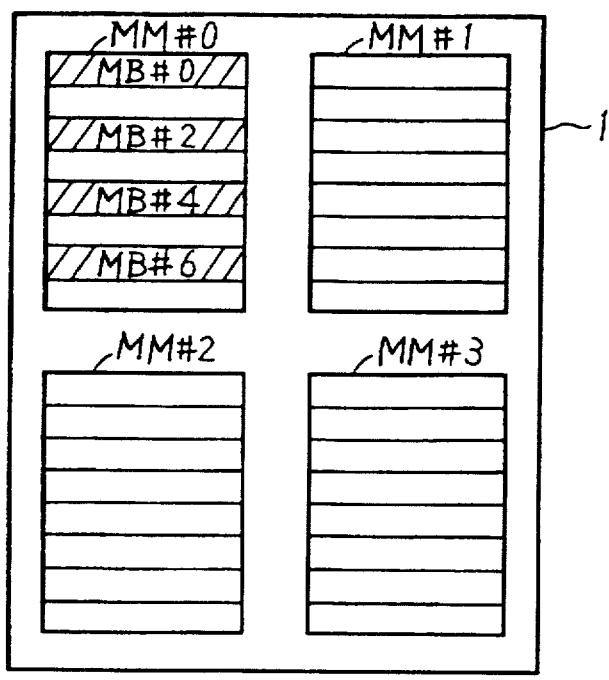

FIGS. 1A and 1B show arrangement of selected memory cells in a DRAM according to an embodiment 1 of the invention. FIG. 1A shows arrangement of the selected memory cells in a normal operation mode, and FIG. 1B shows the selected memory cells (refresh memory cells) during refreshing in a data holding mode.

In FIG. 1A, a semiconductor memory device 1 includes four memory mats MM#0–MM#3. In the following description, the "memory mat" is used as a term meaning a portion including a memory array in which memory cells are arranged in a matrix form as well as a peripheral circuit for driving the memory cells to a selected state. Each of memory mat MM#0–MM#3 has a plurality of sub-arrays. In the following description, eight sub-arrays MB#0–MB#7 are exemplified.

In a normal operation mode for performing data access for input/output of data with respect to selected memory cells, one of sub-arrays (MB#0 in FIG. 1A) in each of memory mats MM#0–MM#3 is selected. The memory cells are selected in each of the selected sub-arrays MB#0. As shown in FIG. 1A, the sub-arrays to be driven to the selected state are dispersed over respective memory mats MM#0–MM#3, so that it is possible to reduce a peak current during operation of sense amplifiers (during sensing and amplifying of data of the selected memory cells) in each of memory mats MM#0–MM#3, and thus noises on a power supply line are reduced. Even in a high-speed operation, therefore, operation can be performed at a high speed without taking a margin for an influence by power supply noises into consideration.

As shown in FIG. 1B, when storage data of memory cells is to be refreshed in the data holding mode operation, one (e.g., memory mat MM#0) among four memory mats MM#0–MM#3 is set to the selected state. In this selected memory mat MM#0, a plurality of sub-arrays (MB#0, MB#2, MB#4 and MB#6 in FIG. 1B) are driven to the selected state, and refreshing of storage data in memory cells are performed in selected sub-arrays MB#0, MB#2, MB#4 and MB#6. By concentrating the sub-arrays, in which the refreshing is to be done, in one memory mat, it is required to activate local activating signals, which activate the sub-arrays, for the only one memory mat. Therefore, it is not necessary to drive the local activating signals in all the control circuits provided at the respective memory mats, so that the current consumption can be reduced significantly.

Figure 2:
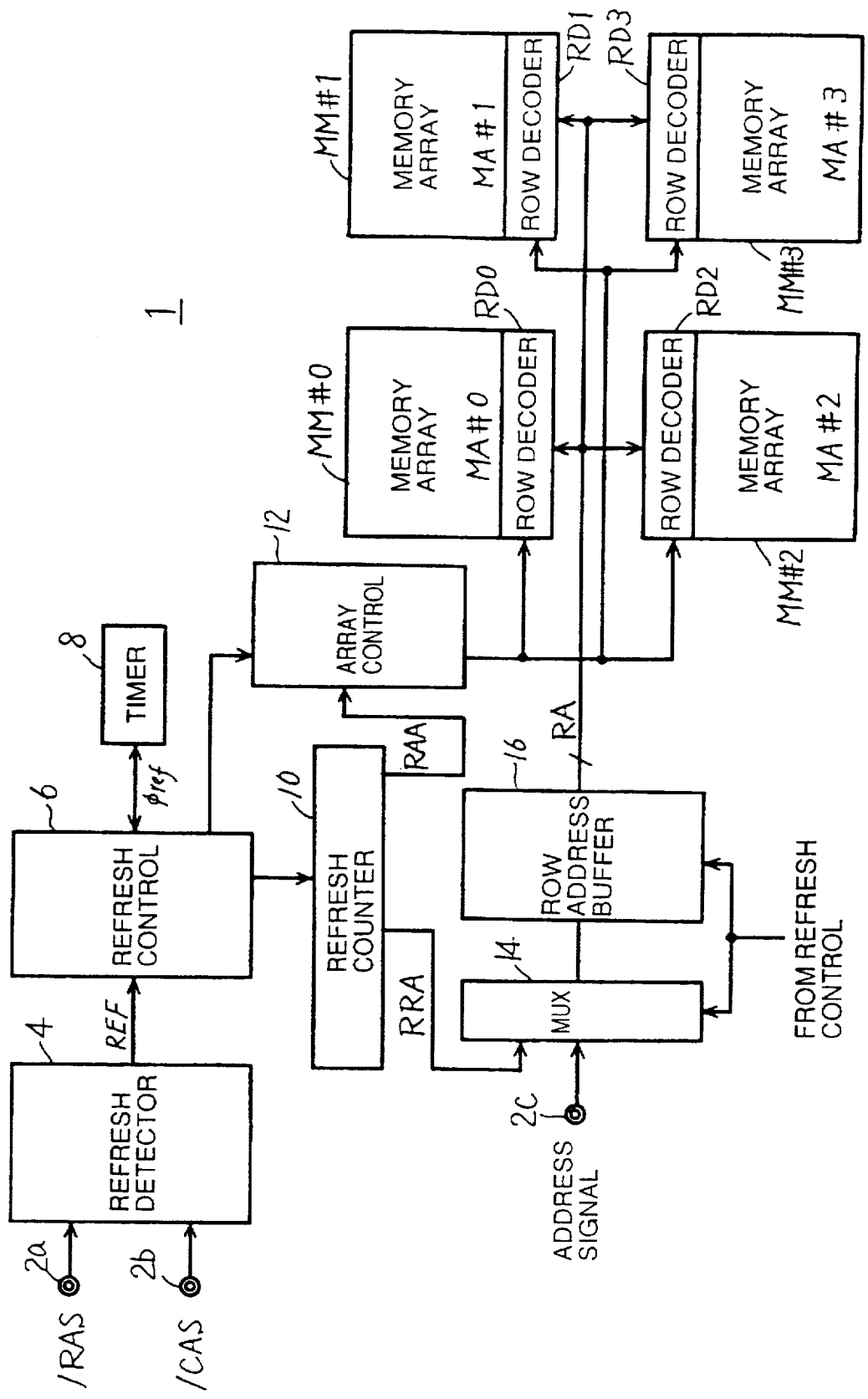
FIG. 2 schematically shows a structure of a main portion of the DRAM according to the embodiment 1 of the invention.

FIG. 2 is a block diagram schematically showing a structure of a portion related to the refreshing during the data holding mode operation of the semiconductor memory device (DRAM 1) according to the embodiment 1 of the invention. In FIG. 2, each of memory mats MM#0–MM#3includes memory arrays MA#0–MA#3each having a plurality of memory cells arranged in a matrix form. Also, memory mats MM#0–MM#3 include row decoders RD0–RD3 for driving a row of memory cells to be refreshed to the selected state, respectively.

DRAM 1 further includes a data holding mode detecting circuit (refresh detector) 4 which is responsive to an externally applied row address strobe signal /RAS received via an input terminal 2a and an externally applied column address strobe signal /CAS received via an input terminal 2b to determine whether the data holding mode is designated or not, a refresh control circuit 6 which is responsive to a data holding mode detecting signal REF applied from refresh detecting circuit 4 to perform various kinds of controls required for the refresh operation, a timer 8 which is activated in response to detection of the data holding mode by refresh control circuit 6 to generate a refresh request signal φref at predetermined intervals, and a refresh counter 10 which is activated in response to the control signal applied from refresh control circuit 6 to produce a refresh address designating a memory cell to be refreshed. Refresh counter 10 generates a refresh array designating address RAA designating a memory mat and a sub-array to be refreshed, and also generates a refresh row address RRA designating a sub-array and a row of the memory cells to be refreshed in the designated sub-array.

DRAM 1 further includes a multiplexer 14 which is responsive to the control signal applied from refresh control circuit 6 to pass selectively one of refresh row address RRA and the address signal externally applied via an input terminal 2c, a row address buffer 16 which is activated in response to the control signal (refresh operation activating signal) applied from refresh control circuit 6 to buffer the internal row address signal applied from multiplexer 14 for producing an internal row address signal, and an array control circuit 12 which is activated in response to the control signal applied from refresh control circuit 6 to decode array designating signal RAA applied from refresh counter 10 for generating a signal setting one of memory mats MM#0–MM#3 to the selected state.

When the data holding mode is designated, multiplexer 14 operates under the control of refresh control circuit 6 to select refresh address RRA applied from refresh counter 10 and apply the same to row address buffer 16. Row address buffer 16, of which internal structure will be described later in detail, degenerates the sub-array designating address for simultaneously selecting a plurality of sub-arrays, when the data holding mode is detected. Here, the term "degenerate" means to set both of complementary address signals to the selected state.

The array control circuit 12 operates under the control of refresh control circuit 6 to decode array address RAA applied from refresh counter 10 to select only one of the memory mats when the data holding mode is designated. When the data holding mode is not detected, i.e., in the normal operation mode, the array control circuit 12 sets all memory mats MM#0–MM#3 to the selected state. Now, structures and operations of the respective portions will be described below.

Figure 3:
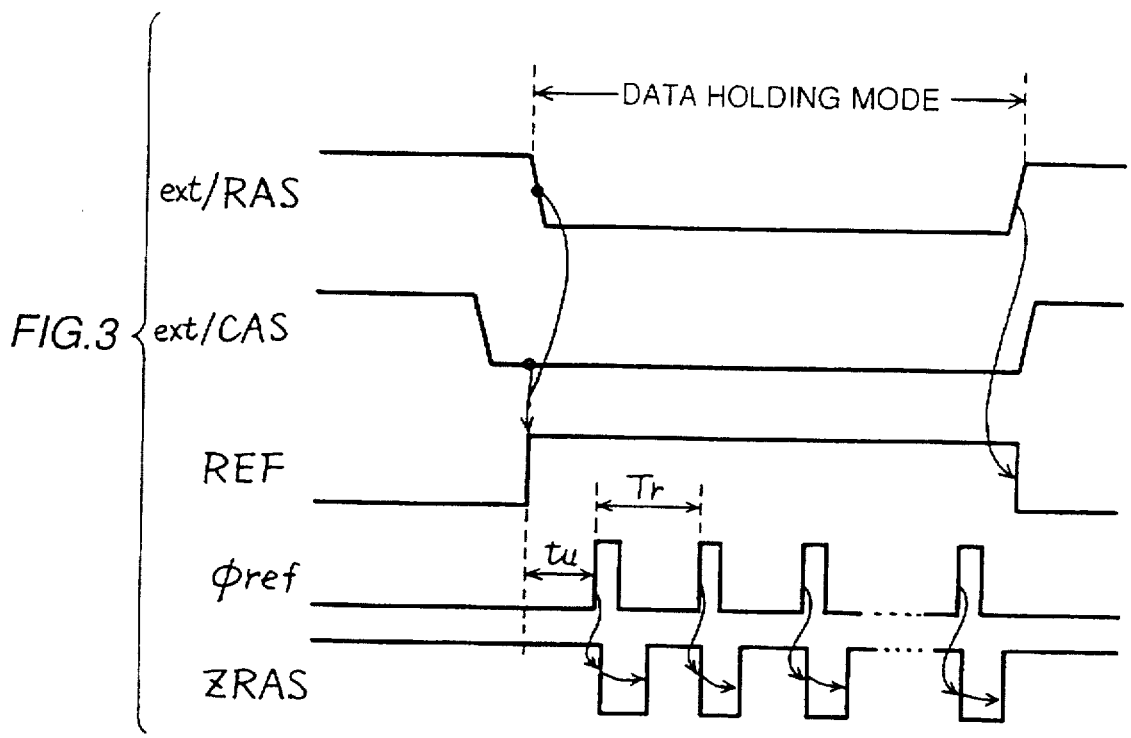
FIG. 3 is a waveform diagram representing an operation of the DRAM according to the embodiment 1 of the invention.

FIG. 3. is a waveform diagram representing operations of refresh detecting circuit 4 and refresh control circuit 6. In FIG. 3, if column address strobe signal /CAS attains L-level prior to falling of row address strobe signal /RAS, refresh detecting circuit 4 determines that the data holding mode is designated, and sets data holding mode detecting signal REF to the active state, i.e., H-level. Refresh control circuit 6 activates timer 8 in response to data holding mode detecting signal REF applied from refresh detecting circuit 4. Timer 8 is responsive to the activating signal applied from refresh control circuit 6 to generate a refresh request signal φref upon elapsing of a predetermined time period tu.

Refresh control circuit 6 is responsive to refresh request signal φref applied from timer 8 to activate a refresh operation activating signal ZRAS to L-level. Refresh operation activating signal ZRAS has the same function as internal row address strobe signal /RAS which is activated in response to activation of externally applied row address strobe signal /RAS during the normal operation. A difference between them is only that refresh operation activating signal ZRAS is maintained at the active state of L-level only for a predetermined period. In response to activation of refresh operation activating signal ZRAS, data of the memory cells are refreshed in accordance with the refresh address. Refresh control circuit 6 keeps timer 8 active while data holding mode detecting signal REF applied from refresh detecting circuit 4 is active (i.e., row address strobe signal /RAS is at L-level).

Timer 8 is responsive to the activating signal applied from refresh control circuit 6 to set refresh request signal φref to the active state of H-level at predetermined intervals Tr. In accordance with refresh request signal φref, refresh operation activating signal ZRAS is set to and kept at L-level of the active state for a predetermined period, during which the refreshing is performed. Upon every completion of the refreshing, a count of refresh counter 10 is changed, so that a position of the memory cell row to be refreshed subsequently is designated.

The structure of refresh detecting circuit 4 has the same structure as a conventional so-called "CBR detector".

Figure 4:
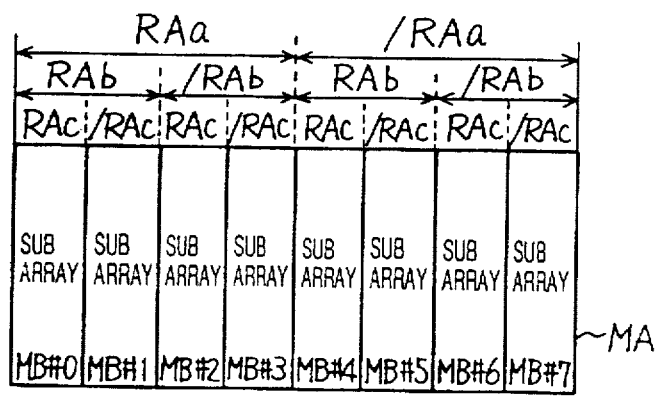
FIG. 4 shows allocation of address signals for sub-arrays in one memory mat of the DRAM according to the embodiment 1 of the invention.

FIG. 4 exemplifies allocation of the address signals of the memory mats shown in FIG. 2. More specifically, FIG. 4 shows the arrangement of sub-arrays in one memory array MA. The memory array MA includes eight sub-arrays MB#0–MB#7. Internal row address signal bits RAa and /RAa designate one of sub-array groups each including four sub-arrays MB#0–MB#3 or MB#4–MB#7. When internal row address signal bit RAa is at H-level, sub-arrays MB#0–MB#3 are designated. When row address signal bit /RAa is at H-level, sub-arrays MB#4–MB#7 are designated. Bits RAa and /RAa have mutually complementary logics.

Row address signal bits RAb and /RAb are used for selecting two of the four sub-arrays. When row address signal bit RAb is at H-level, sub-arrays MB#0 and MB#1 or sub-arrays MB#4 and MB#5 are designated. When row address signal bit /RAb is at H-level, sub-arrays MB#2 and MB#3 or sub-arrays MB#6 and MB#7 are designated. Sub-arrays bearing even numbers among eight sub-arrays MB#0–MB#7 are designated by a row address signal bit RAc, and sub-arrays bearing odd numbers are designated by a row address signal bit /RAc. Each of sub-arrays MB#0–MB#7 is selected when row address signal bits of 3 bits assigned to itself are at H-level.

Figure 5:
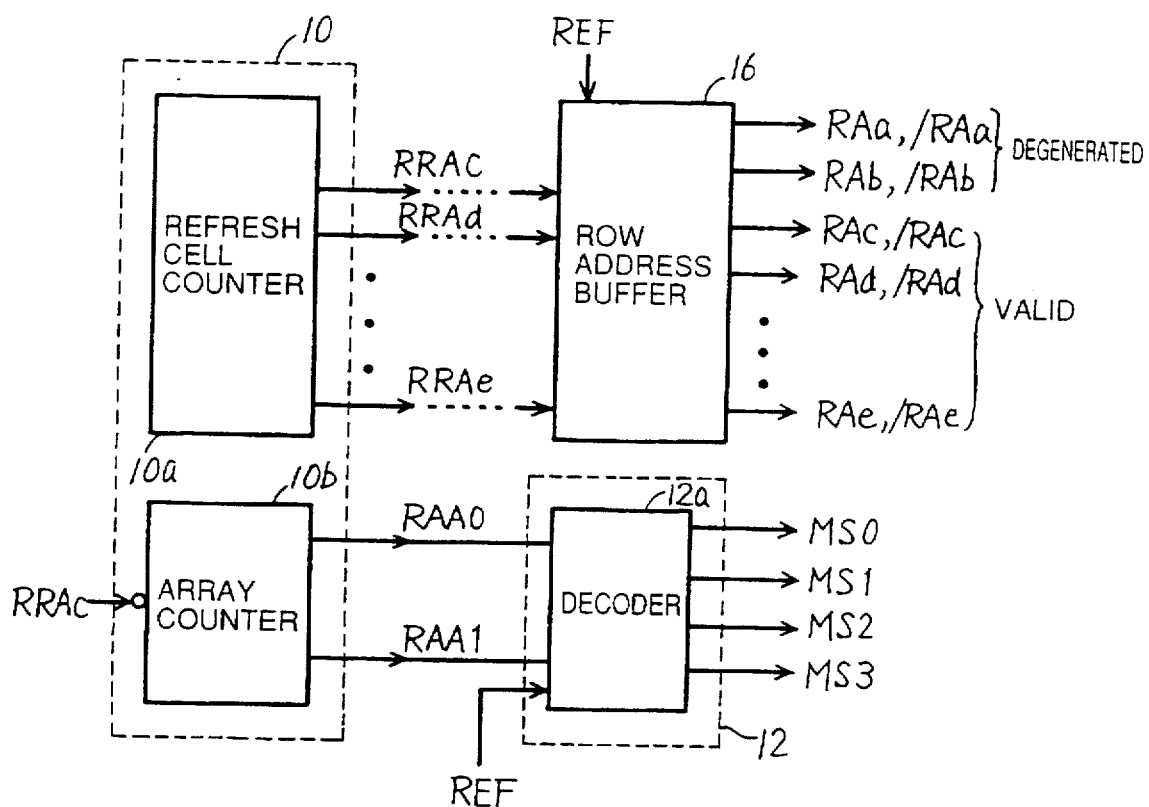
FIG. 5 shows a structure of a portion generating the address signals during the refresh operation in the embodiment 1 of the invention.

FIG. 5 schematically shows structures of the refresh counter, multiplexer and row address buffer shown in FIG. 2. For simplicity reason, FIG. 5 does not show a multiplexer for making switching between the refresh address and the externally applied address. FIG. 5 merely shows the row address signal bits which are applied from refresh counter 10 to row address buffer 16 and array control circuit 12 during refreshing as well as the row address signal bits produced therefrom.

In FIG. 5, refresh counter 10 includes a refresh cell counter 10a which produces address signal bits RRAc–R-

RAe designating the memory cell and row block (sub array) to be refreshed, and an array counter 10b which counts falling of address signal bit RRAc produced from refresh cell counter 10a. Refresh cell counter 10a outputs the address signal bits, among which address signal bit RRAc is the highest bit and the address signal bit RRAe is the lowest bit. Address signal bits RRAc-RRAe designate the memory cells to be refreshed in respective memory mats MM#0-MM#3.

Array counter 10b increments (or decrements) the count represented by address signal bits RAA0-RAA1 generated therefrom by one when row address signal bit RRAc falls. Thus, falling of address signal bit RRAc from H-level to L-level indicates that all the memory cells have been refreshed in one memory mat.

Row address buffer 16 buffers address signal bits RRAc-RRAe applied from refresh cell counter 10a to produce complementary address signal bits RAa and /RAa-RAe and /RAe. Row address buffer 16 degenerates address signal bits RAa, /RAa, RAb and /RAb designating the groups of sub-arrays in respective memory mats M#0-M#3 in the data holding mode. Therefore, in each of memory mats M#0-M#3, the sub-arrays bearing odd numbers or even numbers are selected in accordance with address signal bits RAc and /RAc.

When data holding mode designating signal REF is active, array control circuit 12 decodes address signal bits RAA0 and RAA1 generated from array counter 10b to select one of mat designating signals MS0-MS3 which designate memory mats M#0-M#3, respectively. When data holding mode designating signal REF is inactive, decoder 12a sets all of mat designating signals MS0-MS3 to the selected state. Thereby, when refreshing is performed in the data holding mode, the plurality of sub-arrays bearing odd numbers or even numbers are refreshed in one of the memory mats, and a predetermined number of sub-array (one sub-array) in each of the memory mats is selected for accessing data in the normal operation mode.

Figure 6:
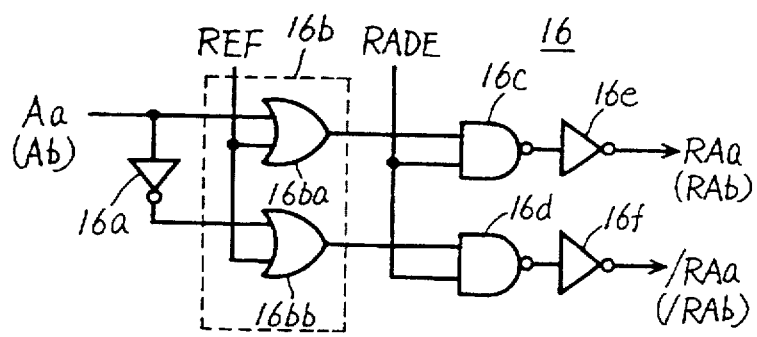
FIG. 6 shows an example of a structure of a row address buffer shown in FIG. 5.

FIG. 6 shows a structure of a portion of row address buffer 16 shown in FIG. 5, and specifically shows the portion producing address signal bits RAa and RAb as well as /RAa and /RAb for designating the sub-array group. Since address signal bits RAa and /RAa and address signal bits RAb and /RAb are generated from the buffer circuits of the same structure, FIG. 6 shows only one buffer circuit portion.

In FIG. 6, row address buffer 16 includes an inverter 16a which receives and inverts address signal bit Aa (Ab) externally supplied thereto via the multiplexer during the normal operation, a bit changing circuit 16b which receives address signal bit Aa and the output signal of inverter 16a to degenerate the same in the data holding mode, an NAND circuit 16c which receives the output signal of bit changing circuit 16b and address buffer activating signal RADE, an NAND circuit 16d which receives the output signal of bit changing circuit 16e and address buffer activating signal RADE, an inverter 16e which receives the output signal of NAND circuit 16c, and an inverter 16f which receives the output signal of NAND circuit 16e. Inverter 16e generates internal row address signal bit RAa (RAb), and inverter 16f generates internal row address signal bit /RAa (/RAb).

Bit changing circuit 16b includes an OR circuit 16ba receiving address signal bit Aa and data holding mode designating signal REF, and an OR circuit 16bb receiving the output signal of inverter 16a and data holding mode designating signal REF. The output signal of OR circuit 16ba is applied to one input of NAND circuit 16c, and the output signal of OR circuit 16bb is applied to one input of NAND circuit 16d.

Figure 7:
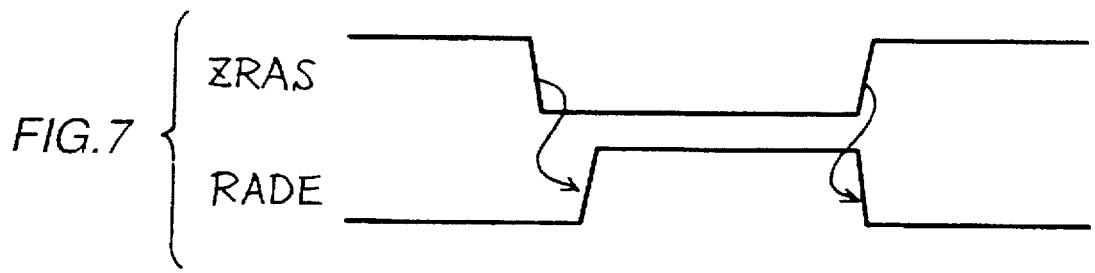
FIG. 7 shows a way of generation of an address buffer activating signal shown in FIG. 6.

In the normal operation mode, data holding mode designating signal REF is at L-level, and OR circuits 16ba and 16bb operate as a buffer circuit. Therefore, bit changing circuit 16b produces mutually complementary address signal bits Aa (Ab) and /Aa and (Ab) from address signal bit Aa. In the data holding mode, the signal REF is at H level, and OR circuits 16ba and 16bb each generate an H level signal. Address buffer activating signal RADE is activated to attain H-level in response to activation of refresh operation activating signal ZRAS when the refresh operation is active, as shown in FIG. 7. In response to this activation of buffer activating signal RADE, NAND circuits 16c and 16d each operate as an inverter to produce internal row address signal bits RAa (RAb) and /RAa (/RAb) in accordance with the signal applied from bit changing circuit 16b. In the data holding mode, therefore, all row address signal bits RAa, /RAa, RAb and /RAb are set to H-level. Therefore, as shown in FIG. 4, sub-arrays bearing the even numbers or odd numbers among sub-arrays MB#0-MB#7 in memory mat MA are selected in accordance with internal row address signal bits RAc and /RAc.

A portion of row address buffer 16 for lower address signal bits RAc-RAe has the same structure as that shown in FIG. 6 except for that bit changing circuit 16b shown in FIG. 6 is eliminated.

Refresh operation activating signal ZRAS is produced having a predetermined time width in the refresh operation mode. In the normal operation mode, it is activated in response to externally applied row address strobe signal /RAS, and is kept active in a period which is determined by external row address strobe signal /RAS.

In the structure of row address buffer 16 shown in FIG. 6, the logic level of address signal bit Aa (Ab) applied from the multiplexer in the data holding mode operation may be either H-level or L-level. Therefore, the multiplexer may include such a structure that, during the operation in the data holding mode, portions corresponding to address signal bits Aa and Ab are set to the output high impedance state, or the multiplexer for that portion may be eliminated.

Figure 8:
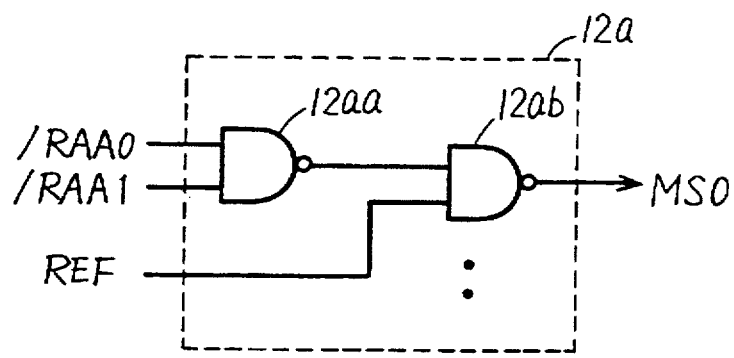
FIG. 8 schematically shows a structure of an array decoder included in an array control circuit shown in FIG. 5.

FIG. 8 schematically shows a structure of decoder 12a shown in FIG. 5. More specifically, FIG. 8 shows a portion of the decoder circuit for selecting memory mat M#0. Decoder 12a includes an NAND circuit 12aa which receives array address signal bits /RAA0 and /RAA1 generated from array counter 10b (see FIG. 5), and an NAND circuit 12ab which receives the output signal of NAND circuit 12aa and data holding mode designating signal REF. NAND circuit 12ab generates mat designating signal MS0 designating memory mat M#0. In the normal operation mode, data holding mode designating signal REF is at L-level, and mat designating signal MS0 generated from NAND circuit 12ab is at H-level. Circuit portions for designating the other memory mats have the structures similar to the above. Therefore, all memory mats M#0-M#3 are selected in the normal operation mode.

During operation in the data holding mode, data holding mode designating signal REF is active and thus at H-level, and NAND circuit 12ab operates as an inverter. NAND circuit 12aa generates a signal at L-level when both bits /RAA0 and RAA1 generated from array counter 10b are at H-level. Each of memory mats M#1-M#3 is supplied with a signal formed of a predetermined combination of output bits RAA0, /RAA0, RAA1 and /RAA1 of the array counter. During the operation in the data holding mode, therefore, only one of memory mat designating signals MS0-MS3 for designating memory mats M#0-M#3 is set to the selected state. Thereby, the data holding operation, i.e., refreshing can be effected on only one memory mat.

Figure 9:
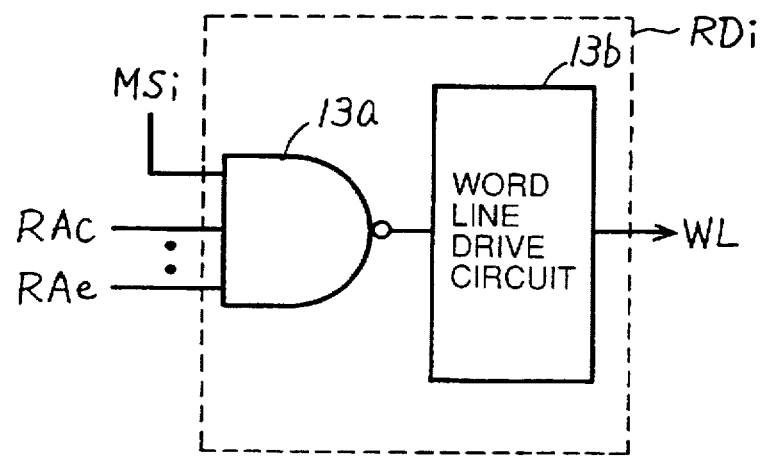
FIG. 9 schematically shows a structure of a unit decode circuit included in a row decoder shown in FIG. 2.

FIG. 9 schematically shows one of structures of row decoders RD0–RD3 shown in FIG. 2. More specifically, FIG. 9 schematically shows a structure of the decode circuit related to one of word lines WL in memory mat M#i (i=0, 1, 2 and 3). Row decoder RDi includes an NAND circuit 13a which receives memory mat designating signal MSi and a predetermined combination of internal row address signal bits RAc–RAe, and a word line drive circuit 13b for driving word line WL to the selected state (generally, internal high voltage Vpp level) in accordance with the output signal of NAND circuit 13a.

The NAND circuit 13a generates the signal at L-level indicative of the selected state when all the signals applied thereto are at H-level. In the normal operation mode, memory mat designating signal MSi is at H-level. Meanwhile, in the data holding mode operation, only one of memory mat designating signals MS0–MS3 is set to the selected state of H-level. Therefore, the row decoder performs decoding only in the selected memory mat, so that refreshing is effect only on the one memory mat.

In the structure shown in FIG. 9, NAND circuit 13a functionally exhibits a structure of a row decoder. A following structure may be used. That is, an address signal bit RAc designating the sub-array is applied to a so-called block decoder. A row decoder circuit provided corresponding to the sub-array is activated in accordance with the output signal of the block decoder (i.e., decoder for driving the sub-array to the selected state). Naturally, a structure of a so-called predecoder may be used.

[Modification]

Figures 10A, 10B:
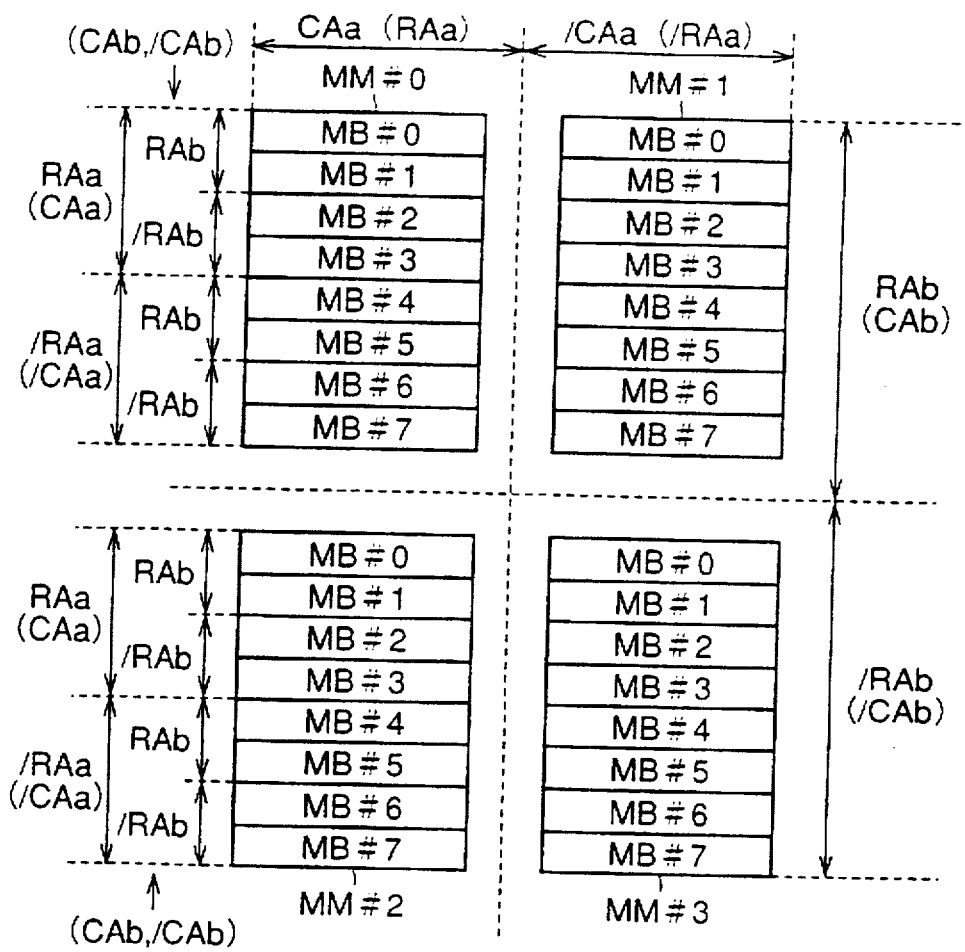
FIGS. 10A and 10B show a structure of a modification of the embodiment 1.

FIG. 10A shows a structure of a modification of the DRAM according to the embodiment 1 of the invention. More specifically, FIG. 10A shows arrangement of address signals for four memory mats MM#0–MM#3 and sub-arrays MB#0–MB#7. In the arrangement shown in FIG. 10A, column address signal bits CAa, /CAa, CAb and /CAb are allocated to memory mats MM#0–MM#3 in the normal operation mode. In the normal operation mode, these column address signal bits CAa, /CAa, CAb and /CAb are in the degenerated state and all are set to the selected state. In each of memory mats MM#0–MM#3, row address signal bits RAa, /RAa, RAb and /RAb selecting sub-arrays MB#0–MB#7 are allocated in the same manner as those in the foregoing embodiment (see FIG. 4).

In the data holding mode, one memory mat is designated, and a plurality of sub-arrays are selected in the selected memory mat. In the data holding mode, column address signal bits CAa and CAb to be degenerated in the normal operation mode are exchanged with row address signal bits RAa and RAb to be non-degenerated in the normal operation mode.

More specifically, in the data holding mode, column address signal bits CAa and CAb are changed into row address signal bits RAa and RAb, respectively, and row address signal bits RAa and RAb are changed into column address signal bits CAa and CAb, respectively, as shown in FIG. 10B. In the DRAM, degenerated column address signal bits CAa and CAb are selected internally (during memory cell selecting operation). Therefore, despite the fact that column address signal bits are used as the row address signal bits, the internal operation is performed to select the memory cells in accordance with refresh operation activating signal ZRAS. Therefore, as represented with parentheses in FIG. 10A, either the group of sub-arrays MB#0–MB#3 or the group of sub-arrays MB#4–MB#7 is selected by column address signal bits CAa and /CAa in the data holding mode operation, and two sub-arrays in each group are selected by column address signal bits CAb and /CAb. Since column address signal bits CAa, /CAa, CAb and /CAb are in the degenerated state, all of them are selected. In the data holding mode, therefore, sub-arrays bearing odd or even numbers are selected in accordance with row address signal bits RAc and /RAc (see FIG. 4).

Also in the data holding mode operation, the memory mat is designated by row address signal bits RAa, /RAa, RAb and /RAb. Since these row address signal bits are in the non-degenerated state, one memory mat among four memory mats MM#0–MM#3 is set to the selected state.

Figure 11:
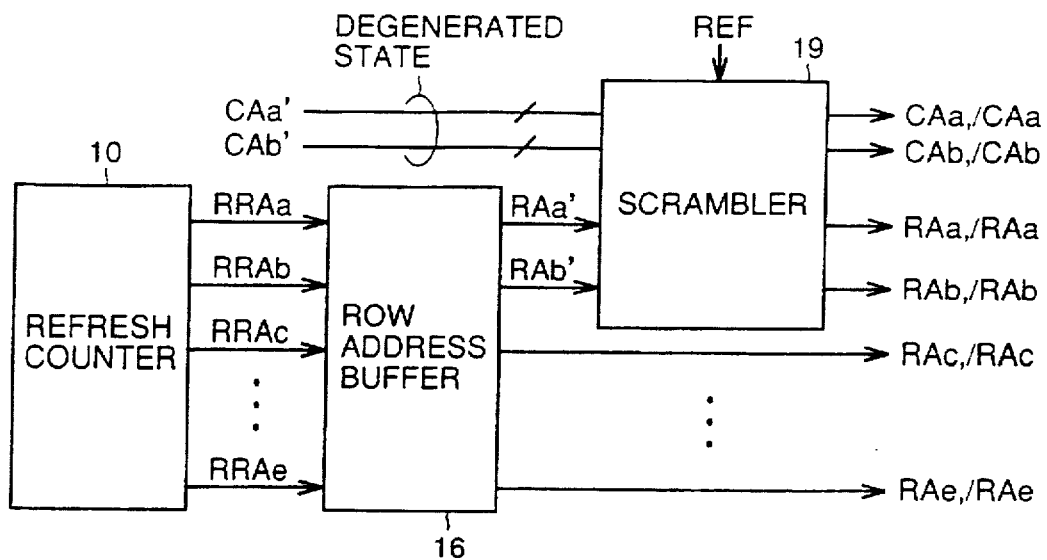
FIG. 11 shows a structure of a portion for achieving address change shown in FIGS. 10A and 10B.

FIG. 11 schematically shows a structure of a portion performing the address conversion shown in FIG. 10. For simplicity reason, FIG. 11 does not show a multiplexer for making switching between the externally applied address signal and the internally generated refresh address. In FIG. 11, the address conversion portion includes a row address buffer 16 which receives refresh addresses RRAa, RRAb, RRAc–RRAe from refresh counter 10 to produce internal row address signal bits in the data holding mode, and a scrambler 19 which receives row address signal bits RAa, /RAa, RAb and /RAb applied from row address buffer 16 and degenerated column address signal bits CAa' and CAb' applied from the column address buffer (not shown), and exchanges column address signal bits CAa' and CAb' with the row address signal bits applied from row address buffer 16 when data holding mode designating signal is active. Row address buffer 16 produces and applies internal row address signal bits RAc and /RAc–RAe and /RAe to the row decoders provided at the respective memory mats. When data holding mode designating signal REF is active, scrambler 19 generates column address signal bits CAa' and CAb' as internal row address signal bits RAa and RAb, and also generates the row address signal bits applied from row address buffer 16 as column address signal bits CAa and CAb. When data holding mode designating signal REF is inactive, scrambler 19 does not perform the bit exchange, and outputs the received address signal bits.

In the structure shown in FIG. 11, when the count of refresh counter 10 changes from its minimum value through the maximum value, all the memory cells in all the memory mats are once refreshed. Therefore, the processing is performed merely to scramble column address signal bits CAa' and CAb', which are always in the degenerated state, and row address signal bits RAa' and RAb' applied from row address buffer 16 in the scrambler 16, and multiple sub-arrays can be easily selected in one memory mat in the data holding mode by a simple circuit structure.

Figure 12:
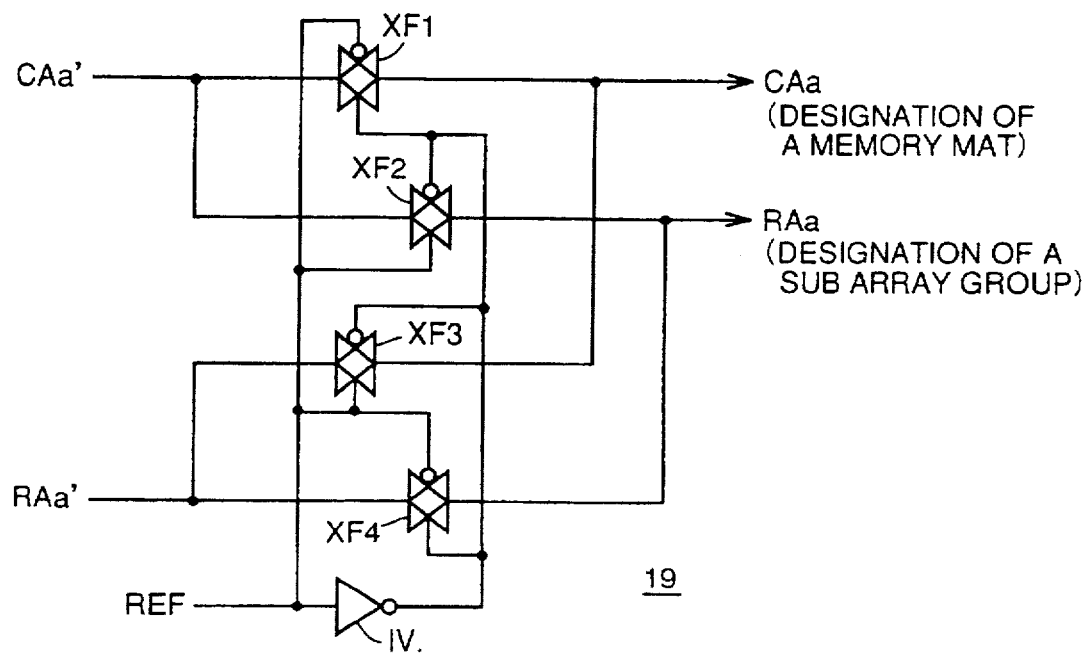
FIG. 12 shows a specific structure of scrambler shown in FIG. 11.

FIG. 12 shows a portion of the scrambler shown in FIG. 11 related to the address signal of one bit. All the structures arranged in the scrambler have the same structure as that in FIG. 12 and are equal in number to the required bits. In FIG. 12, scrambler 19 includes a bidirectional transmission gate XF1 which is turned on upon activation of data holding mode designating signal REF, and thereby generates column address signal bit CAa' as internal column address signal bit CAa, a bidirectional transmission gate XF2 which is turned on upon activation of data holding mode designating signal REF, and thereby generates column address signal bit CAa' as row address signal bit RAa, a bidirectional transmission gate XF3 which is turned on upon activation of data holding mode designating signal REF, and thereby generates row address signal bit RAa' as internal column address signal bit CAa, and a bidirectional transmission gate XF4 which is turned on upon activation of data holding mode designating signal REF, and thereby generates row address signal bit RAa' as internal row address signal bit RAa.

Each of bidirectional transmission gates XF1–XF4 is formed of CMOS transistors, and, for the purpose of controlling on/off of the CMOS transistors, there is provided an inverter IV which inverts data holding mode designating signal REF. Transmission gates XF1–XF4 have their on and off states controlled by data holding mode designating signal REF and the inverted data holding mode designating signal generated from inverter IV.

The structure shown in FIG. 12 operates only to switch transmission paths of column address signal bit CAa' and row address signal bit RAa' by transmission gates XF1–XF4. In the normal operation mode, address signal bits CAa' and RAa' are generated as internal address signal bits CAa and RAa, respectively. In the data holding mode operation, address signal bits CAa' and RAa' are generated as address signal bits RAa and CAa, respectively. Column address signal bit CAa' is in the degenerated state, and is always in the selected state. By merely switching the transmission paths, therefore, it is possible to obtain easily the address signal bits which are set to the degenerated state in the data holding mode.

FIG. 12 does not show a portion receiving address signal bits CAa and RAa. Internal column address signal bit CAa is applied to the mat decoder portion for selecting the memory mat, and internal row address signal bit RAa is applied to row decoders (RD0–RD3) respectively corresponding to the memory mats.

As for the structure using scrambler 19, in the case where the number of the address signal bits to be degenerated depends on the structure of the DRAM (e.g., the addresses of 3 bits are degenerated in the ×8 bit structure), if the structure is configured to exchange the address signal bits to be degenerated in the normal operation mode with the address signal bits to be degenerated in the data holding mode, the refreshing can be performed in the data holding mode while always keeping one of the memory mats at the selected state.

As described above, the signals designating the memory mats and sub-arrays are selectively degenerated in the data holding mode, whereby refreshing can be effected on only the group formed of a predetermined number of sub-arrays in one of the memory mats in the data holding mode. In the other memory mats, peripheral circuits do not operate. Since the circuits for driving the other peripheral circuits and the other peripheral circuits themselves do not operate, the current consumption is reduced.

Figure 13A:
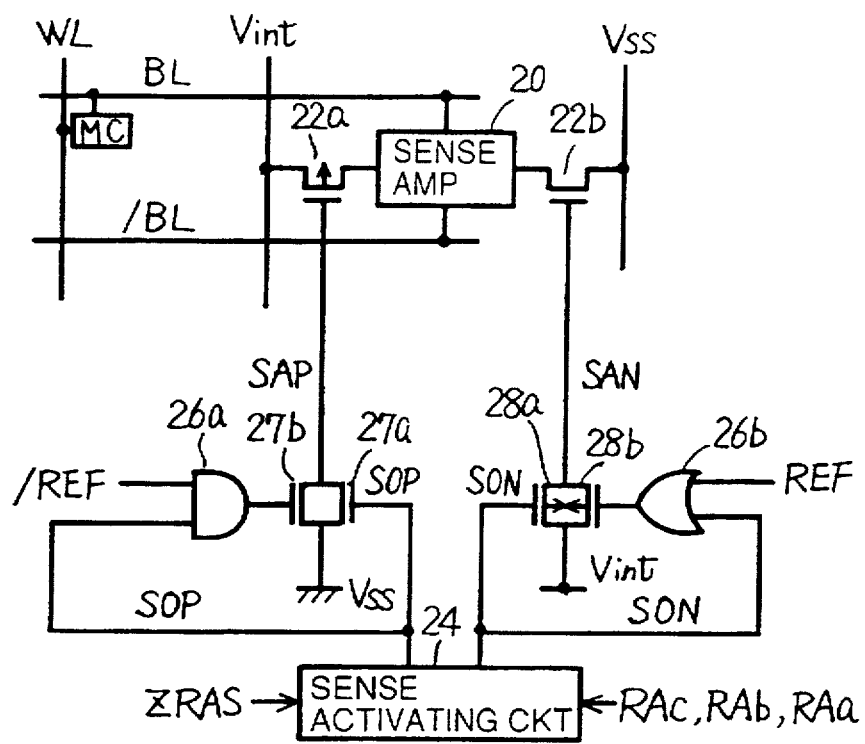
FIG. 13A shows a structure of a sense amplifier driver in the DRAM according to the embodiment 1 of the invention.

FIG. 13A schematically shows a structure of a sense amplifier driver. FIG. 13A representatively shows a sense amplifier provided for one pair of bit lines in one sub-array. This sense amplifier is arranged corresponding to each column of the memory cells, and is activated to sense and amplify data of the memory cell read onto the corresponding memory cell column (bit line pair).

In FIG. 13A, sense amplifier 20 is provided for a pair of bit lines BL and /BL. Each bit line pair BL and /BL is connected to the memory cells in one column. In FIG. 13A, there is representatively shown a memory cell MC which is arranged corresponding to a crossing between word line WL and bit line BL. Word line WL is connected to the memory cells in one row.

The sense driver includes a sense activating circuit 24 which activates sense amplifier activating signals SOP and SON at predetermined timings in accordance with refresh operation activating signal ZRAS and row block designating address signal bits RAa, RAb and RAc, an activating transistor 27a formed of an n-channel MOS transistor which is turned on in response to sense amplifier activating signal SOP applied from sense activating signal 24 and thereby activates sense amplifier drive signal SAP to the ground potential Vss level, a sense activating transistor 28a formed of a p-channel MOS transistor which is turned on in response to sense amplifier activating signal SON applied from sense activation circuit 24 and thereby activates sense drive signal SAN to the power supply potential Vint level, a sense amplifier drive transistor 22a formed of a p-channel MOS transistor which is turned on in response to sense amplifier drive signal SAP to transmit power supply potential Vint to one sensing node of sense amplifier 20, and a sense amplifier drive transistor 22b formed of an n-channel MOS transistor which is turned on in response to sense amplifier drive signal SAN to transmit ground potential Vss to the other sensing node of sense amplifier 20.

Sense amplifier 20 includes cross-coupled p-channel MOS transistors as well as cross-coupled n-channel MOS transistors. Power supply potential Vint is transmitted to the p-channel MOS transistor portion via sense amplifier drive transistor 22a, and ground potential Vss is transmitted to the n-channel MOS transistor portion via sense amplifier drive transistor 22b.

The sense driver further includes an AND circuit 26a which receives sense amplifier activating signal SOP applied from sense activating circuit 24 and inverted data holding mode designating signal /REF, an auxiliary drive transistor 27b formed of an n-channel MOS transistor which is turned on in response to the output signal of AND circuit 26a to drive sense amplifier drive signal SAP to ground potential level Vss, an OR circuit 26b which receives sense amplifier activating signal SON and data holding mode designating signal REF, and an auxiliary drive transistor 28b formed of a p-channel MOS transistor which is selectively turned on in response to the output signal of OR circuit 26a to drive sense amplifier drive signal SAN to power supply potential Vint level.

A current driving capability of transistor 27a is preferably smaller than that of transistor 27b. A current driving capability of drive transistor 28b is preferably smaller than that of auxiliary drive transistor 28b. Now, operation of the sense amplifier driver shown in FIG. 13A will be described below with reference to FIG. 13B which is a waveform diagram representing the operation.

In data holding mode, data holding mode designating signal REF is at H-level, and inverted data holding mode designating signal /REF is at L-level. In this state, the output signal of AND circuit 26a is fixed at L-level, and the output signal of OR circuit 26b is fixed at H-level. Therefore, both auxiliary drive transistors 27b and 28b are held at the off state.

During standby (i.e., refresh operation activating signal ZRAS is at H-level, or when internal RAS signal is inactive when during the normal operation), sense amplifier activating signals SOP and SON applied from sense amplifier activating circuit 24 are at L-level and H-level, respectively. Therefore, sense drive transistors 27a and 28b are off.

In the refresh operation, refresh operation activating signal ZRAS is first set to L-level. When all of sub-array designating signal bits RAa, RAb and RAc are selected, sense activating circuit 24 drives sense amplifier activating signal SON to L-level at a predetermined timing, and also drives sense amplifier activating signal SOP to H-level at a predetermined timing. Thereby, drive transistors 27a and 28a are turned on, and sense amplifier drive signals SAN and SAP are activated to attain H- and L-levels, respectively. Sense drive transistors 27a and 28a have a relatively small current driving capability, so that potentials of sense amplifier drive signals SAN and SAP change relatively slowly as indicated by broken line in FIG. 13B.

In response to sense amplifier activating signals SAN and SAP, sense amplifier activating transistors 22a and 22b are turned on to transmit power supply potential Vint and ground potential Vss to sense amplifier 20, respectively, so that sense amplifier 20 is activated to sense and amplify memory cell data appearing on bit lines BL and /BL. Since the potentials of sense amplifier activating signals SAP and SAN change slowly, the conductances of sense amplifier activating transistors 22a and 22b change relatively slowly, and correspondingly, the operation speed of sense amplifier 20 is slow, because sense amplifier 20 charges and discharges bit lines BL and /BL via activating transistors 22a and 22b, respectively.

Figure 13B:
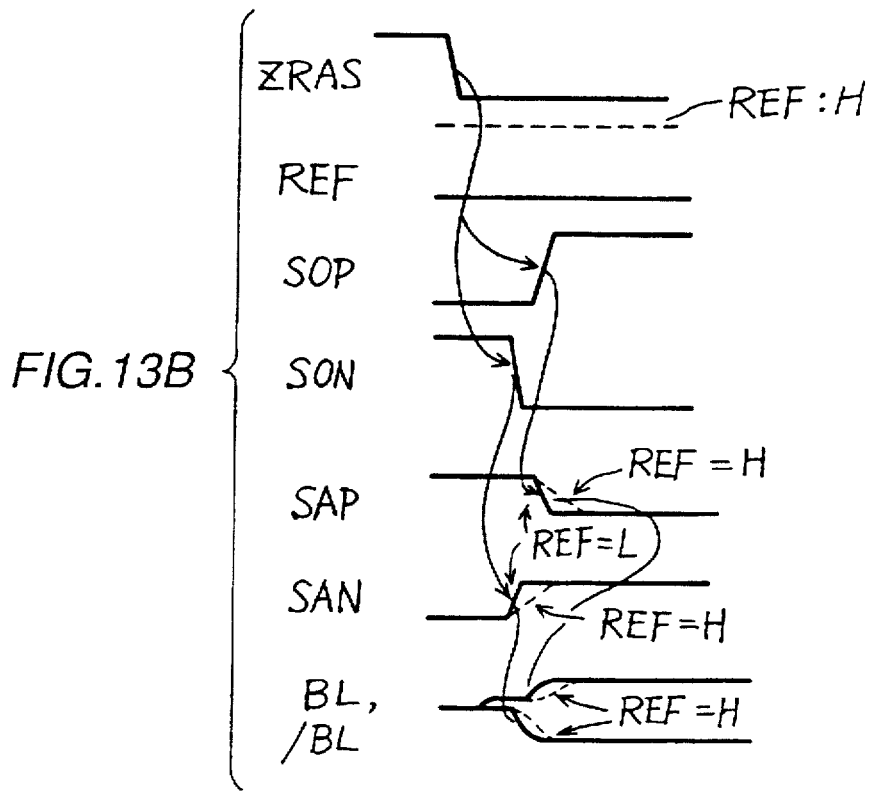
FIG. 13B shows an operation waveform of the sense amplifier driver.

Accordingly, the potentials of bit lines BL and /BL change slowly as represented by broken line waveforms in FIG. 13B.

Owing to slow charging/discharging of bit lines BL and /BL, it is possible to reduce the peak current of charging/discharging currents during the operation of sense amplifier 20. Therefore, noises on the power supply line (lowering of power supply potential Vint and rising of ground potential Vss) are prevented, so that the sense operation can be performed stably even in the case where the sensing operation is performed at a plurality of sub-arrays in one memory mat. Since the refreshing does not require any high-speed operation (because external input/output of data is not performed), no problem arises.

In the normal operation mode, data holding mode designating signal REF is at L-level, and AND circuit 26a and OR circuit 26b each operate as a buffer circuit. In the normal operation mode, therefore, sense activating circuit 24 selected by address signal bits RAa, RAb and RAc is activated in response to activation of internal RAS signal which corresponds to refresh operation activating signal ZRAS (and follows externally applied row address strobe signal /RAS), and thereby activates sense amplifier activating signals SOP and SON to H-level and L-level at predetermined timings, respectively.

In response to activation of sense amplifier activating signals SOP and SON, drive transistors 27a and 27b as well as drive transistors 28a and 28b are turned on to activate rapidly sense amplifier drive signals SAP and SAN to L-level and H-level, respectively. Thereby, sense amplifier activating transistors 22a and 22b are turned on rapidly, and sense amplifier 20 charges and discharges bit lines BL and /BL via sense amplifier activating transistors 22a and 22b. Thereby, the potentials on bit lines BL and /BL change rapidly as shown by solid line in FIG. 13B.

In the structure shown in FIG. 13A, sense amplifier activating circuit 24a receives refresh operation activating signal ZRAS and sub-array designating address signal bits RAa, RAb and RAc to drive sense amplifier activating signals SOP and SON to the active state. Sense amplifier activating circuit 24, which can selectively have various structures, may be provided corresponding to each sub-array, and alternatively such a structure may be employed that the sense amplifier activating signal is transmitted to the sense activating circuits in each memory mat in response to refresh operation activating signal ZRAS, and the sense activating circuit corresponding to the sub-array activates the corresponding sense amplifier activating signal in accordance with the sub-array designating signal.

Although FIG. 13 shows the potential change of bit lines BL and /BL which occurs when data at H-level is read onto bit line BL, a similar effect can be achieved even when memory cell data at L-level is read onto bit line BL. Sense amplifier 24 drives the potential of one at a higher level of bit lines BL and /BL to power supply potential Vint level, and drives the potential of the bit line at a lower level to ground potential Vss level.

Figure 14:
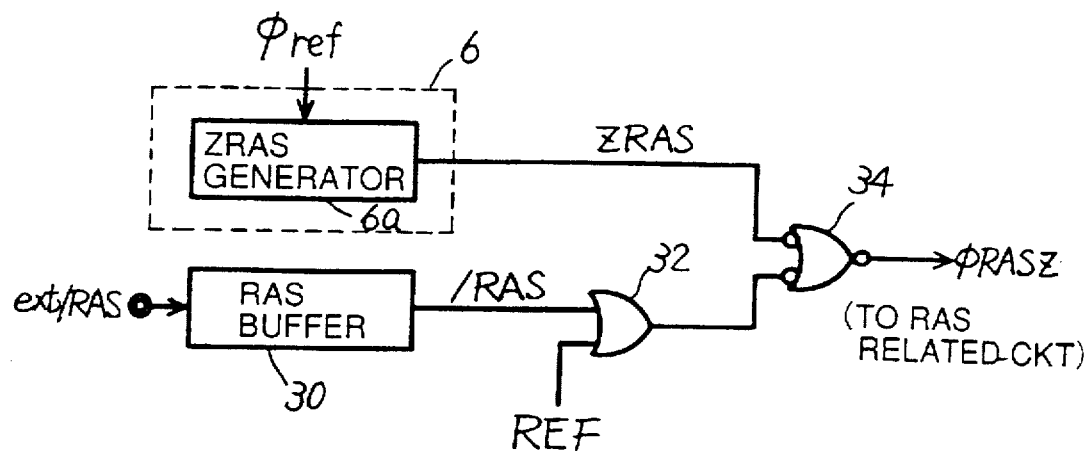
FIG. 14 schematically shows a structure of an internal RAS signal generating portion in the DRAM according to the embodiment 1 of the invention.

FIG. 14 shows a structure of a portion for switching internal RAS signal between the data holding mode and the normal operation mode. Refresh control circuit 6 includes a ZRAS generating circuit 6a, which generates refresh operation activating signal ZRAS having a predetermined width in response to refresh request signal φref applied from the timer. In the normal operation mode, RAS buffer 30 buffers an externally applied row address strobe signal ext./RAS to produce internal row address strobe signal /RAS. In order to switch the path for the drive signal between the normal operation mode and the refreshing mode, there are provided an OR gate 32 which receives the internal row address strobe signal applied from RAS buffer 30 and data holding mode designating signal REF, and an AND circuit 34 which receives refresh operation activating signal ZRAS applied from ZRAS generating circuit 6a and the output signal of OR circuit 32. AND circuit 34 produces an internal RAS signal φRASZ which is applied to RAS-related circuits in the DRAM (i.e., circuits which are operated in accordance with signal RAS and include portions such as the row decoder, row address buffer and sense amplifier drive circuit).

In the data holding mode operation, data holding mode designating signal REF is at H-level, and the output signal of OR circuit 32 is fixed at H-level. In this state, a state of internal row address strobe signal /RAS generated from RAS buffer 30 is ignored. AND circuit 34, therefore activates internal RAS signal φRASZ to L-level in accordance with refresh operation activating signal ZRAS applied from ZRAS generating circuit 6a.

In the normal operation mode, refresh operation activating signal ZRAS generated from ZRAS generating circuit 6a in refresh control circuit 6 is fixed at H-level. Data holding mode designating signal REF is fixed at L-level. Therefore, OR circuit 32 and AND circuit 34 operate as buffers, respectively, and internal RAS signal φRASZ is generated in accordance with internal row address strobe signal /RAS applied from RAS buffer 30. Thereby, internal circuits of the DRAM operate in accordance with internal RAS signal φRASZ in any of the normal operation mode and refreshing mode.

According to the embodiment 1 of the invention, as described above, the number of memory mats to be selected is changeable between the normal operation mode and data holding mode, so that the number of memory mats to be operated can be controlled in accordance with requirement in the data holding mode operation for reducing the current consumption. In the data holding mode operation, the refreshing can be performed by selecting multiple sub-arrays only in one memory mat, so that it is necessary to transmit the activating signal only to the one memory mat, and all the activating signals are maintained at the nonselected state in all the other memory mats. Therefore, the current consumption of peripheral circuits of the other memory mats is reduced, and thus the entire current consumption in the data holding mode is reduced.

In the refresh operation mode, the sensing operation can be performed slowly for reducing the peak current, whereby the refreshing can be accurately performed simultaneously in a plurality of sub-arrays in one memory mat.

[Embodiment 2]

Figure 15A:
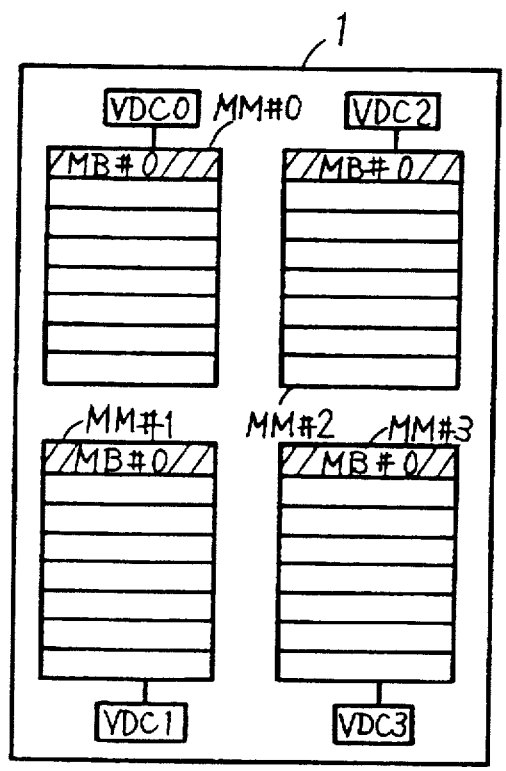
FIGS. 15A and 15B schematically show an operation principle of a DRAM according to an embodiment 2 of the invention.
Figure 15B:
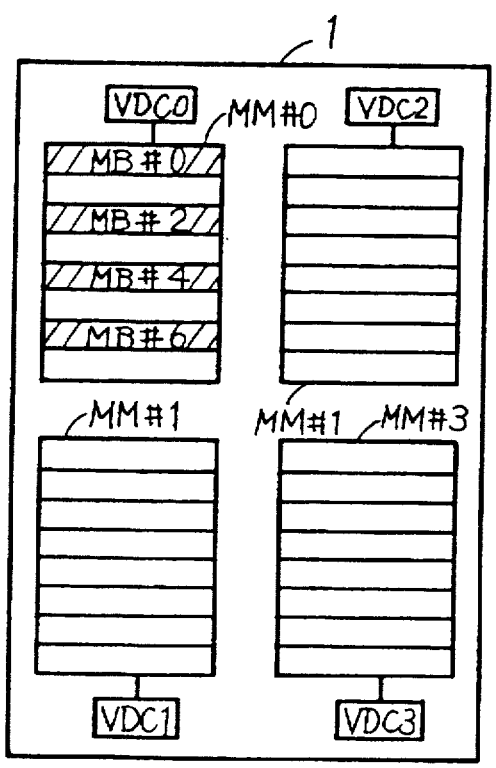

FIGS. 15A and 15B schematically show an arrangement of arrays in a DRAM according to the embodiment 2 of the invention. FIG. 15A shows an arrangement of selected memory sub-arrays in the normal operation mode, and FIG. 15B shows an arrangement of the sub-arrays which are selected for refreshing in the data holding mode operation. As shown in FIGS. 15A and 15B, DRAM 1 includes four memory mats MM#0-MM#3. There are provided internal voltage down converters VDC0-VDC3 corresponding to four memory mats MM#0-MM#3, respectively. Each of internal voltage down converters VDC0-VDC3, of which structure will be described later, is adapted to convert the externally applied power supply potential for producing and supplying the internal power supply potential to the corresponding one of memory mats MM#0-MM#3. Each of memory mats MM#0-MM#3 is supplied with the power supply potential for operation from corresponding one of internal voltage down converters VDC0-VDC3. The memory mat includes peripheral circuits such as a row decoder, column decoder and sense amplifier activating circuit, and power supply potential Vint (see FIG. 13A) for activating the sense amplifier and other potentials are applied into the memory array.

As shown in FIG. 15A, one of the sub-arrays (e.g., sub-array MB#0 in FIG. 15A) in each of memory mats MM#0-MM#3 is selected in the normal operation mode, and the selected memory cells in selected sub-array MB#0 are accessed. The power supply noises can be reduced owing to the structure, in which the voltage down converters are provided corresponding to memory mats MM#0-MM#3, respectively, and each of voltage down converters VDC0-VDC3 supplies the power supply potential only to the corresponding one of memory mats MM#0-MM#3.

The following problem would arise if only one internal voltage down converter is used commonly to supply the power supply potential to all memory mats MM#0-MM#3. If internal power supply potential Vint is supplied to memory mats MM#0-MM#3 by the internal voltage down converter which is provided commonly to all memory mats MM#0-MM#3, the current for consumption in all memory mats MM#0-MM#3 is entirely supplied via the common internal voltage down converter during operation of memory mats MM#0-MM#3. This causes lowering of the internal power supply potential, and also causes rising and ringing of the internal power supply potential due to a large current which is supplied for compensating for the above lowering of internal power supply potential, so that the internal power supply potential becomes instable.

In contrast, owing to provision of internal voltage down converters VDC0-VDC3 corresponding to memory mats MM#0-MM#3, respectively, each of internal voltage down converters VDC0-VDC3 is required to supply internal power supply potential Vint only to the corresponding one of memory mats MM#0-MM#3. Therefore, the current consumption to be compensated for by each of internal voltage down converter VDC0-VDC3 is equal to the current consumption of only one memory mat, and correspondingly the current consumption is dispersed, so that the power supply noises during operation of memory mats MM#0-MM#3 can be reduced. Accordingly, even when the internal power supply potential lowers to a small extent, the internal power supply potential can be stably supplied, so that each of memory mats MM#0-MM#3 can stably operate with a large operation margin (with respect to the internal power supply potential).

In this embodiment 2, refreshing in the data holding mode is performed in such a manner that the refreshing is executed only in one memory mat (e.g., memory mat MM#0 in FIG. 15B) in accordance with the embodiment 1. Internal voltage down converters (VDC0-VDC3) provided for nonselected memory mats (MM#1-MM#3) stop the supply of internal power supply potential Vint. Thereby, the nonselected memory mats do not consume the current, so that the current consumption in the data holding mode is significantly reduced. In this selected memory mat (MM#0), the peripheral circuits such as a sense amplifier are operated slowly to reduce the peak current, so that a plurality of sub-arrays can be stably supplied with the internal power supply potential from only the one internal voltage down converter (VDC0), because the lowering speed of the power supply potential is small owing to the small current consumption, and thus the current consumption can be sufficiently compensated for by one internal voltage down converter.

Figure 16A:
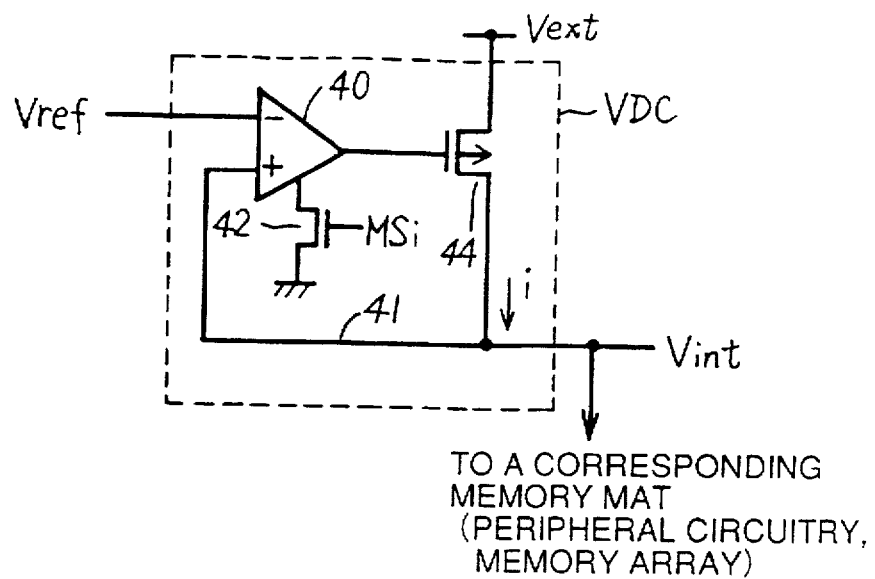
FIG. 16A shows a structure of an internal voltage drop circuit shown in FIGS. 15A and 15B.

FIG. 16A shows an example of a structure of the internal voltage drop circuit. In FIG. 16A, internal voltage down converter VDC includes a comparator 40 which makes comparison between a reference potential Vref and internal power supply potential Vint, an activating transistor 42 which selectively activates comparator 40 in response to memory mat designating signal MSi, and a drive transistor 44 formed of a p-channel MOS transistor which is responsive to the output signal of comparator 40 to supply the current applied from an external power supply potential supply node Vext to an internal power supply line 41.

Transistor 42 is turned on to form a current path through comparator 40 when memory mat designating signal MSi is active. When memory mat designating signal MSi is inactive, activating transistor 42 is turned off to deactivate comparator 40. Transistor 42, therefore, operates as a current source transistor for comparator 40.

When reference potential Vref is higher than internal power supply potential Vint during operation, comparator 40 generates a signal at L-level to increase a conductance of drive transistor 44. Thereby, drive transistor 44 supplies a current from external power supply potential supply node Vext to internal power supply line 41 to increase the level of internal power supply potential Vint. Meanwhile, when internal power supply potential Vint is higher than reference potential Vref, comparator 40 generates the signal at H-level to turn off drive transistor 44. Thereby, current supply via drive transistor 44 stops. Accordingly, internal power supply potential Vint is held at the potential level of reference potential Vref.

Figure 16B:
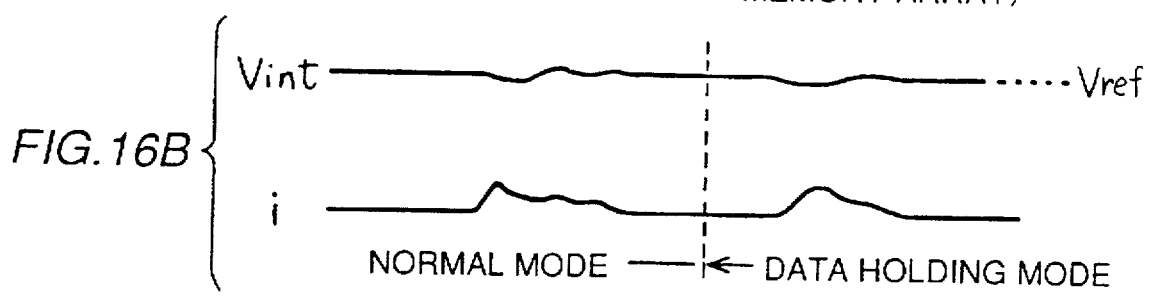
FIG. 16B is a waveform diagram representing an operation of the voltage drop circuit.

As shown in FIG. 16B, internal voltage down converter VDC supplies internal power supply potential Vint only to one memory mat. Therefore, a consumed current i for this operation is relatively small. Further, even when the corresponding memory mat is selected and operates, the peak current is small, and reduction of internal power supply potential Vint is small, so that internal power supply potential Vint is held at predetermined potential level Vref.

The data holding mode operation drives more sub-arrays than the normal operation mode in a memory mat. However, the circuit driving the sub-arrays operates at a slow speed, so that a changing speed of consumed current i is small, and the peak current is substantially equal to that in the normal operation mode. Thereby, internal power supply potential Vint is held at the predetermined potential level even when many sub-arrays in one memory mat are simultaneously driven in the data holding mode.

In the data holding mode operation, memory mat designating signal MSi only for the selected memory mat is set to H-level. Therefore, comparators 40 for the nonselected memory mats are inactive and produce output signals at H-level, and associated driver transistors 44 maintain the off state. Since the nonselected memory mats maintain the standby state, they consume only a leak current, so that the internal power supply potential can be maintained at a substantially constant potential level even if the corresponding internal voltage down converter does not supply a current.

Figure 17:
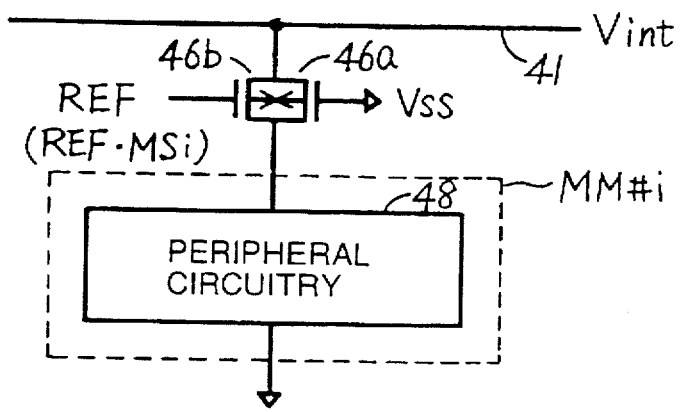
FIG. 17 schematically shows a structure of a power supply for reducing an operation speed of the DRAM according to the embodiment 2 of the invention.

FIG. 17 shows a structure for reducing an operation speed of circuits in the selected memory mat. As shown in FIG. 17, between the peripheral circuitry (row decoder, column decoder, sense amplifier activating circuit and others) of one memory mat MM# and internal power supply line 41, there are interposed a p-channel MOS transistor 46a functioning as a current source as well as a p-channel MOS transistor 46b which is turned off in response to data holding mode designating signal REF in the data holding mode. P-channel MOS transistor 46a receives ground potential Vss on its gate, and always maintain the on state to function as a current source.

In the normal operation mode, both MOS transistors 46a and 46b are on, and peripheral circuitry 48 receive power supply potential Vint on internal power supply line 41. When peripheral circuitry 48 operate, a current is supplied thereto via MOS transistors 46a and 46b with a large current driving capability, and peripheral circuitry 48 stably operate at a high speed.

In the data holding mode operation, data holding mode designating signal REF is at H-level, and MOS transistor 46b is off. In the data holding mode, therefore, peripheral circuitry 48 are supplied with a current from internal power supply line 41 via only MOS transistor 46a functioning as a current source. Therefore, the current driving capability of peripheral circuitry 48 depends on MOS transistor 46a, so that its current driving capability is smaller than that in the normal operation, and the operation speed of peripheral circuitry 48 is reduced. Thereby, the peak current in the data holding mode can be suppressed.

In the structure shown in FIG. 17, a logical product REF·MSi of data holding mode designating signal REF and memory mat designating signal MSi may be used instead of data holding mode designating signal REF. In the data holding mode, MOS transistor 46b in the nonselected memory mat is on, but the corresponding internal voltage drop circuit is inactive. Further, the corresponding memory mat is in the nonselected state. Therefore, a current is not consumed, and thus no problem arises.

A structure for reducing an operation speed of the circuit may include the structure for reducing the speed of sensing operation shown in FIG. 13A.

According to the embodiment 2 of the invention, as described above, the internal voltage down converters provided corresponding to the plurality of memory mats are adapted such that only the internal voltage down converter corresponding to the selected memory mat is activated in the data holding mode. Therefore, the current consumption in the data holding mode can be reduced significantly. By reducing the operation speed of circuit in the data holding mode, the peak current can be reduced, so that the refreshing can be performed stably without increasing the peak current even if the selected sub-arrays in the selected memory mat increase in number.

[Embodiment 3]

A DRAM supports various operation modes in addition to the data holding mode including the self-refresh mode. For example, when the DRAM is to be set to the test mode, a WCBR timing is used, and a CBR timing is used for resetting the test mode. In the WCBR timing, an external write enable signal ext./WE and an external column address strobe signal ext./CAS are lowered to L-level prior to falling of external row address strobe signal ext./RAS. In the CBR timing, external column address strobe signal ext./CAS is lowered to L-level before falling of external row address strobe signal ext./RAS. At the time of this lowering of ext./CAS, external write enable signal ext./WE is usually at H-level. Structures of portions setting the various modes are shown in FIG. 18.

Figure 18:
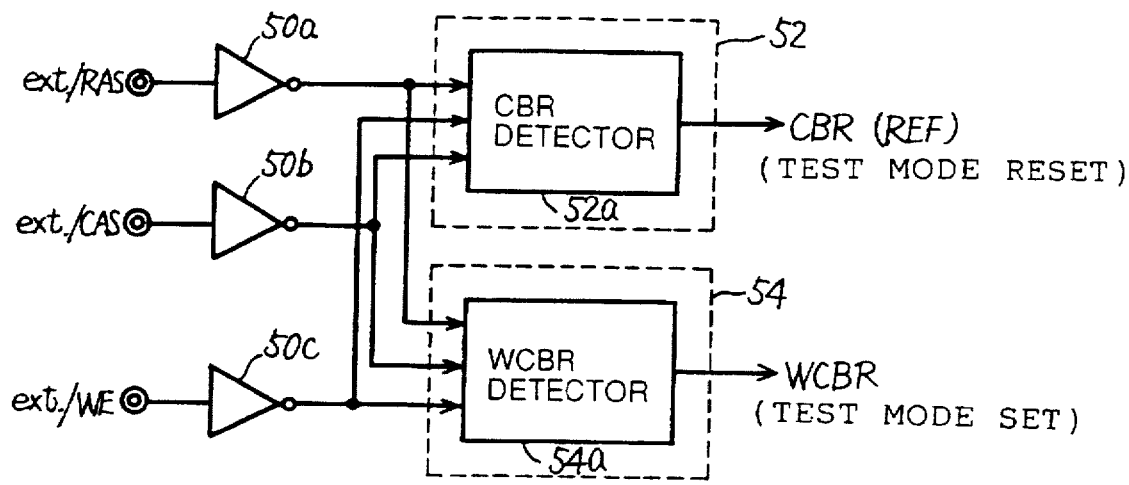
FIG. 18 shows an example of an input buffer circuit used in a DRAM according to an embodiment 3 of the invention.

In FIG. 18, a test mode set circuit 54 and a test mode reset circuit 52 are shown as an example. Test mode set circuit 54 includes a WCBR detector 54a for detecting the WCBR timing, and test mode reset circuit 52 includes a CBR detector 52a for detecting the CBR timing. In the operation of resetting the test mode, a CBR detecting signal CBR is generated to reset the test mode, and WCBR detector 54a generates WCBR detecting signal WCBR to set the test mode. When the data holding mode is designated, the DRAM enters the self-refresh mode after CBR detecting signal CBR is held at the active state for a predetermined time or more. The CBR detecting signal CBR is, therefore, equivalent to data holding mode detecting signal REF.

Test mode set circuit 54 and test mode reset circuit 52 receive external row address strobe signal ext./RAS, external column address strobe signal ext./CAS and external write enable signal ext./WE via input buffers 50a, 50b and 50c, respectively.

In the DRAM, the internal components are CMOS transistors, and signals at the CMOS level are transmitted.

Meanwhile, in an external device of DRAM, input/output signals are, for example, at the TTL level (or LV (low voltage) TTL level) in some cases. In the case where the external device is formed of bipolar transistors, the output signal level is set small in order to ensure high-speed operation, and signals such as TTL or LVTTL level signals are used. In the TTL level, a signal voltage Vin at H-level is 2.0 V, and a signal voltage vin at L-level is 0.8 V. In a structure where a CMOS structure is employed in a buffer providing an interface to an external device and arranged at an input initial stage, a through current flows in some cases when it is supplied with a signal at the TTL (or LVTTL) level. Description will now be given on a structure for reducing this through current in the data holding mode.

Figure 19A:
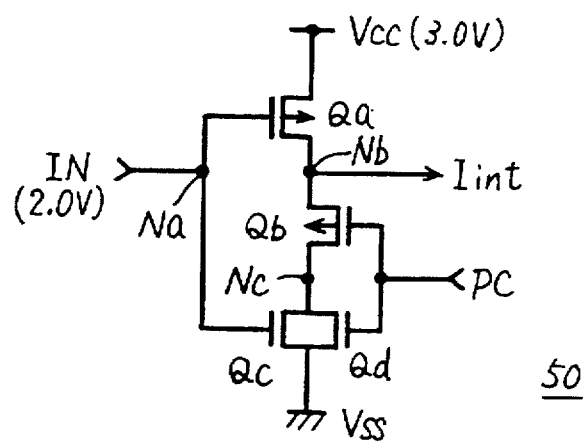
FIG. 19A shows a structure of an input buffer circuit according to the embodiment 3 of the invention.
Figure 19B:
FIG. 19B shows a logic gate of FIG. 19A.

FIGS. 19A and 19B show a structure of an input buffer circuit according to the embodiment 3 of the invention, and specifically shows its equivalent logic gate. In FIG. 19A, input buffer 50 includes a p-channel MOS transistor Qa, which is connected between an power supply node Vcc and an internal output node Nb and has a gate connected to an input node Na, a p-channel MOS transistor Qb, which is connected between an internal output node Nb and an internal node Nc and has a gate receiving a power-cut designating signal PC, an n-channel MOS transistor Qc, which is connected between internal node Nc and ground node Vss and has a gate connected to input node Na, and an n-channel MOS transistor Qd, which is connected between internal node Nc and ground node Vss and has a gate receiving power-cut designating signal PC.

Power supply potential Vcc (nodes and potentials thereon bear the same reference characters) applied to power supply node Vcc is 3.0 V, and the H-level of input signal IN applied to input node Na is the TTL level of 2.0 V. Power-cut designating signal PC is active and thus at H-level during the data holding mode operation, so that MOS transistor Qb is off, MOS transistor Qd is on and node NC is fixed at the ground potential level. Since MOS transistor Qb is off in the data holding mode operation, a path of a current flow from power supply node Vcc to ground node Vss is cut off. Therefore, even if input signal IN is at the TTL level of 2.0

V, a through current is not caused in input buffer 50, so that a current consumption is reduced in the data holding mode.

FIG. 19B shows a logic gate, which is equivalent to input buffer 50 and is represented as a 2-input NOR circuit receiving input signal IN and power-cut designating signal PC. When power-cut designating signal PC is at H-level, its internal output signal Iint is fixed at L-level. Input signal IN is at H-level in some cases, and is at L-level in the other cases. Therefore, the potential on node Nb actually depends on the potential level of input signal IN at the time of activation of power-cut designating signal PC. In FIG. 19B, there is shown the 2-input NOR circuit in order to represent the fact that the potential level of internal input signal Iint is fixed at the time of activation (H-level) of power-cut designating signal PC. Alternatively, node Nc may generate internal signal Iint.

When power-cut mode designating signal PC is at L-level, indicating the normal operation mode, MOS transistor Qb is on and MOS transistor Qd is off. In this state, MOS transistor Qc is on or off depending on the potential level of input signal IN. In this state, since MOS transistor Qb is on, a path is formed for a current flow from power supply node Vcc to ground node Vss via MOS transistors Qa and Qc, so that internal input signal Iint (inverted internal input signal Iint at the CMOS level) depending on input signal IN can be produced.

The purpose of MOS transistor Qd is to prevent formation of a path for a through current, which may be caused by turn-on of MOS transistors Qb and Qc due to influence of noises on internal node Nc if it is made electrically floating at the time of activation of power-cut designating signal PC. Internal output node Nb is charged by MOS transistor Qa to fix its potential level.

FIG. 20A schematically shows a structure of a portion generating power-cut designating signal PC. In FIG. 20A, the power-cut designating signal generating portion includes refresh detecting circuit 4 which receives external row address strobe signal ext./RAS and external column address strobe signal ext./CAS via buffer circuit 55 and determines whether the data holding mode is designated or not, an inverter 57 which receives refresh request signal φref applied from refresh timer 18, and an AND circuit 59 which receives data holding mode designating signal REF and the output signal of inverter 57.

AND circuit 59 generates power-cut designating signal PC to buffer circuit 55. Buffer circuit 55 includes buffers 50a and 50b shown in FIG. 18. Refresh detecting circuit 4 includes a CBR detector 4a which detects whether row address strobe signal /RAS and column address strobe signal CAS applied from buffer circuit 55 satisfy the CBR timing. CBR detector 4a generates data holding mode designating signal REF. CBR detector 4a may be adapted to receive external write enable signal ext./WE via buffer circuit 55. Now, operation of the power-cut designating signal generating portion shown in FIG. 20A will be described below with reference to FIG. 20b which is an operation waveform diagram.

When row address strobe signal /RAS and column address strobe signal /CAS applied via buffer circuit 55 satisfy the CBR timing, data holding mode designating signal REF generated from CBR detector 4a is set to the active state of H-level. Refresh timer 18 is driven under the control of the refresh control circuit (see FIG. 2), and generates refresh request signal φref at predetermined time intervals after elapsing of a predetermined time. Refresh request signal φref is active when it is at H-level.

During the data holding mode, therefore, power-cut designating signal PC is set to H-level when refresh request signal φref is at L-level. While power-cut designating signal PC is at H-level, a current path is cut off in the input buffer as shown in FIG. 19A. When refresh request signal φref is set to the active state of H-level, the output signal of inverter 57 is set to L-level, and correspondingly power-cut designating signal PC is set to L-level. During this period, a path for current flow from power supply node Vcc to ground node Vss is formed in buffer circuit 55, so that the input buffer (buffer circuit 55) is active and can take in the externally applied control signals (/RAS and /CAS).

When data holding mode is to be reset, external row address strobe signal ext./RAS is set to H-level. Despite of H-level of external row address strobe signal ext.RAS, buffer circuit 55 is inactive and its output signal does not change its potential level, if power-cut designating signal PC is at H-level. When a certain time elapses, refresh request signal φref is activated in a state that external row address strobe signal ext./RAS and external column address strobe signal ext./CAS are set to H-level. In response to this activation, power-cut designating signal PC is set to L-level, signals ext./RAS and ext./CAS at H-level are applied to refresh detecting circuit 4 via buffer circuit 55, and data holding mode designating signal REF is set to L-level by signal /RAS at H-level.

Power-cut designating signal PC is set to L-level in response to falling of data holding mode designating signal REF to L-level, and buffer circuit 55 (input buffers 50a–50c) are set continuously to the active state.

In the structure shown in FIG. 20A, therefore, the data holding mode is released by holding externally applied control signals ext./RAS and ext./CAS at H-level for one refresh period (1 φref-period) in the data holding mode. When the data holding mode is released, refresh request signal φref is activated to attain H-level, so that refreshing is internally performed. Therefore, it is necessary to prohibit external access to the DRAM for one refresh period (during which the refreshing is actually performed) after releasing of the refresh data holding mode.

[Modification]

FIG. 21A shows a modified structure of the embodiment 3 of the invention. In FIG. 21A, a frequency divider 58 is interposed between inverter 57 receiving refresh request signal φref and AND circuit 59 generating power-cut instructing signal PC. Structures other than the above are the same as those shown in FIG. 20A, and the corresponding portions bear the same reference numbers or characters. In the structure shown in FIG. 21A, power-cut designating signal PC is set to L-level at a cycle obtained from frequency division of refresh request signal φref by a predetermined frequency-dividing ratio, as can be seen in an operation waveform diagram of FIG. 21B. FIG. 21B shows an example in which the frequency-dividing ratio is 1/2.

When the data holding mode is reset, therefore, externally applied control signals ext./RAS and ext./CAS must be held at H-level only for a period equal to a period of this frequency-divided cycle of the refresh request signal φref, and the next access can be performed at a faster timing. The frequency-dividing ratio of divider 58 is set to an appropriate value taking into consideration the charging/discharging currents required for driving power-cut instructing signal PC to H-level and L-level as well as a magnitude of a through current in buffer circuit 55. Thereby, the next access can be performed in a faster timing with a low current consumption when the data holding mode is reset.

As described above, the embodiment 3 of the invention can cut off the path of flow of the through current of the input buffer in the data holding mode, so that the current consumption in the data holding mode can be reduced.

By turning on the input buffer circuit when the refresh request signal is activated, the data holding mode can be surely reset. The signal obtained by frequency-dividing the refresh request signal is used for selectively making conductive the through current path of the input buffer circuit. This reduces a period for which the external control signal is held at a predetermined state (inactive state at H-level) when the data holding mode is reset, and correspondingly the next access can be started at a faster timing.

[Embodiment 4]

Figure 22:
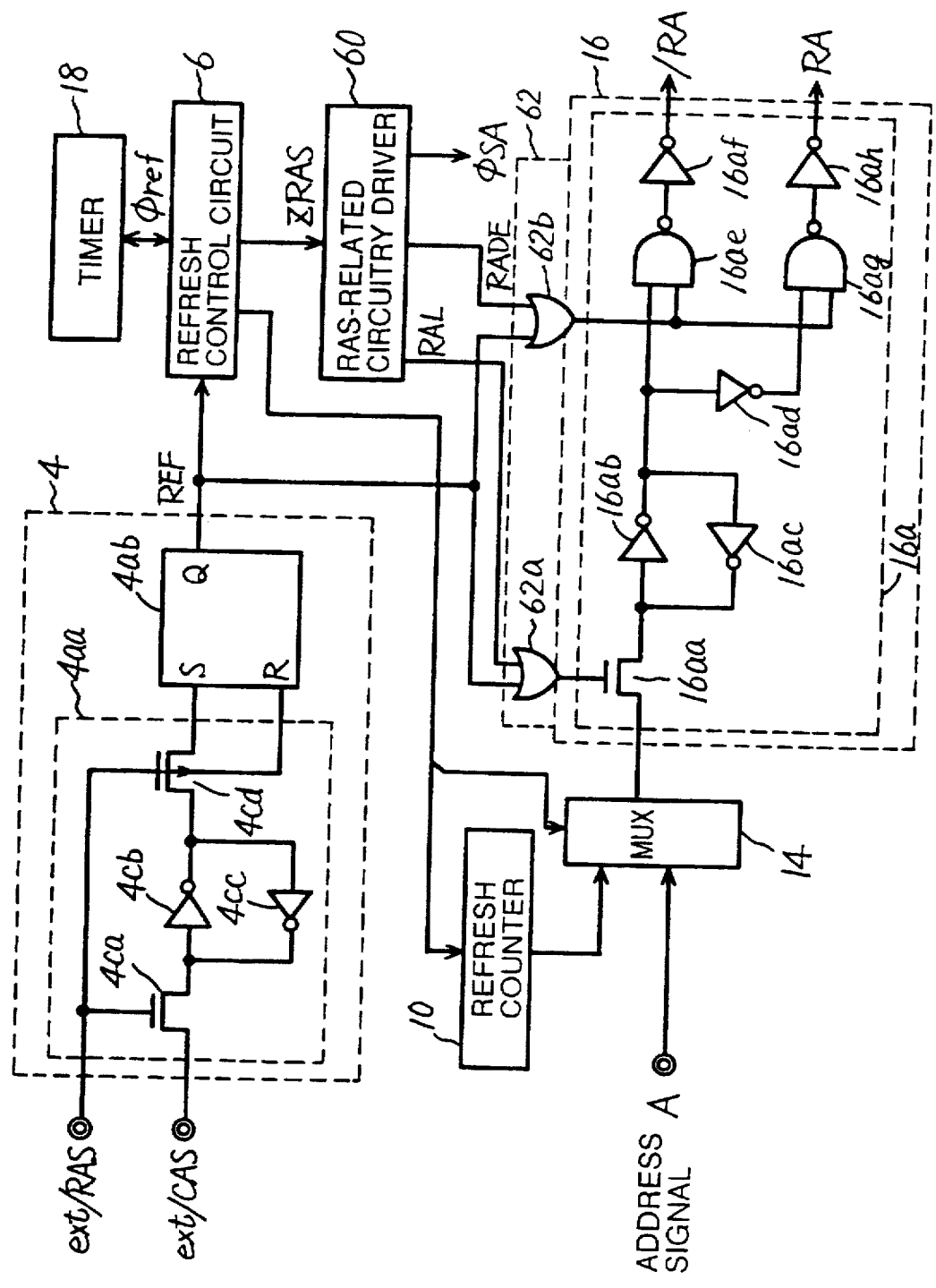
FIG. 22 schematically shows a structure of a main portion of a DRAM according to an embodiment 4 of the invention.

FIG. 22 shows a structure of a main portion of a DRAM according to an embodiment 4 of the invention. More specifically, FIG. 22 shows a structure of a portion which generates internal row address signals RA and /RA in the refresh operation.

In FIG. 19, there is arranged a buffer control circuit 62 for statically operating row address buffer 16 when data holding mode detecting signal REF applied from refresh detecting circuit 4 is active.

The refresh mode detecting circuit 4 includes a latch circuit 4aa which is responsive to falling of external row address strobe signal ext./RAS to latch external column address strobe signal ext./CAS, and a set/reset flip-flop 4ab which is set to activate data holding mode designating signal REF to H-level when the output signal (latch signal) of latch circuit 4aa is at H-level. The set/reset flip-flop 4ab is reset in response to rising of external row address strobe signal ext./RAS.

The latch circuit 4aa includes a transfer gate 4ca formed of an n-channel MOS transistor which is turned on to pass external column address strobe signal ext./CAS when external row address strobe signal ext./RAS is at H-level, an inverter 4cb which inverts a signal transmitted from transfer gate 4ca, an inverter 4cc which inverts and transmits the output signal of inverter 4cb to the input of inverter 4cb, and a transfer gate 4cb formed of a p-channel MOS transistor which is turned on to apply the output signal of inverter 4cb to a set input S of set/reset flip-flop 4ab when external row address strobe signal ext./RAS is at L-level. The input buffer of the embodiment 3 may be provided.

Refresh control circuit 6 activates timer 18 in response to data holding mode designation signal REF applied from refresh mode detecting circuit 4, and is responsive to refresh request signal φref applied from timer 18 to activate and apply refresh operation activating signal ZRAS to RAS-related circuitry driver 60. When the refreshing is completed, refresh control circuit 6 increments (or decrements) the count of refresh counter 10 by one in response to falling (deactivation) of refresh operation activating signal ZRAS.

RAS-related circuitry driver 60 is responsive to activation of refresh operation activating signal ZRAS to generate a latch instructing signal RAL and a buffer activating signal RADE which determins the latch timing in the row address buffer and its output permission timing, respectively. RAS-related circuitry driver 60 also generates control signals for RAS-related circuits (i.e., circuits which operate in response to signal RAS). FIG. 22 representatively shows a sense amplifier activating signal φSA for activating the sense amplifier. RAS-related circuitry driver 60 also generates a bit line equalize signal for equalizing the bit lines.

The control circuit 62 includes an OR circuit 62a receiving data holding mode designating signal REF and latch instructing signal RAL, and an OR circuit 62b receiving data holding mode instructing signal REF and buffer activating signal RADE. OR gate 62a produces an output signal at H-level when one of data holding mode instructing signal REF and latch instructing signal RAL is at H-level. OR gate 62b produces a signal at H-level when one of data holding mode instructing signal REF and buffer activating signal RADE is at H-level.

Row address buffer 16 includes row address buffer circuits which are provided corresponding to the internal row address signal bits, respectively. FIG. 22 representatively shows a buffer circuit 16a which generates internal row address signals RA and /RA of 1 bit. Row address buffer circuit 16a includes a transfer gate 16aa formed of an n-channel MOS transistor which is turned on to pass the signal applied from multiplexer 14 when the output signal of OR circuit 62a is at H-level, an inverter 16ab which inverts the signal applied from transfer gate 16aa, an inverter 16ac which inverts and transmits the output signal of inverter 16ab to the input of inverter 16ab, an inverter 16ad which inverts the output signal of inverter 16ab, an NAND circuit 16ae which receives the output signal of inverter 16ab and the output signal of OR circuit 62b, an inverter 16af which inverts the output signal of NAND circuit 16ae to produce internal row address signal bit /RA, an NAND circuit 16ag which receives the output signal of inverter 16ad and the output signal of OR circuit 62b, and an inverter 16ah which inverts the output signal of NAND circuit 16ag to produce internal row address signal bit RA.

Multiplexer 14 selectively passes one of the refresh address applied from refresh counter 10 and an externally applied address signal A under the control of the control signal applied from refresh control circuit 6. Now, operation of the address-related circuits shown in FIG. 22 will be described below with reference to FIGS. 23A and 23B which are waveform diagrams.

Figure 23A:
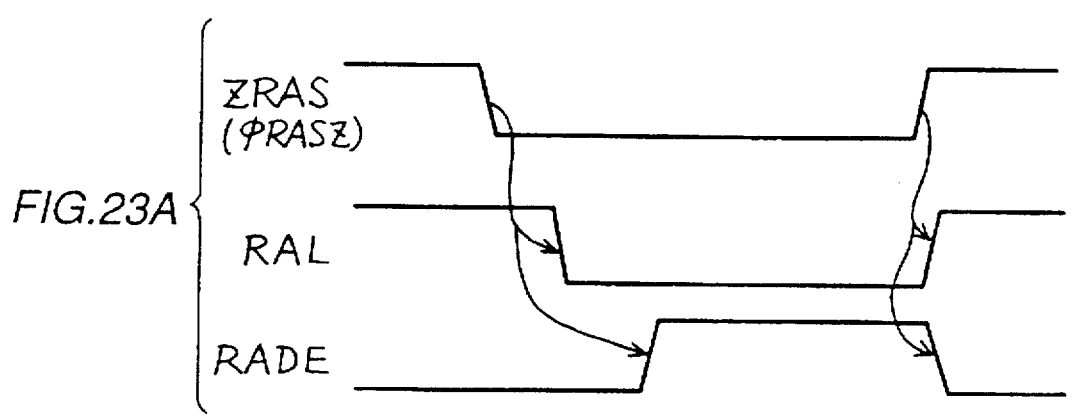
FIG. 23A shows timings of control signals for driving a row address buffer shown in FIG. 22.

FIG. 23A is a signal waveform diagram showing the operation of RAS-related circuitry driver 60 shown in FIG. 22. RAS-related circuitry driver 60 holds latch instructing signal RAL at H-level and holds buffer activating signal RADE at L-level, when refresh operation activating signal ZRAS is inactive at H-level. When data holding mode instructing signal REF is at L-level indicating the normal operation mode, the output signal of OR circuit 62a is at H-level, and the output signal of OR circuit 62b is at L-level. In row address buffer circuit 16a, therefore, transfer gate 16aa is turned on to pass the signal applied from multiplexer 14 in response to the signal at H-level applied from OR circuit 62a. Meanwhile, the output signal of OR circuit 62b is at L-level, the output signals of NAND circuits 16ae and 16ad are at H-level, and both row address signal bits /RA and RA are at L-level.

When refresh operation activating signal ZRAS is set to the active state of L-level, latch instructing signal RAL is set to L-level, and subsequently buffer activating signal RADE is set to H-level. Thereby, transfer gate 16aa is turned off to enter row address buffer circuit 16a into the latch state, while NAND circuits 16ae and 16ad operate as inverters in response to rising of address buffer activating signal RADE and internal row address signal bits /RA and RA corresponding to the address signal bits, which are latched by the latch circuit formed of inverters 16ab and 16ac, are produced.

In the normal operation mode, row address buffer circuit 16a latches the applied address signal bits to produce the internal row address signal bits in accordance with internal RAS signal φRASZ corresponding to refresh operation activating signal ZRAS. Row address buffer 16a is reset in response to deactivation of refresh operation activating signal ZRAS (internal RAS signal φRASZ). Thus, signal RAL is set to H-level, signal RADE is set to L-level, and both internal row address signal bits RA and /RA are set to L-level.

In the data holding mode operation, data holding mode designation signal REF is at H-level. In this state, the output signals of OR circuit 62a and 62b are held at H-level. In row address buffer circuit 16a, therefore, transfer gate 16aa maintains the on state, and NAND circuits 16ae and 16ad function as inverters. Thus, row address buffer circuit 16a operates statically to produce signal bits RA and /RA which change in accordance with the signal bits applied from multiplexer 14.

Figure 23B:
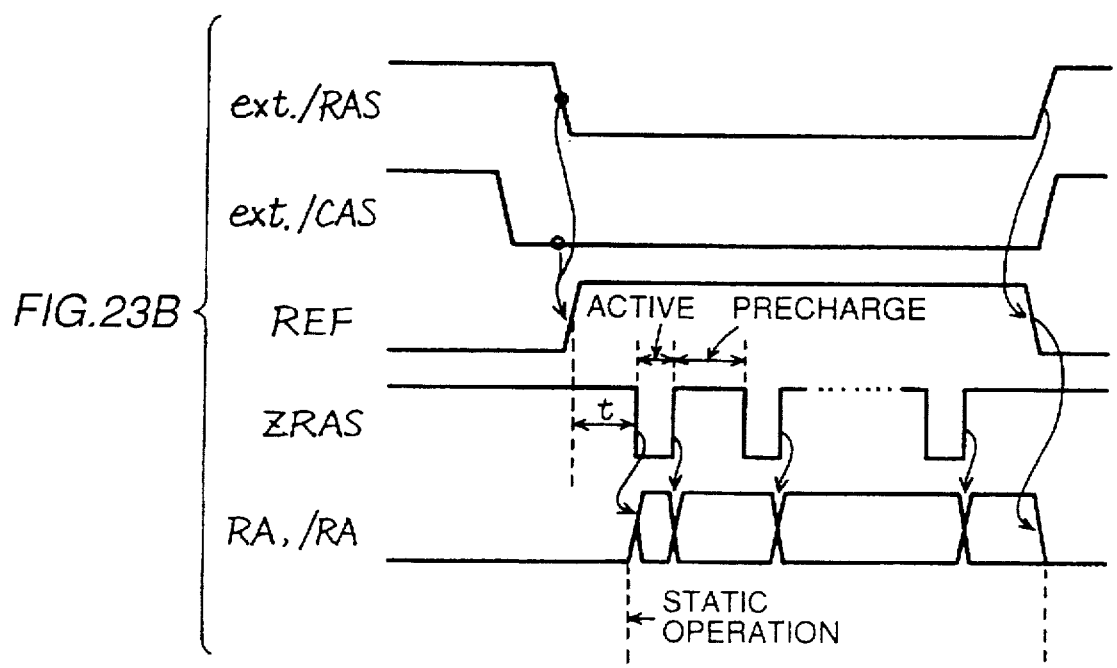
FIG. 23B is a waveform diagram showing an operation according to the embodiment 4 of the invention.

More specifically, as shown in FIG. 23B, when external row address strobe signal ext./RAS and external column address strobe signal ext./CAS are applied at the CBR timing, and data holding mode instructing signal REF is set to H-level, row address buffer 16 starts the static operation. When refresh control circuit 6 activates refresh operation activating signal ZRAS in response to refresh request signal φref, which is applied thereto from timer 18 upon elapsing of a time t after activation of data holding mode designating signal REF, refresh counter 10 is activated to apply its count to row address buffer 16 via multiplexer 14, and correspondingly, internal row address signal bits RA and /RA change their states.

When refreshing is completed and refresh operation activating signal ZRAS is deactivated, the count of refresh counter 10 is updated in response to this deactivation. In accordance with the updating of count, row address signal bits RA and /RA, which are generated from row address buffer circuit 16 performing the static operation, change their states. Thereafter, such an operation is performed during the period of operation in the data holding mode that row address buffer 16 performs the static operation, and internal row address signal bits RA and /RA change their states every time the count of refresh counter 10 changes in response to deactivation of refresh operation activating signal ZRAS.

When data holding mode is completed, data holding mode designation signal REF is deactivated to attain L-level, row address buffer 16 is reset, and internal row address signal bits RA and /RA are held at L-level.

In the data holding mode operation, as described above, row address buffer 16 statically operates, so that charging and discharging are performed only in the row address buffer circuit generating the row address signal bits which change their states. Since charging/discharging are not performed by the row address buffer circuits for the row address signal bits which do not change their states, it is possible to reduce the current consumption in the data holding mode operation. During the above operation, set/reset (i.e., setting to the active state and precharge state) of the selected memory array (sub-array) is performed in response to refresh operation activating signal ZRAS under the control of RAS-related circuitry driver 60.

Figure 24A:
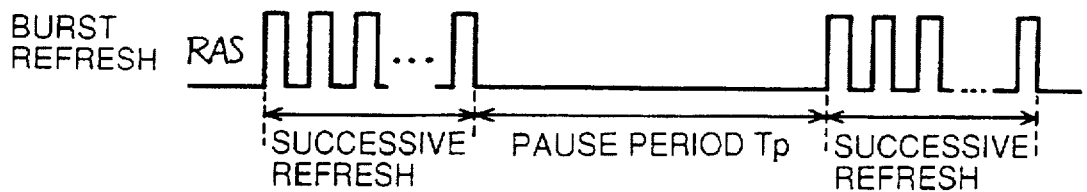
FIGS. 24A and 24B show a burst refresh operation mode in an embodiment 5 of the invention.
Figure 24B:
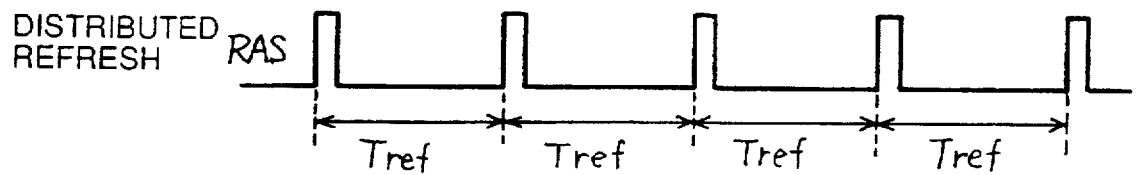

FIGS. 24A and 24B show sequences of the refresh operation in the data holding mode. In the refresh operation sequence, there are a burst refresh mode shown in FIG. 24A and a distributed refresh mode shown in FIG. 24B. In the burst refresh mode, the refreshing is successively performed predetermined number of times as shown in FIG. 24A. After the refreshing is performed predetermined number of times, the DRAM is maintained at the standby state (precharge state) for a relatively long pause time period Tp. When pause time Tp elapses, refreshing will be performed predetermined number of times again. In this burst refresh mode, the row address buffer operates statically and only the signal lines for the changing address signal bits are charged/discharged as already shown in FIG. 22, so that the operation current in the refresh operation is reduced.

In the distributed refresh mode shown in FIG. 24B, the refreshing is performed in a cycle of a predetermined refresh period Tref. In contrast to the structure for this distributed refresh, pause time Tp in the burst refresh mode shown in FIG. 24A can be longer than refresh period Tref, because data of the memory cells over multiple rows are successively refreshed. As a result, this actually increases a time for which the DRAM is maintained at the standby state (precharge state), and thus can reduce the current consumption. In this embodiment 4, the refreshing is performed on a sub-array or a memory block at a time using combination of the burst refresh mode and the structure of row address buffer shown in FIG. 22.

Figure 25:
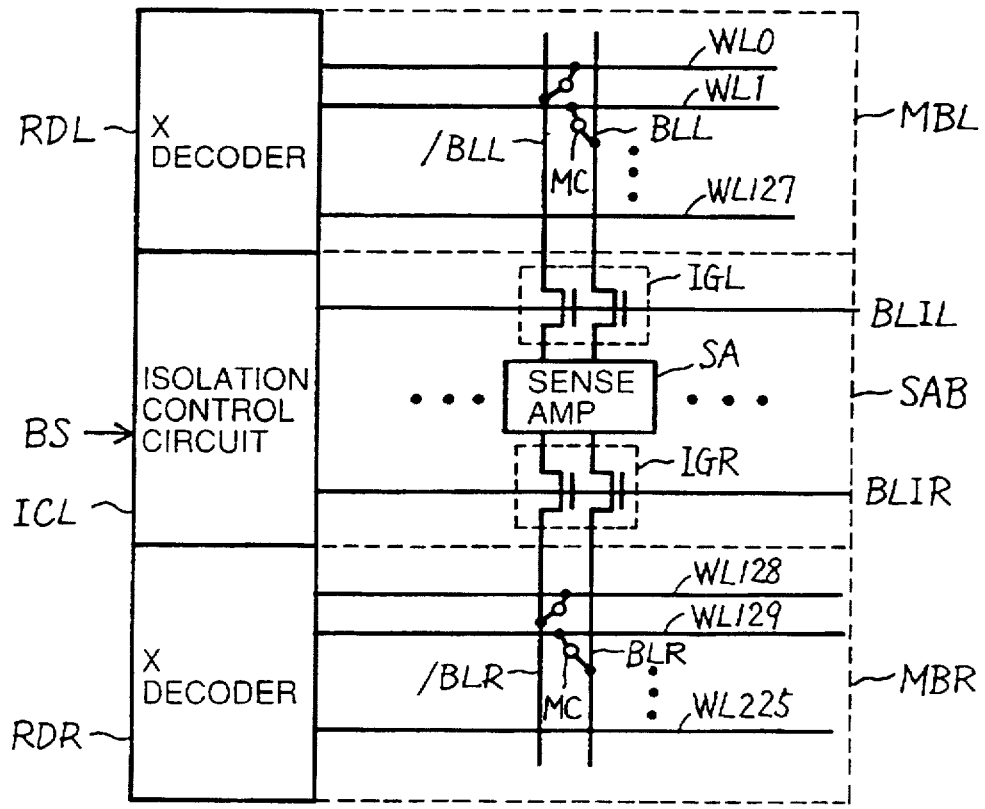
FIG. 25 schematically shows a structure of a main portion of the DRAM according to the embodiment 5 of the invention.

FIG. 25 schematically shows a structure of a memory block part in a DRAM of the embodiment 4 of the invention. FIG. 25 shows two memory blocks MBL and MBR. Between memory blocks MBL and MBR, there is arranged a sense amplifier band SAB including sense amplifiers SA which sense and amplify the memory cell data. The structure in which memory blocks MBL and MBR commonly use sense amplifiers SA is called a "shared sense amplifier arrangement". The "shared sense amplifier arrangement" may be an "alternately arranged shared sense amplifier arrangement" in which the sense amplifiers are alternately arranged on the memory cell columns at opposite sides of the memory block, but for simplicity reason, a structure of "shared sense amplifier arrangement" is shown in FIG. 25. Memory blocks MBL and MBR each may construct the sub-array MB#j (j=0-7) shown in the embodiments 1 and 2, or may form one sub-array in combination.

As an example, memory block MBL includes 128 word lines WL0-WL127, and memory block MBR also includes 128 word lines WL128-WL225. An X-decoder RDL is provided for memory block MBL, and an X-decoder RDR is provided for memory block MBR.

In each of memory blocks MBL and MBR, a bit line pair is provided for each column of memory cells. FIG. 25 representatively shows one bit line pair BLL and /BLL in memory block MBL and one bit line pair BLR and /BLR in memory block MBR.

Sense amplifier band SAB includes sense amplifiers SA which are arranged corresponding to bit line pairs BLL and BLL in memory block MBL as well as bit line pairs BLR and /BLR in memory block MBR. Sense amplifier SA is connected to bit lines BLL and /BLL via a bit line isolation gate IGL which is selectively turned on in response to a bit line isolation control signal BLIL, and is also connected to bit lines BLR and /BLR via a bit line isolation gate IGR which is selectively turned on in response to a bit line isolation control signal BLIR. Bit line isolation control signals BLIL and BLIR are generated from an isolation control circuit ICL which is responsive to memory block designating signal BS. Isolation control circuit ICL holds isolation control signal BLIL at H-level and holds isolation control signal BLIR at L-level when memory block MBL is designated by block designating signal BS.

When sense amplifier SA operates, only bit line pair BLL and /BLL are connected to sense amplifier SA, so that a load to be driven by sense amplifier SA is reduced, and the sensing operation can be performed rapidly. Since a load capacitance (parasitic capacitance) of sense node of sense amplifier SA (i.e., connection node between the sense amplifier and the bit line pair) decreases, it is possible to increase a read voltage from memory cell MC (quantity of potential change on a bit line caused by storage data of the memory cell transmitted onto the bit line), so that the sensing operation can be performed stably.

When memory block designating signal BS designates a memory block other than memory blocks MBL and MBR, both of bit line isolation control signals BLIL and BLIR are set to H-level, and sense amplifier SA is connected to bit line pairs BLL and /BLL as well as BLR and /BLR via isolation control gates IGL and IGR, respectively. In this state, memory blocks MBL and MBR maintain the standby state (precharge state).

Figure 26A:
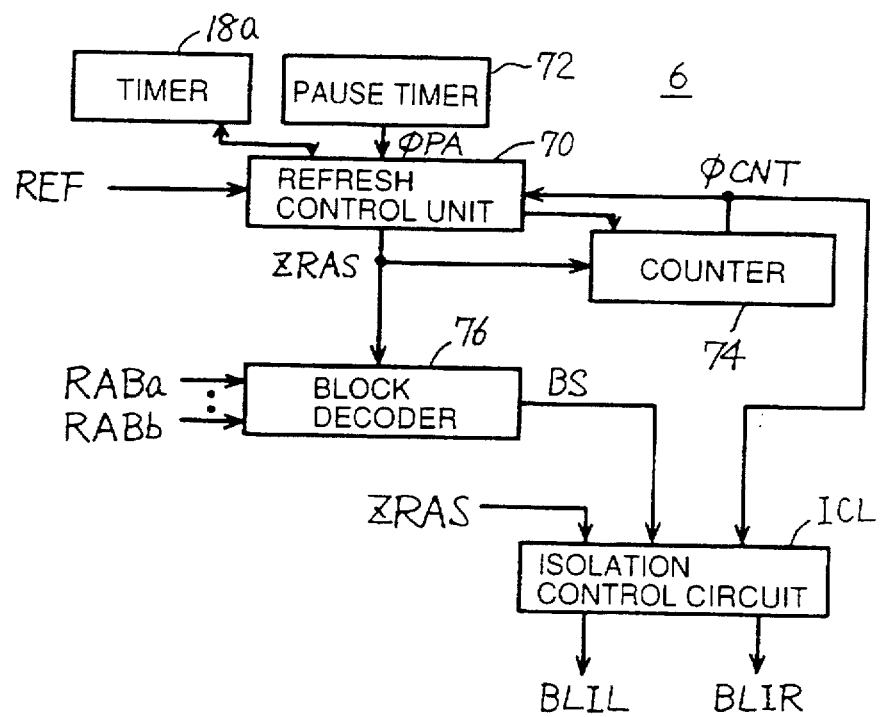
FIG. 26A shows a structure of a portion for controlling refreshing in the embodiment 5 of the invention.

FIG. 26A shows a structure of a portion generating bit line isolation control signals BLIL and BLIR. In FIG. 26A, refresh control circuit 6 includes a refresh controller 70 which is activated in response to data holding mode designating signal REF applied from the refresh detecting circuit, a timer 18a which counts a predetermined time period in response to an activating signal applied from refresh controller 70, a pause timer 72 which is activated under the control of refresh controller 70 and counts the pause time to generate a refresh request signal φPA upon every elapsing of the pause time, and a counter 74 which counts refresh operation activating signal ZRAS generated from refresh controller 70.

Counter 74 counts the number (128) of word lines included in each of memory blocks MBL and MBR, and deactivates a count-up signal φCNT to attain, e.g., L-level upon completion of the counting operation. Timer 18a operates under the control of refresh controller 70 and generates a signal indicative of entry into the self-refresh operation when a predetermined time period elapses after activation of data holding mode designating signal REF.

Refresh controller 70 is responsive to the self-refresh mode designating signal applied from timer 18, and can continuously operate to activate repetitively refresh operation activating signal ZRAS while count signal φCNT applied from counter 74 is at H-level.

Refresh operation activating signal ZRAS applied from refresh controller 70 is applied to a block decoder 76 which decodes block address signal bits RABa–RABb. The number of the address signal bits applied to block decoder 76 depends on the number of memory blocks included in the memory mat. Block decoder 76 is activated to perform the decoding and generate block designating signal BS, when refresh operation activating signal ZRAS applied from refresh controller 70 is activated.

Isolation control circuit ICL receives count control signal φCNT applied from counter 74 as well as block designating signal BS and refresh operation activating signal ZRAS, and generates bit line isolation control signals BLIL and BLIR. Isolation control circuit ICL maintains the states of isolation control signals BLIL and BLIR while count control signal φCNT applied from counter 74 is at the active state of H-level, i.e., while the burst refreshing is being performed. Now, operation of the circuitry shown in FIG. 26A will be described below with reference to 26B which is an operation waveform diagram.

Figure 26B:
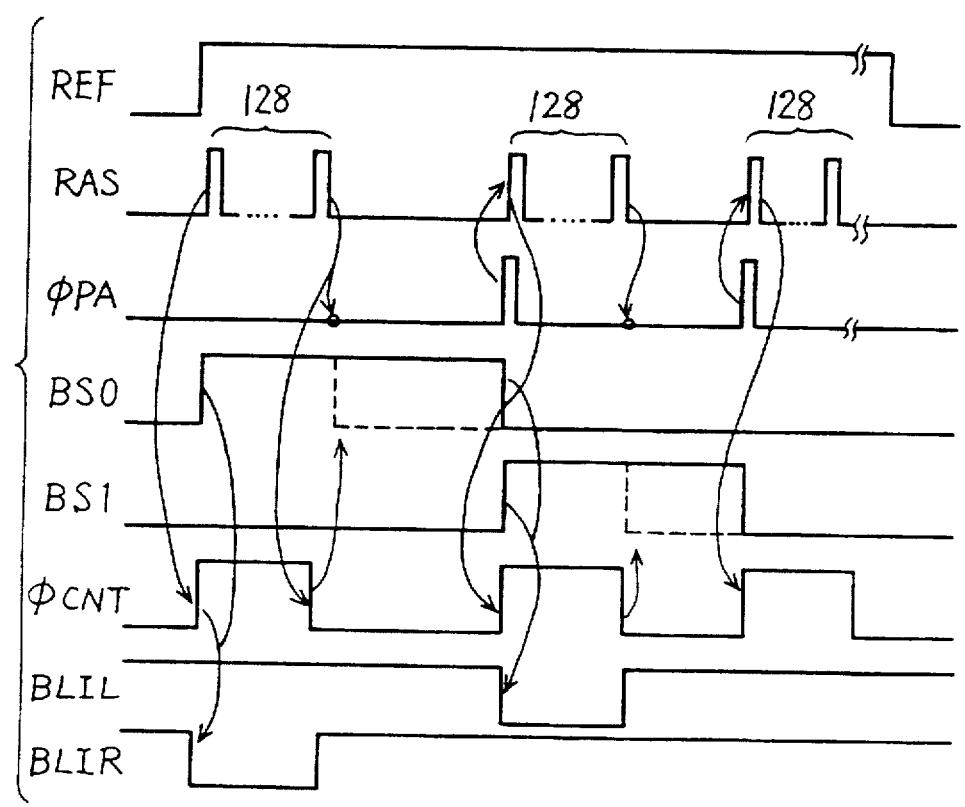
FIG. 26B shows waveforms of the structure of FIG. 26A.

When data holding mode designating signal REF is activated to attains H-level, refresh controller 70 activates timer 18a. When timer 18a generates the time-up signal, refresh controller 70 activates counter 74 to set its output signal φCNT to the active state of H-level. In parallel with this operation, refresh operation activating signal ZRAS is activated. In FIG. 26B, there is shown an inverted signal RAS of refresh operation activating signal ZRAS. Block decoder 76 is responsive to activation of refresh operation activating signal ZRAS to decode block address signal bits RABa–RABb applied from the row address buffer, and activate block select signal BS for the selected memory block.

Isolation control circuit ICL sets one of bit line isolation control signals BLIL and BLIR to H-level and sets the other to L-level in accordance with block select signal (BSO) applied from block decoder 76.

It is now assumed that memory block MBL is first designated. In this state, isolation control circuit ICL maintains bit line isolation control signal BLIL at H-level, and fixes bit line isolation control signal BLIR at L-level. While count signal φCNT applied from counter 74 is at H-level, isolation control circuit ICL internally determines that refresh operation activating signal ZRAS is successively set to the active state. Therefore, even when refresh operation activating signal ZRAS applied from refresh controller 70 repetitively changes its state between the active and inactive states, isolation control signal BLIL maintains H-level and isolation control signal BLIR maintains L-level while count control signal φCNT applied from counter 74 is at H-level. Thereby, the charge/discharge current of isolation control signals BLIL and BLIR in isolation control circuit ICL is reduced, and the current consumption in the data holding mode is reduced.

When refresh controller 70 generates refresh operation activating signal ZRAS 128 times, counter 74 resets count control signal φCNT to L-level. In response to resetting of count control signal φCNT applied from counter 74, isolation control circuit ICL returns isolation control signal BLIR to H-level. At this time, refresh controller 70 activates pause timer 72 in response to falling of count control signal φCNT applied from counter 74. Pause timer 72 measures a time base on the predetermined pause time, and generates refresh request signal φPA again upon elapsing of the pause time. In response to refresh request signal φPA, refresh controller 70 activates counter 74 again to set count control signal φCNT to H-level, and successively generates refresh operation activating signal ZRAS 128 times. In this state, block select signal BS applied from block decoder 76 designates memory block MBR. Therefore, isolation control circuit ICL lowers isolation control signal BLIL to L-level, and fixes isolation control signal BLIR at H-level.

The 128 word lines in memory block MBR are successively selected, and storage data of the memory cells in memory block MBR is refreshed. When refresh operation activating signal ZRAS is generated 128 times, count control signal φCNT applied from counter 74 is set to L-level, and isolation control circuit ICL is reset so that both isolation control signals BIL and BIR are set to H-level. Refresh controller 70 activates pause timer 72 again in response to falling of count control signal φCNT applied from counter 74. During this period, refresh operation activating signal ZRAS is inactive, and block decoder 76 maintains the state of block select signal BS generated therefrom. This is because block designating address signal bits RABa and RABb applied to block decoder 76 are applied from the row address buffer which operates statically. Block decoder 76 may be structured to be maintained at a reset state during a pause period after completion of the burst refresh operation as represented by broken line in FIG. 26B.

When pause timer 72 generates refresh request signal φPA again, refresh controller 70 activates counter 70 again, and repetitively activates refresh operation activating signal ZRAS. Block decoder 76 decodes the address signal bits to generate memory block designating signal BS again. In this state, a memory block other than memory blocks MBL and MBR is designated. Therefore, isolation control circuit ICL maintains both isolation control signals BIL and BIR at H-level.

By the above operation, the burst refreshing is effected on a memory block at a time, so that charging/discharging of the isolation control signal for connecting the sense amplifier and the memory block are not performed during the burst refresh operation. Therefore, a current consumption in the data holding mode can be reduced.

Figure 27:
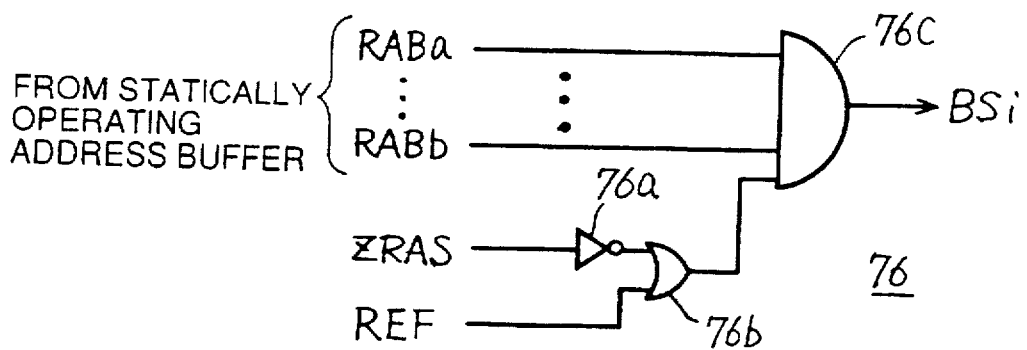
FIG. 27 shows an example of a structure of a block decoder shown in FIG. 26A.

FIG. 27 shows an example of a structure of block decoder 76 shown in FIG. 26A. More specifically, FIG. 27 shows a structure of a portion generating one block select signal BSi. In FIG. 27, block decoder 76 includes an inverter 76a receiving refresh operation activating signal ZRAS, an OR circuit 76b receiving the output signal of inverter 76a and data holding mode designating signal REF, and an AND circuit 76c which receives the output signal of OR circuit 76b and block designating address signal bits RABa–RABb. AND circuit 76c generates memory block designating signal BSi.

In the structure shown in FIG. 27, when data holding mode designating signal REF is at H-level, i.e., in the data holding mode, the output signal of OR circuit 76b is at H-level. Block designating address signal bits RABa–RABb are applied from the address buffer which operates statically during the data holding mode operation. Therefore, block designating signal BSi generated from AND circuit 76c statically changes without being reset during the data holding mode operation, as represented by block designating signal BS0 (BS1) shown in FIG. 26B.

[Modification of Block Decoder]

Figure 28:
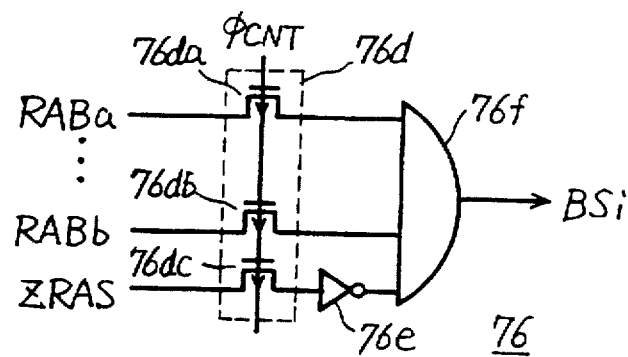
FIG. 28 shows a structure of a modification of the block decoder shown in FIG. 26A.

FIG. 28 shows a modification of block decoder 76 in FIG. 26A. In FIG. 28, block decoder 76 includes a transfer control circuit 76d which is turned on to pass block designating address signal bits RABa–RABb and refresh operation activating signal ZRAS when count control signal φCNT is at L-level, an inverter 76e which receives refresh operation activating signal ZRAS applied from transfer control circuit 76d, and an AND circuit 76f which receives block designating address signal bits RABa–RABb applied from transfer control circuit 76d and the output signal of inverter 76e.

AND circuit 76f generates block select signal BSi. Transfer control circuit 76d includes transfer gates formed of p-channel MOS transistors 76da–76db and 76e which are provided for signals RABa–RABb and ZRAS, respectively, and receive count control signal φCNT on their gates.

In the structure shown in FIG. 28, the count control signal φCNT is at H-level during the burst refreshing period, and all transfer gates 76da–76db and 76dc included in transfer control circuit 76a are off. Therefore, the state of input signal of AND circuit 76f does not change, and the state of memory block BSi does not change during the burst refreshing period. When the burst refreshing period expires and the pause period starts, count control signal φCNT is set to L-level, and all transfer gates 76da ... 76db and 76dc in transfer control circuit 76d are turned on. In this state, refresh operation activating signal ZRAS is at H-level, so that the output signal of inverter 76e is at L-level, and block designating signal BSi generated from AND circuit 76f is reset to L-level. According to this structure, therefore, block select signals BS0 and BS1 can have wave forms represented by broken line in FIG. 26B.

Figure 29:
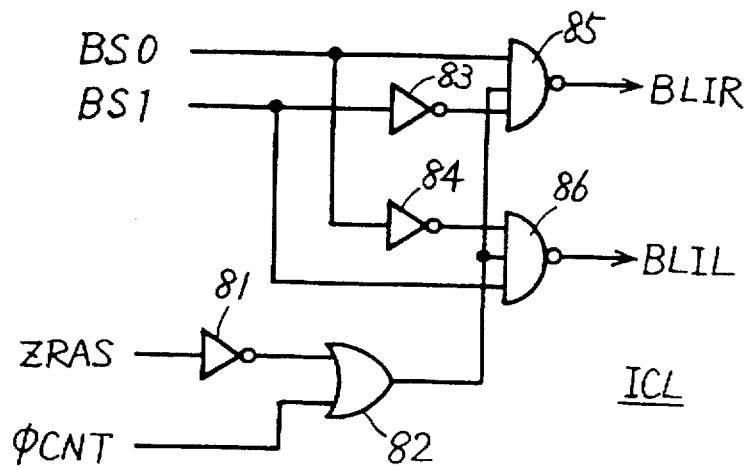
FIG. 29 shows an example of a structure of an isolation control circuit shown in FIG. 26A.

FIG. 29 shows an example of a structure of isolation control circuit ICL shown in FIG. 26A. Isolation control circuit ICL includes an inverter 81 receiving refresh operation activating signal ZRAS, an OR circuit 82 receiving the output signal of inverter 81 and count control signal φCNT, an inverter 83 receiving block designating signal BSi, an inverter 84 receiving block designating signal BS0, an NAND circuit 85 receiving the output signals of inverter 83 and OR circuit 82, and an NAND circuit 86 receiving block designating signal BS1, the output signal of inverter 84 and the output signal of OR circuit 82. NAND circuit 85 generates isolation control signal BLIR, and NAND circuit 86 generates isolation control signal BLIL.

When the count control signal φCNT is at H-level, i.e., during the burst refreshing, the output signal of OR circuit 82 is at H-level, and NAND circuits 85 and 86 are enabled. It is now assumed that block select signal BS0 is at H-level, and block select signal BS1 is at L-level. In this state, isolation control signal BLIL generated from NAND circuit 86 is at H-level, and isolation control signal BLIR generated from NAND circuit 85 is at L-level. Conversely, when block designating signal BS0 is at L-level, and block designating signal BS1 is at H-level, block isolation control signal BLIR is at H-level, and block isolation control signal BLIL is at L-level. When both of block select signals BS0 and BS1 are at L-level, both of isolation control signals BLIR and BLIL are at H-level.

When count control signal φCNT attains L-level and the burst refreshing period expires, refresh operation activating signal ZRAS attains H-level, the output signal of inverter 81 attains L-level, and the output signal of OR circuit 82 attains the L-level. Thereby, both isolation control signals BLIR and BLIL generated from NAND circuits 85 and 86 are reset to H-level.

Accordingly, by utilizing the structure of isolation control circuit shown in FIG. 29, block selecting and designating signals BSi (BS0 and BS1) generated from block decoder 76 do not change their states during the burst refreshing period, so that isolation control signals BSIR and BSIL do not change their states. Thereby, it is possible to reduce the charge/discharge current required for set/reset of isolation control signals BLIR and BLIL.

The structure shown in FIG. 29 may be provided with a circuit similar to the latch circuit (transfer control circuit 76d shown in FIG. 28) which latches block designating signals BS0 and BS1 in accordance with count control signal φCNT.

Although the embodiment 4 has been described only in connection with refresh operation activating signal ZRAS, internal RAS signal φRASZ may be applied instead of refresh operation activating signal ZRAS in the normal operation mode according to this embodiment.

[Modification]

Figure 30:
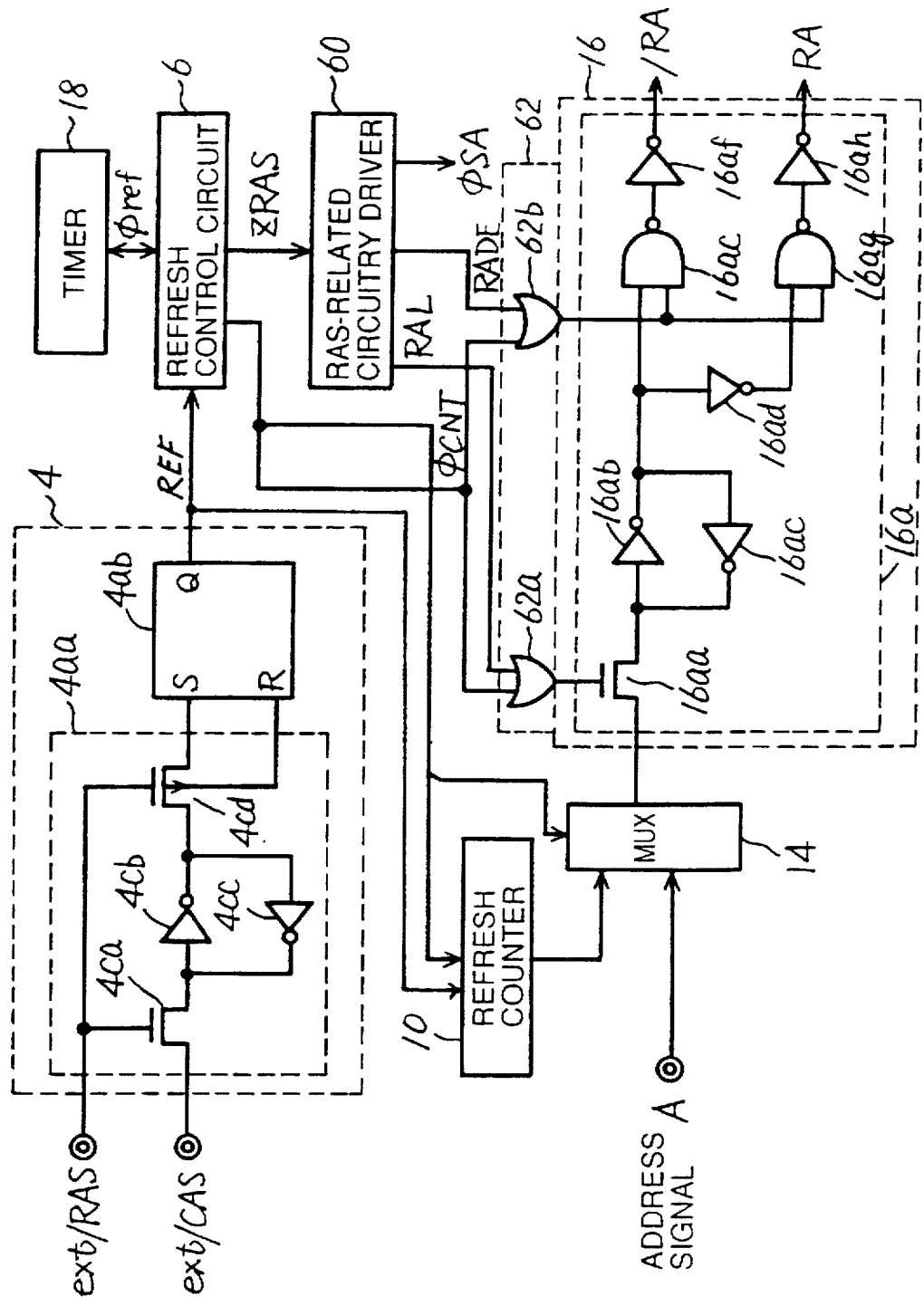
FIG. 30 shows a structure according to the embodiment 5 of the invention.

FIG. 30 shows a structure of a modification of the embodiment 4 of the invention. In the structure shown in FIG. 30, control circuit 62 which is provided for achieving the static operation of the row address buffer is supplied with count control signal φCNT from refresh control circuit 6. The count of refresh counter 10 is reset to an initial value when data holding mode designating signal REF changes (i.e., when it is set or rest). Structures other than the above are the same as those shown in FIG. 22, and the corresponding portions bear the same reference numbers or characters.

According to the structure shown in FIG. 30, address buffer 16 performs the static operation during the burst refreshing period, and maintains the reset state during the pause period. The structure shown in FIG. 30, therefore, can operate to change only the internal row address signal bits (including block designating signal) to be changed during the burst refreshing period, similarly to the foregoing embodiment, so that the current consumption in the data holding mode operation can be reduced.

By resetting refresh counter 10, refreshing can be started accurately from the first word line in the burst refresh operation.

According to the embodiment 4 of the invention, as described above, the refreshing is executed on a memory block at a time, and the state of the isolation control signal for connecting the sense amplifier and the memory block is held for the burst refreshing period (period of performing the refreshing on a block-by-block basis). Owing to this structure, it is possible to reduce the charge/discharge current required for set/reset of the isolation control signal, and the current consumption in the data holding mode operation can be reduced.

[Embodiment 5]

Figure 31A:
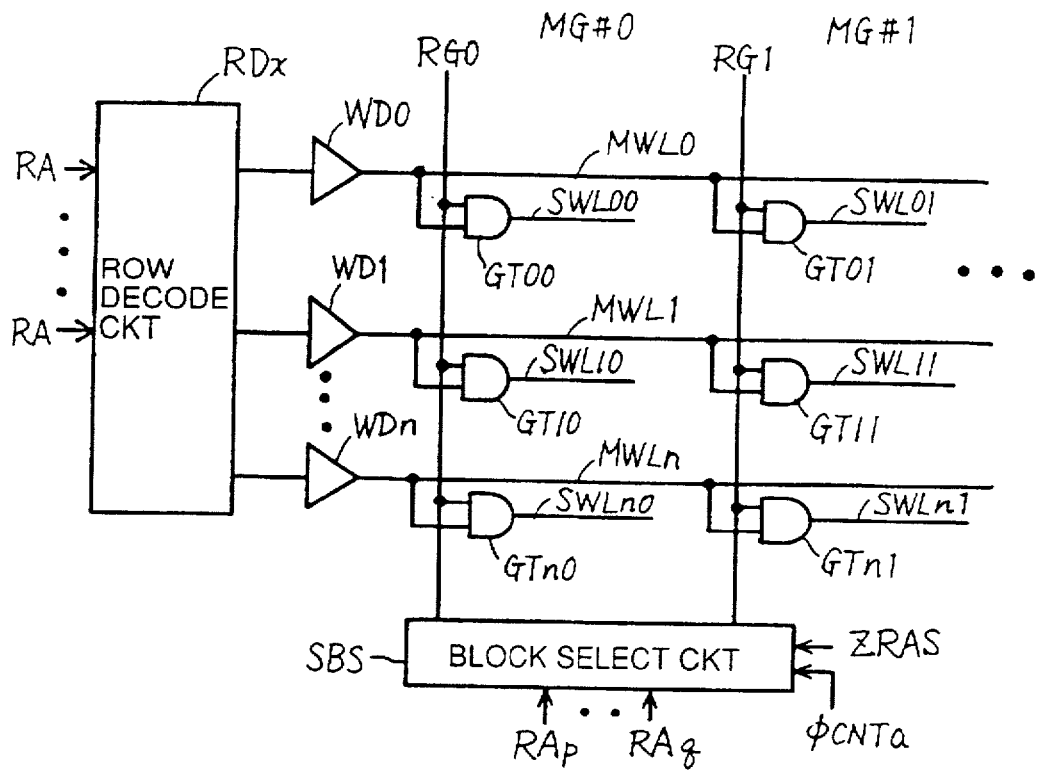
FIG. 31A shows a structure of a main portion of a DRAM according to the embodiment 6 of the invention.

FIG. 31A shows a structure of a main portion of a DRAM according to the embodiment 5 of the invention. More specifically, FIG. 31A shows a structure of one memory array. This memory array may be a sub-array. In FIG. 31A, main word lines MWL0–MWLn are arranged corresponding to the respective rows of memory cells in the memory array. The memory array is divided into a plurality of memory sub-blocks MG#0, MG#1, .... In each of memory sub-blocks MG#0 and MG#1, ..., there are arranged sub-word lines SWL corresponding to the respective rows of memory cells. In FIG. 31A, sub-word lines SWL00, SWL10–SWLn0 are representatively shown in memory sub-block MG#0, and sub-word lines SWL01, SWL11–SWLn1 are representatively shown in memory sub-block MG#1. Each sub-word line SWLkl (k=0–n, l=0–m (m is not shown)) is connected to the memory cells in one row of the corresponding memory sub-block.

For main word lines MWL0–MWLn, there is arranged a row decode circuit RDx for decoding internal row address signal RA. The number of bits of internal row address signal RA applied to row decoder circuit RDx depends on the number of main word lines MWL0–MWLn included. At the output of row decoder RDx, there are arranged word line drive circuits WD0–WDn, which are provided corresponding to main word lines MWL0–MWLn, respectively, and drive the corresponding main word lines to the selected state when selected (i.e., when the corresponding output signal of row decoder circuit RDx indicates the selected state).

For connecting sub-word line SWLkl to corresponding main word line MWLk, there is arranged a sub-block select gate GTkl which is responsive to a memory sub-block select signal RGl to make connection between the corresponding main word line MWLk and sub-word line SWLkl. Sub-block select gate GTkl drives corresponding sub-word line SWLkl to the selected state, when corresponding sub-block select signal RGl and the signal on corresponding main word line MWLk are both set to the selected state at H-level.

The structure shown in FIG. 31A is called a "divided word line (DWL)" structure formed of the main word lines and sub-word lines. Since memory cells connected to the selected word line are small in number, a load capacitance of the word line is small, and the corresponding sub-word line can be set rapidly to the selected state.

In the divided word line structure shown in FIG. 31A, refreshing is performed on a memory sub-block basis in the refresh operation. More specifically, after the memory cells connected to sub-word lines SWL00–SWLn0 are successively refreshed in one memory sub-block MG#0, refreshing is effected on the memory cells in the next memory sub-block MG#1. Memory sub-block designating signal RGk for the above operation is generated from a block select circuit SBS decoding memory block designating signal RAp-RAq.

Block select circuit SBS is selectively activated in response to refresh operation activating signal ZRAS and count control signal ɸCNTa. In the refresh operation, block select circuit SBS maintains the state of sub-block designating signal RGk until all the sub-block word lines are selected in one memory sub-block.

Figure 31B:
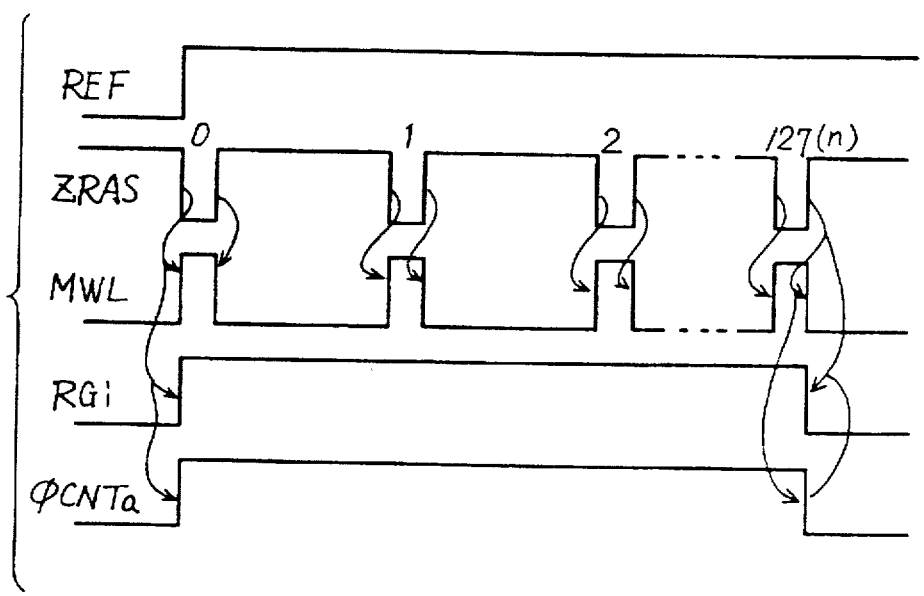
FIG. 31B shows a waveform thereof.

FIG. 31B shows an operation in the data holding mode of the DRAM shown in FIG. 31A. In FIG. 31B, when data holding mode designating signal REF is activated, refresh operation activating signal ZRAS is repetitively activated. In response to activation of refresh operation activating signal ZRAS, row decoder circuit RDx performs decoding to set successively main word lines MWL to the selected state. It is now assumed that main word lines MWL are 128 in number (n=127). In the data holding mode operation, block select circuit SBS is controlled by count control signal ɸCNT and maintains the state of its memory sub-block designating signal RGi while refresh operation activating signal ZRAS is activated 128 times. In the data holding mode, it is not necessary to reset sub-block designating signal RGi each time the refreshing is performed, and thus it is possible to reduce the current consumption required for charging/discharging of the sub-block designating signal.

Although the refreshing is conducted by performing the burst refresh operation on a memory sub-block basis in the structure shown in FIGS. 31A and 31B, it may be conducted in accordance with a distributed refresh mode.

Block select circuit SBS may be configured to have the structures of block decoder 76 and isolation control circuit ICL shown in the embodiment 4 already described. In this case, count control signal ɸCNTa can be generated by appropriately adjusting the count of counter 75 shown in FIG. 26 in accordance with the number of the main word lines included in the structure.

According to the embodiment 5 of the invention, as described above, the DRAM of the divided word line structure including the main word lines and sub-word lines has such a structure that, when the refreshing is performed on a basis of a memory sub-block of the sub-word lines, the state of the memory sub-block select signal for connecting the sub-word line and the main word line does not change until the refreshing of the memory cells in one sub-block is completed. Therefore, the current consumption required for charge/discharge of the memory sub-block select signal can be reduced, and the current consumption in the data holding mode operation can be reduced.

[Embodiment 6]

Figure 32A:
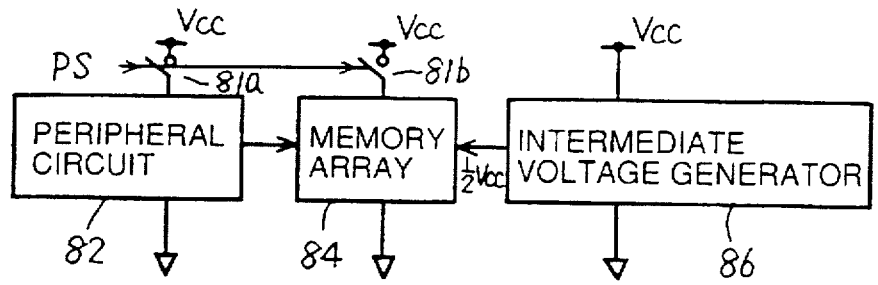
FIG. 32A shows a structure of a main portion of a DRAM according to the embodiment 6 of the invention.

FIG. 32A schematically shows a structure of a main portion of a DRAM according to the embodiment 6 of the invention. In FIG. 32A, switching elements 81a and 81b which are turned off in response to pause period designating signal PS are arranged between a peripheral circuit 82 and power supply node Vcc and between memory array 84 and power supply source Vcc. An intermediate voltage generating circuit 86, which can produce an intermediate voltage Vcc/2 from power supply voltage Vcc supplied from power supply node Vcc and apply the same to memory array 84, is always supplied with power supply voltage Vcc and produces intermediate voltage Vcc/2.

Memory array 84 may include a plurality of memory mats, or may be one memory mat which is selected in the refresh operation.

Figure 32B:
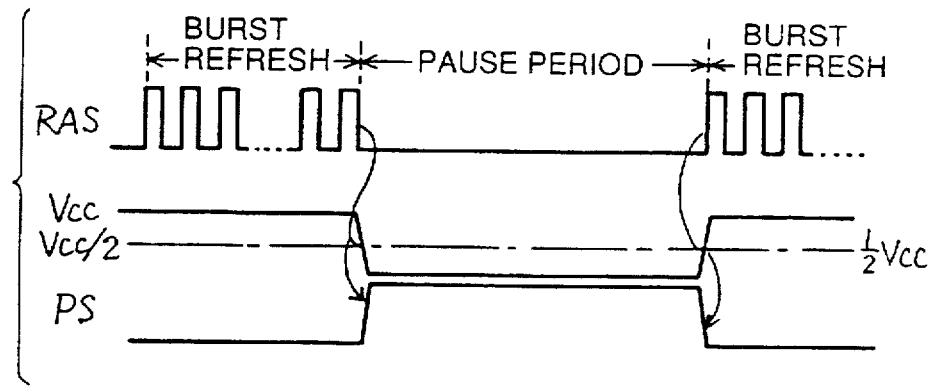
FIG. 32B is a waveform diagram showing an operation of the structure of FIG. 32A.

Peripheral circuit 82 includes a row decoder for driving memory array 84 to the selected state as well as the sense amplifier activating circuit. FIG. 32B is a waveform diagram representing an operation of the DRAM shown in FIG. 32A. The operation of the DRAM according to the embodiment 6 of the invention will be described below with reference to FIG. 32B.

In the data holding mode operation, while the burst refresh is being performed, pause period designating signal PS are at L-level, switching elements 81a and 81b are on, and peripheral circuit 82 and memory array 84 are supplied with power supply voltage Vcc from power supply node Vcc. Intermediate voltage generating circuit 86 always supplies intermediate voltage Vcc/2.

When the pause period starts after completion of the burst refreshing, pause period designating signal PS is set to H-level, switching elements 81a and 81b are turned off, and supply of power supply voltage Vcc to peripheral circuit 82 and memory array 84 is stopped, so that the operation power supply voltage in the peripheral circuit 82 and memory array 84 lowers toward the ground potential level due to discharging. During the pause period, the refreshing is not performed, and peripheral circuit 82 and memory array 84 do not operate. Therefore, the current consumption during the pause period can be remarkably reduced.

When the pause time elapses, the burst refreshing is performed again. In response to expiration of the pause period, pause period designating signal PS is set to L-level again, and switching elements 81a and 81b are turned on, so that the power supply voltage Vcc is supplied to peripheral circuit 82 and memory array 84 to enable peripheral circuit 82 and memory array 84. When the power supply voltage at peripheral circuit 82 and memory array 84 is stabilized, the burst refreshing is executed again.

Figure 33:
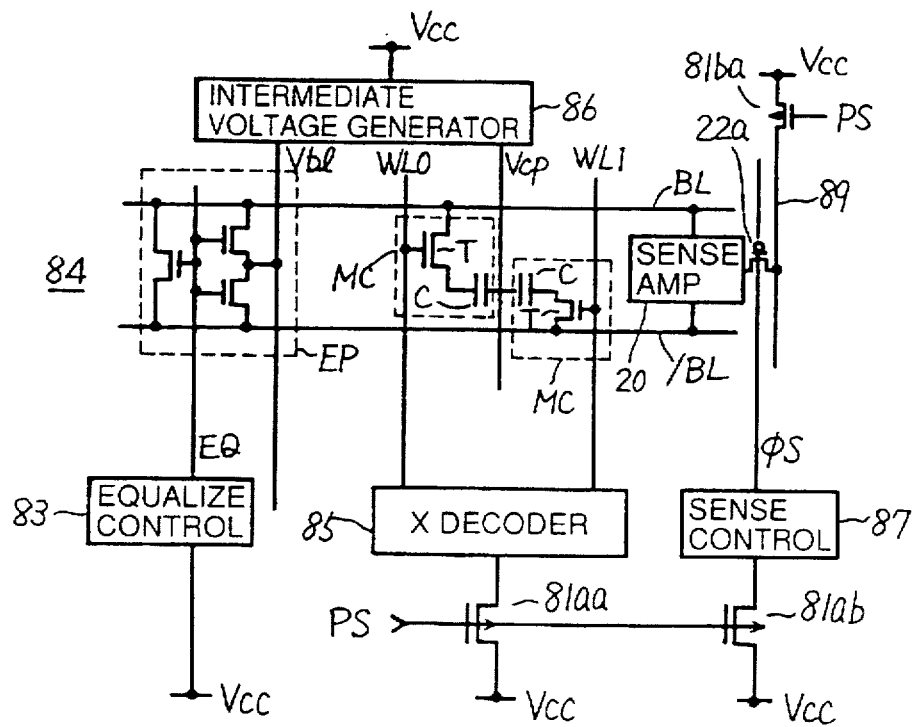
FIG. 33 shows a specific structure of the DRAM shown in FIG. 32A.

FIG. 33 shows an example of structures of memory array 84 and peripheral circuit 82 shown in FIG. 22. FIG. 33 representatively shows a pair of bit lines BL and /BL and word lines WL0 and WL1. A memory cell MC is arranged corresponding to the crossing between bit line BL and word line WL, and another memory cell MC is arranged corresponding to the crossing between bit line/BL and word line WL. Each memory cell MC includes a capacitor C storing information in a form of electric charges, and an access transistor T which is turned on to connect the capacitor to the corresponding bit line BL (or /BL) in response to the potential on the corresponding word line.

As a bit line peripheral circuit, there is provided sense amplifier 20. Sense amplifier 20 is supplied with power supply voltage Vcc from a power supply line 89 and drives a potential of bit line BL or /BL at a higher level to power supply voltage Vcc level, when sense amplifier drive transistor 22a is on. FIG. 33 does not show a control portion for an n-channel MOS transistor of sense amplifier 20.

For bit lines BL and /BL, there is provided a precharge/equalize circuit EP which is activated to precharge the potentials of bit lines BL and /BL to the intermediate potential in response to bit line equalize instructing signal EQ. Precharge/equalize circuit EP includes a transistor which is turned on and electrically short-cuts bit lines BL and /BL in response to equalize instructing signal EQ, and an MOS transistor which transmits an intermediate potential Vb1 (=Vcc/2) to bit lines BL and /BL.

Intermediate potential generating circuit 86 produces bit line precharge voltage Vb1 and cell plate voltage Vcp at the intermediate voltage Vcc/2 level from power supply voltage Vcc supplied from power supply node Vcc. Bit line precharge voltage Vb1 is supplied to precharge/equalize circuits EP which are provided for the respective bit line pairs. Cell plate voltage vcp is supplied to one electrode (cell plate electrode) of capacitor C included in memory cell MC.

Peripheral circuit 82 includes an equalize control circuit 83 for generating equalize instructing signal EQ, an X-decoder 85 for driving the word line to the selected state, and a sense control circuit 87 which generates sense activating signal φS for activating sense amplifier 20.

Equalize control circuit 83 is always active in order to hold the potentials of bit lines BL and /BL at the intermediate potential level via precharge/equalize circuit EP included in memory array 84. X-decoder 85 is coupled to power supply node Vcc via switching transistor 81aa (which is exemplified by a p-channel MOS transistor). Sense control circuit 87 is supplied with power supply voltage Vcc from power supply node Vcc via switching transistor 81ab. Power supply line 89 is coupled to power supply node Vcc via switching transistor 81ba. Switching transistors 81aa, 81ab and 81ba receive pause period designating signal PS on their gates.

In the refresh operation and the normal operation mode, pause period designating signal PS is at L-level, all of switching transistors 81aa, 81ab and 81ba are on, and X-decoders 85 and sense control circuit 87 are all enabled. Power supply line 89 is supplied with power supply voltage Vcc via switching transistor 81ba. In this state, X-decoder 85, sense control circuit 87 and sense amplifier 20 operate normally to perform refreshing, because they are supplied with the operation power supply voltage. Equalize control circuit 83 is always supplied with power supply voltage Vcc from power supply node Vcc. Therefore, bit lines BL and /BL are stably precharged to the intermediate potential level even in the refresh operation.

During the pause period, pause period designating signal PS is set to H-level, and all of switching transistors 81aa, 81ab and 81ba are turned off. Therefore, X-decoder 85 and sense control circuit 87 are inactive, and word lines WL0, WL1, ... are maintained at the ground potential level, because the signal lines are discharged and maintained at the same state as the reset state.

Sense activating signal φS is set to L-level also in sense control circuit 87. In this state, power supply line 89 is isolated from power supply node Vcc by switching transistor 81ba, so that power supply line 89 is electrically floated and its potential lowers toward the ground potential level, whereby sense amplifier 20 is deactivated.

Even in this state, equalize control circuit 83 is active, and equalize instructing signal EQ is at H-level, so that precharge/equalize circuit EP operates to precharge and maintain bit lines BL and /BL at the intermediate potential, i.e., precharge potential Vb1 level. The cell plate electrode of capacitor C of memory cell MC is supplied with cell plate voltage Vcp (=Vcc/2) from intermediate voltage generating circuit 86, and this cell plate voltage maintains a predetermined intermediate voltage level. During this pause period, destruction of memory cell data is prevented by maintaining the active state of intermediate voltage generating circuit 86. The destruction of memory cell data will now be described below.

Figure 34A:
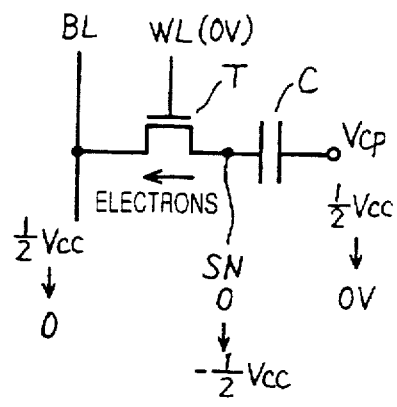
FIGS. 34A and 34B show operation and effect according to the embodiment 6 of the invention, respectively.

FIG. 34A shows change of the potential of memory cell at the time of stop of operation of intermediate voltage generating circuit 86. As shown in FIG. 34A, when intermediate voltage generating circuit 86 stops its operation, the potential of bit line BL (or /BL) is discharged from intermediate potential Vcc/2 to 0 V during the pause period. Also, cell plate voltage Vcp lowers from intermediate voltage Vcc/2 to 0 V level. The potential of word line WL is 0 V indicative of the nonselected state. Connection node (storage node) SN between access transistor T and capacitor C in the memory cell is electrically floated. In this state, when cell plate voltage Vcp at the intermediate potential level is lowered to 0 V, the potential of storage node SN is lowered by Vcc/2 due to capacitive coupling of capacitor C. When data stored in capacitor C is at L-level, the lowered potential (−Vcc/2) of storage node SN is lower than the potential (0 V) of bit line BL, so that the access transistor T is turned on to flow electrons from storage node SN to bit line BL even though the potential of word line WL is 0 V, and thus the potential of storage node SN rises. Therefore, information of data (potential of 0 V) at L-level stored in storage node SN is impaired, so that data of the memory cell is destroyed or the refreshing characteristics (data holding characteristics) of the memory cell deteriorate.

In order to prevent the potential lowering at storage node SN caused by the capacitive coupling of capacitor C, cell plate potential Vcp may be fixed at the ground potential level (even in the normal operation). Although the potential lowering due the capacitive coupling at storage node SN does not occur in this case, it is impossible to precharge bit lines BL and /BL to intermediate potential Vb1 (=Vcc/2) in the normal operation or refresh operation for performing the sense operation.

More specifically, if bit lines BL and /BL are precharged to intermediate potential Vcc/2 and cell plate potential Vcp is fixed at 0 V, a difference occurs in quantity of change of the bit line potential (read voltage) between the reading of H-level data and the reading of L-level data.

This can be understood from the following relationship:

V' (H)−Vcc/2=(Vcc/2)(Cb/(Cb+Cs)), (Vcc/2)−V' (L)=(Vcc/2)·Cs/(Cb+Cs)

where Cb and Cs represent the capacitance of bit line and the capacitance of capacitor C, respectively, and V' (L) and V' (H) represent the potentials of bit line in reading L-level data and in reading H-level data, respectively. Therefore, a difference occurs in the operation margin of sense amplifier between the reading of H-level data and the reading of L-level data (Cb>Cs), and thus the sensing operation cannot be performed accurately.

Figure 34B:
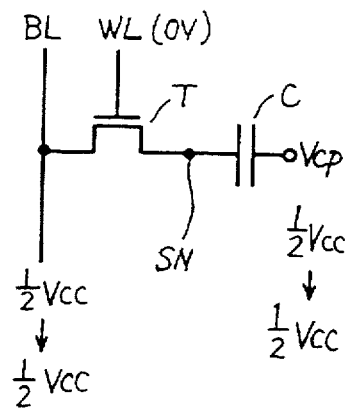

In view of the above, intermediate potential generating circuit 86 and equalize control circuit 83 are activated to maintain the bit line BL (or /BL) and cell plate voltage Vcp at the level of intermediate potential Vcc/2 even in the pause period, as shown in FIG. 34B. Thereby, an influence on storage node SN by the capacitive coupling of capacitor C does not exist, and storage node SN accurately holds the charges corresponding to storage data. In this manner, destruction of the storage data is prevented, and deterioration of the refreshing characteristics is prevented.

As described above, supply of power supply voltage Vcc to memory array 84 and peripheral circuit 82 is stopped while always operating the intermediate voltage generating circuit 86 in the pause period, so that the bit lines BL and /BL as well as the cell plate are held at the levels of precharge voltage Vb1 and Vcp levels equal to intermediate voltage Vcc/2, respectively. Thereby, neither deterioration of the refresh characteristics nor destruction of the memory cell storage data are caused, and in addition the current consumption can be reduced.

Figure 35A:
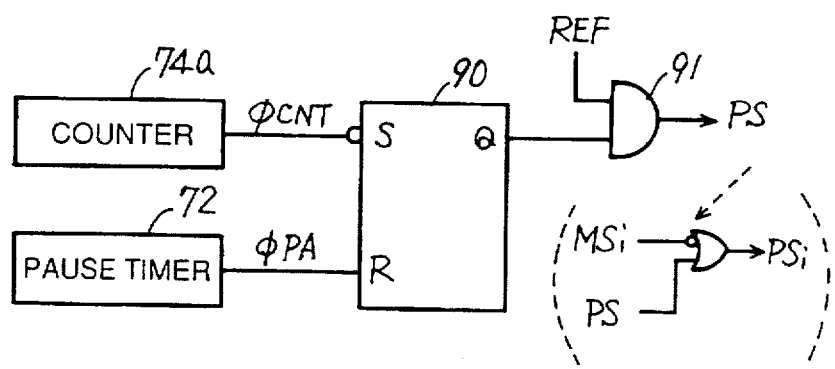
FIG. 35A schematically shows a structure of a portion generating a pause period designating signal used in the embodiment 6 of the invention.

FIG. 35A shows a structure of a portion generating pause period designating signal PS. In FIG. 35A, a structure related to generation of the pause period designating signal includes a counter 74a which counts the number of times of activation of the refresh operation activating signal in the burst refresh operation, pause timer 72 determining the pause period, a set/reset flip-flop 90 which is set in response to falling of count control signal φCNT applied from counter 74a and is reset in response to activation of refresh request signal φPA applied from pause timer 72, and an AND circuit 91 which receives the output signal applied from an output Q of set/reset flip-flop 90 and data holding mode designating signal REF.

Figure 35B:
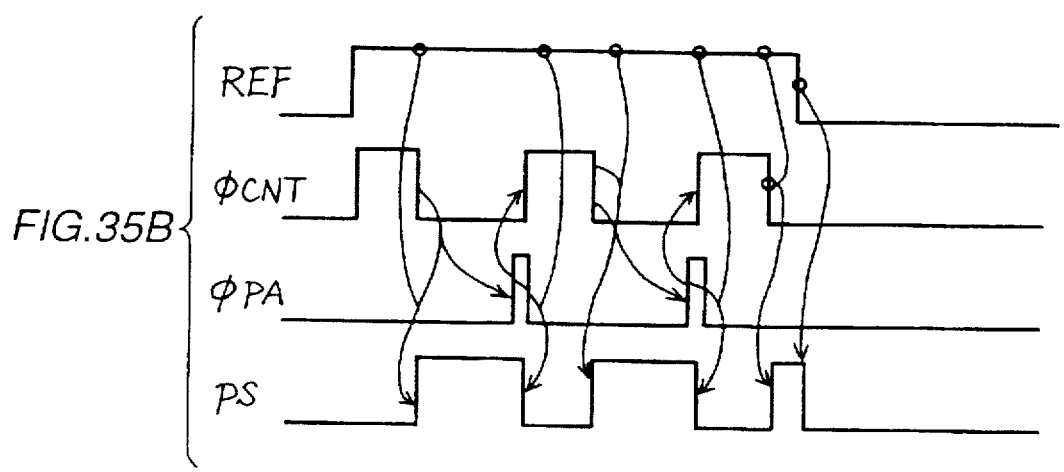
FIG. 35B shows waveform of the structure of FIG. 35A.

AND circuit 91 outputs pause period designating signal PS. Operation of the circuitry shown in FIG. 35A will be described below with reference to a waveform diagram of FIG. 35B.

When data holding mode designating signal REF is activated to attain H-level, AND circuit 91 is enabled. In the state before this enabling, pause period designating signal PS generated from AND circuit 91 is at L-level, and all switching transistors 81aa, 81ab and 81ba are on. When the burst refresh operation is performed in response to this activation of data holding mode designating signal REF, count control signal φCNT applied from counter 74a is set to H-level.

When the burst refreshing is completed, count control signal φCNT falls to L-level, and flip-flop 90 is set, so that the signal generated from output Q of flip-flop 90 rises to H-level, and correspondingly the pause period designating signal PS attains H-level.

When the pause period expires, refresh request signal φPA applied from pause timer 72 attains H-level, and flip-flop 90 is reset, so that the signal applied from its output Q attains L-level, and pause period designating signal PS attains L-level. In response to refresh request signal φPA, the burst refreshing is performed again, and count control signal φCNT is set to H-level.

When the burst refreshing is completed, flip-flop 90 is set again, and thus pause period designating signal PS is set to H-level. While data holding mode designating signal REF is at H-level after the above operation, pause period designating signal PS attains L-level during the burst refresh operation period, and attains H-level during the pause period.

When data holding mode is completed, pause period designating signal PS is set to L-level in response to lowering of data holding mode designating signal REF.

In the structure shown in FIG. 35A, pause period designating signal PS may be combined with the memory mat designating signal MSi to supply power supply voltage Vcc only to the memory mat, which is to be refreshed, in the data holding mode. For this operation, such a structure may be employed that pause period designating signal PSi for the memory mat is generated based on a logical product of the inverted signal of memory mat designating signal MSi and pause period designating signal PS, as represented in broken line in FIG. 35A.

Such a structure may also be employed that only cell plate potential Vcp at the intermediate potential level is always applied.

As described above, the embodiment 6 of the invention is constructed such that supply of the power supply voltage is stopped and the intermediate voltage is always supplied in the memory array during the pause period, so that outflow of charges stored in the memory cells does not occur, and thus the current consumption can be reduced without causing destruction of data and deterioration of refreshing characteristics.

[Embodiment 7]

Figure 36A:
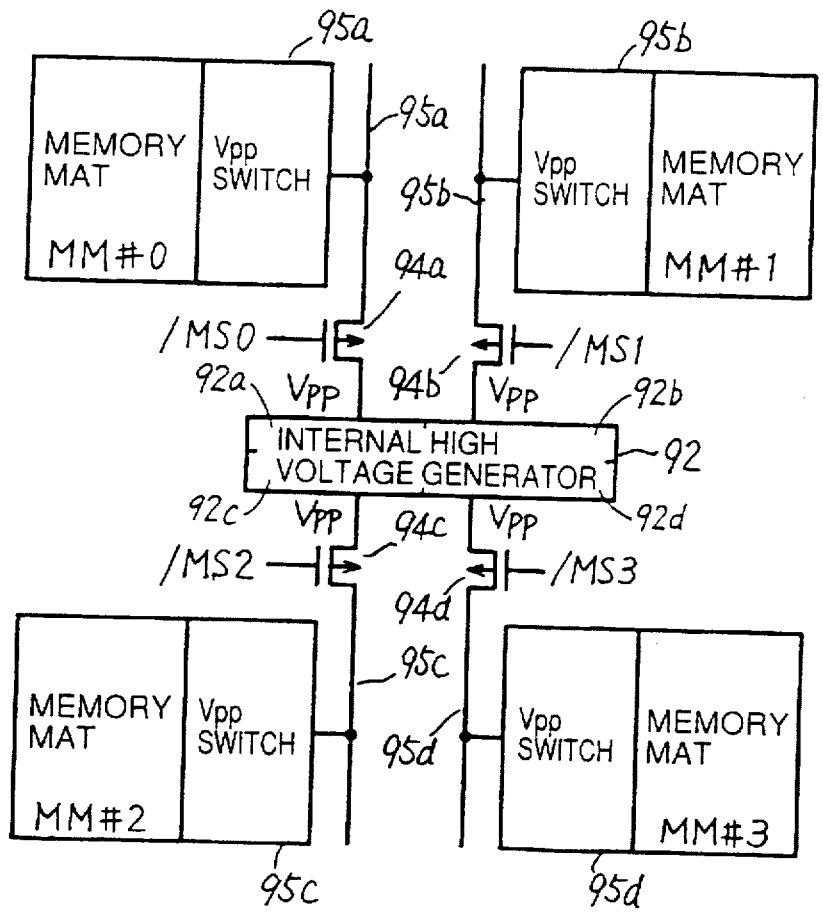
FIG. 36A schematically shows a whole structure of a DRAM according to the embodiment 7 of the invention.

FIG. 36A schematically shows a whole structure of a DRAM according to the embodiment 7 of the invention. In FIG. 36A, internal high voltage generating circuit 92 which generates an internal high voltage Vpp higher than the internal operation power supply potential is arranged at a central region among memory mats MM#0–MM#3. Internal high voltage generating circuit 92 is, for example, formed of a charge pump circuit which utilizes a charge pumping operation of a capacitor. Internal high voltage Vpp is transmitted onto the selected word line as will be described later in detail.

Main internal high voltage lines 95a–95d are arranged for memory mats MM#0–MM#3, respectively. Main internal high voltage line 95a receives internal high voltage Vpp from internal high voltage generating circuit 92 via a switching transistor 94a which is selectively turned on in response to complementary memory mat designating signal /MS0. Main internal high voltage line 95b receives internal high voltage Vpp from internal high voltage generating circuit 92 via a switching transistor 94b which is selectively turned on in response to complementary memory mat designating signal /MS1. Main internal high voltage line 95c receives internal high voltage Vpp from internal high voltage generating circuit 92 via a switching transistor 94c which is selectively turned on in response to complementary memory mat designating signal /MS2. Main internal high voltage line 95d receives internal high voltage Vpp via a switching transistor 94d which is selectively turned on in response to complementary memory mat designating signal /MS3. Internal high voltage generating circuit 92 includes internal high voltage generators 92a-92d which are represented by broken lines and are provided for memory mats MM#0-MM#3, respectively.

For memory mats MM#0-MM#3, there are arranged Vpp switches 96a-96d which receive internal high voltage Vpp from corresponding internal high voltage lines 95a-95d, respectively. Although the structure will be described later in detail, Vpp switch operates as follows. In the data holding mode operation, Vpp switch transmits internal high voltage Vpp supplied from the corresponding internal high voltage line to the sub-array group to be refreshed. In the standby state (precharge state), Vpp switch stops supply of the internal high voltage to the corresponding sub-array group.

In the normal operation mode, all memory mat designating signals /MS0-/MS3 are in the selected state of L-level, all switching transistors 94a-94d are on, and internal high voltage Vpp is supplied from internal high voltage generating circuit 92 to main internal high voltage lines 95a-95d. In the normal operation mode, Vpp switch group 96a-96d are on, and transmit the internal high voltage received from corresponding main internal high voltage lines 95a-95d to corresponding memory mats MM#0-MM#3. In the normal operation mode, therefore, respective memory mats MM#0-MM#3 are selected to receive internal high voltage Vpp and operate.

In the data holding mode operation, only one memory mat is designated for refreshing. Therefore, only one of memory mat designating signals /MS0-/MS3 is set to the selected state of L-level, and the remaining memory mat designating signals are set to the inactive state of H-level. Since the nonselected memory mats maintain the standby state, they do not consume internal high voltage Vpp, so that the current consumption in the data holding mode can be reduced.

Figure 36B:
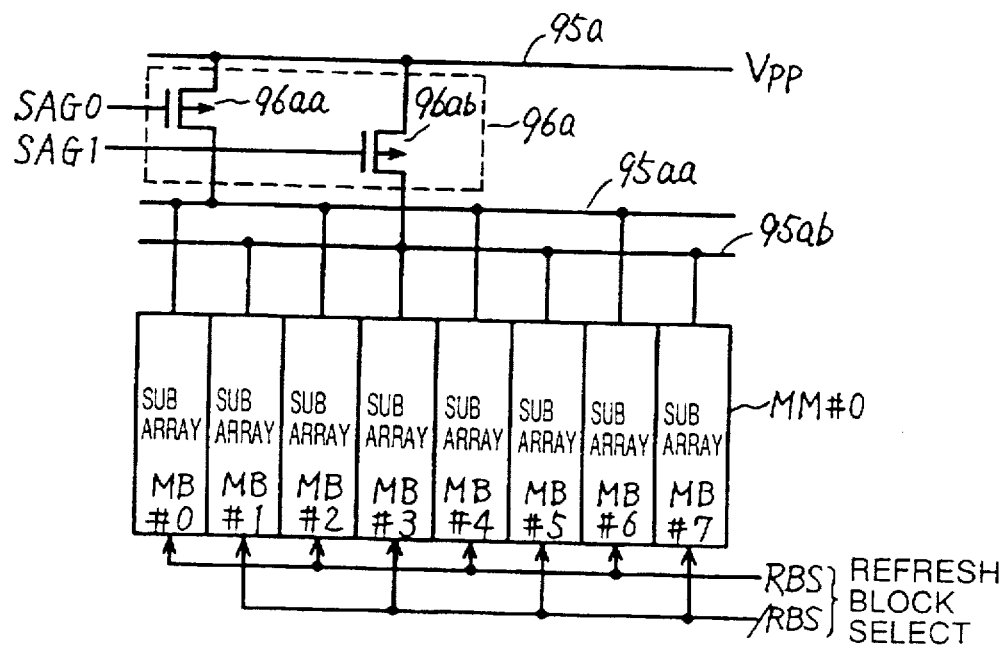
FIG. 36B schematically shows a structure of one of memory mats in the DRAM shown in FIGS. 36A.

FIG. 36B shows more specifically the structure of Vpp switch for one memory mat (MM#0 in FIG. 36B). In FIG. 36B, memory mat MM#0 includes, for example, eight sub-arrays MB#0-MB#7. Sub-arrays MB#0-MB#7 are grouped into two groups, so that the sub-arrays in each group are refreshed simultaneously. Sub-arrays MB#0, MB#2, MB#4 and MB#6 form one sub-array group, and sub-arrays MB#1, MB#3, MB#5 and MB#7 form the other sub-array group. A local high voltage line 95aa is arranged commonly for the sub-arrays bearing even numbers. A local high voltage line 95ab is arranged commonly for the sub-arrays bearing odd numbers.

A Vpp switch 96a includes a switching transistor 96aa formed of a p-channel MOS transistor, which is arranged between main internal high voltage line 95a and local internal high voltage line 95aa and is responsive to an array group designating signal SAG0 to be selectively turned on, and a switching transistor 96ab formed of a p-channel MOS transistor, which is connected between internal high voltage line 95a and local internal high voltage line 95as and is responsive to an array group designating signal SAG1 to be selectively turned on.

In the refresh operation, sub-arrays MB#0-MB#7 are selected in accordance with refresh block select signals RBS and /RBS (decoded signals of bits RAa, RAb and RAc) which simultaneously designate the blocks to be refreshed in the refresh operation. In the normal operation, only one sub-array is selected. This structure is the same as that in the embodiment 1.

In the normal operation mode, both sub-array group designating signals SAG0 and SAG1 are at L-level, switching transistors 96aa and 96ab are on, and internal high voltage line 95a supplies internal high voltage Vpp to local internal high voltage lines 95aa and 95ab. In memory mat MM#0, one sub-array is selected, and a selected memory cells is accessed. Only the switching transistors of the sub-array group including the selected sub-array may be turned on also in the normal operation mode.

Meanwhile, in the data holding mode operation, and particularly in the refresh operation, one of array group designating signals SAG0 and SAG1 is selected and the other is nonselected (when memory mat MM#0 is designated). In this state, therefore, only the switching transistor (96aa or 96ab) provided corresponding to the sub-array to be refreshed is turned on, internal high voltage line 95a supplies internal high voltage Vpp to local internal high voltage line (95aa or 95ab) provided for the sub-array to be refreshed.

Local internal high voltage line (95ab or 95aa) provided for the nonselected sub-arrays are isolated from main internal high voltage line 95a. In this state, as will be described later, only the sub-threshold current flows in the nonselected sub-array, and the current consumption is very small. Thereby, it is possible to reduce remarkably the data holding current in the data holding mode operation (i.e., refresh current consumed in the refresh operation and standby current during standby in the data holding mode). Since only one switching transistor is provided for the sub-array group formed of the plurality of sub-arrays, it is possible to reduce the number of transistors included in the Vpp switch provided for selectively supplying the internal high voltage, and thus an area occupied by the Vpp switch can be reduced.

Figure 37:
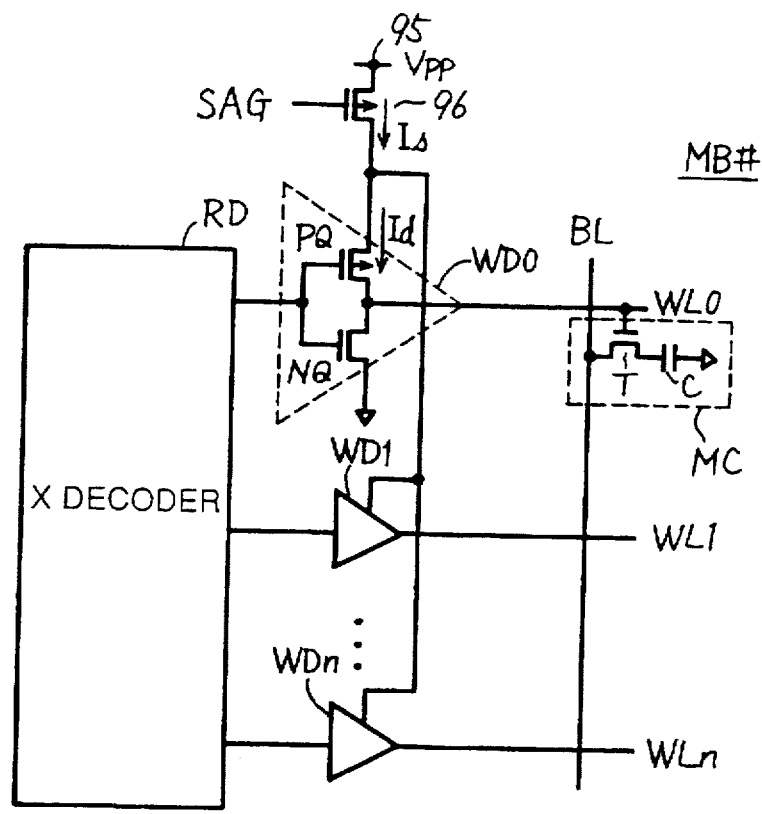
FIG. 37 schematically shows a structure of a main portion in one of sub-arrays shown in FIG. 36B.

FIG. 37 shows an arrangement of a portion using a high voltage in one sub-array. In FIG. 37, memory sub-array MB# (MB#0-MB#7) includes an X-decoder RD which decodes an applied internal row address signal (not shown) to generate the word line designating signal, and word line drivers WD0-WDn which are provided corresponding to word lines WL0-WLn, respectively, and drive the corresponding word lines to the selected state in response to the row designating signal applied from X-decoder RD.

Each of word line drivers WD0-WDn includes a p-channel MOS transistor PQ which is turned on to transmit internal high voltage Vpp to a corresponding word line WL (WL0-WLn) in response to the L-level signal indicative of the selected state applied from X-decoder RD, and an n-channel MOS transistor NQ which is turned on to discharge the corresponding word line WL to the ground potential level in response to the word line non-designating signal (H-level) applied from X-decoder RD.

One conduction node (source node) of p-channel MOS transistor PQ included in each of word line drivers WD0-WDn is coupled to local internal high voltage line 95 (95a-95d) via common switching transistor 96 (96aa). Switching transistor 96 is selectively turned on in response to memory sub-array group designating signal SAG (SAGi).

For example, when word line WL0 is selected, p-channel MOS transistor PQ included in word line driver WD0 is turned on, and internal high voltage Vpp is transmitted onto word line WL0. (In this state, switching transistor 96 is on.) Therefore, the gate potential of access transistor T included in memory cell MC is higher than internal operation power supply potential (Vint: not shown), so that internal voltage (i.e., voltage at Vint level) on bit line BL can be transmitted to capacitor C without lose of a threshold voltage of access transistor T (n-channel MOS transistor). Thereby, even in the case where a low power supply voltage is used, data at H-level can be stored in capacitor C without a voltage loss.

A current driving capability (channel width) of switching transistor 96 is nearly equal to a current driving capability (channel width) of p-channel MOS transistor PQ included in each of word line drivers WD0–WDn. Since only one word line is selected, only one p-channel MOS transistor is turned on, and a required drive current can be supplied to the word line driver via switching transistor 96.

During standby (or precharge state; in each of refresh operation and normal operation), p-channel MOS transistors PQ included in word line drivers WD0–WDn are off. Generally in this case, the gate potential of MOS transistor PQ is set to high voltage level Vpp. During standby, array group designating signal SAG is held at H-level (internal high voltage Vpp level). Switching transistor 96 is formed of a p-channel MOS transistor, and a sub-threshold current Is flows even when its gate and source potentials are equal to each other.

In word line drivers WD0–WDn, the sub-threshold current Id flows in each p-channel MOS transistor PQ. In this case, however, sub-threshold current Is is supplied only via one switching transistor 96, and a relationship of Is=n·Id holds between sub-threshold current Id of the p-channel MOS transistors included in word line drivers WD0–WDn and sub-threshold current Is flowing through switching transistor 96.

Owing to sub-threshold current Is, switching transistor 96 has the drain node potential lower than internal high voltage Vpp (because of voltage drop by the channel resistance of switching transistor 96). Therefore, each of p-channel MOS transistors PQ of word line drivers WD0–WDn has the source potential being lower than the gate potential, so that the gate and source of p-channel MOS transistor PQ is reversely biased, which results in reduction of the sub-threshold current therethrough. Thereby, the sub-threshold current in the standby state can be reduced, and thus the current consumption in the data holding mode can be reduced.

Figure 38A:
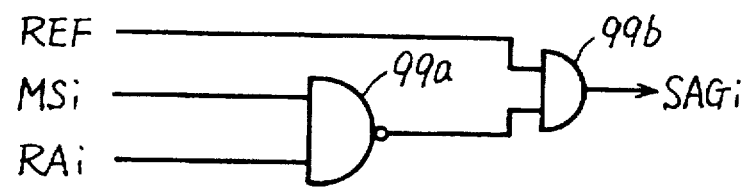
FIG. 38A shows a structure of a portion generating an array group designating signal used in the embodiment 7 of the invention.

FIG. 38A shows a structure of a portion generating array group designating signal SAG. In FIG. 38A, an array group designating signal generating portion includes an NAND circuit 99a which receives memory mat designating signal MSi and sub-array group designating address signal bit RAi (RAa–RAc), and an AND circuit 99b which receives data holding mode designating signal REF and the output signal of NAND circuit 99a. For array group designating signal RAi, row address signal bit (RAc) of one bit is used because higher array group designating address signal bits (bits RAa and RAb shown in FIG. 4) are degenerated during the data holding mode. The number of sub-array group designating signal bits RAi is appropriately determined depending on the number of sub-array groups in the sub-array. Now, operation of the structure shown in FIG. 38A will be described below with reference to a waveform diagram of FIG. 38B.

In the data holding mode operation, data holding mode designating signal REF is at H-level, and NAND circuit 99b operates as a buffer. When memory mat designating signal MSi is selected to attain H-level, switching transistor 94 in FIG. 36A is turned on. When array group designating signal RAi is selected, the output signal of NAND circuit 99a attains L-level, array group designating signal SAGi attains L-level, and switching transistor 96 (see FIG. 37) is turned on.

Meanwhile, in the nonselected state, the output signal of NAND circuit 99a is at H-level, and array group designating signal SAGi generated from AND circuit 99b attains H-level. For the array group to be refreshed, therefore, switching transistor 96 is turned on to supply internal high voltage Vpp thereto. In the nonselected sub-array group (and memory mat), switching transistors 96 are turned off, and internal high voltage Vpp is not supplied.

In the normal operation mode, data holding mode designating signal REF is at L-level, and array group designating signal SAGi is always at L-level.

According to the structure shown in FIG. 38A, memory mat designating signal MSi is valid during the data holding mode operation, and memory mat designating signal MSi is degenerated in the normal operation mode. Therefore, in the normal operation mode, memory mat designating signals MSi set all memory mats MM#0–MM#3 to the selected state. During the data holding mode operation, only memory mat designating signal MSi for the memory mat to be refreshed is set to the selected state. Accordingly, AND circuit 99b may not be provided.

Figure 38B:
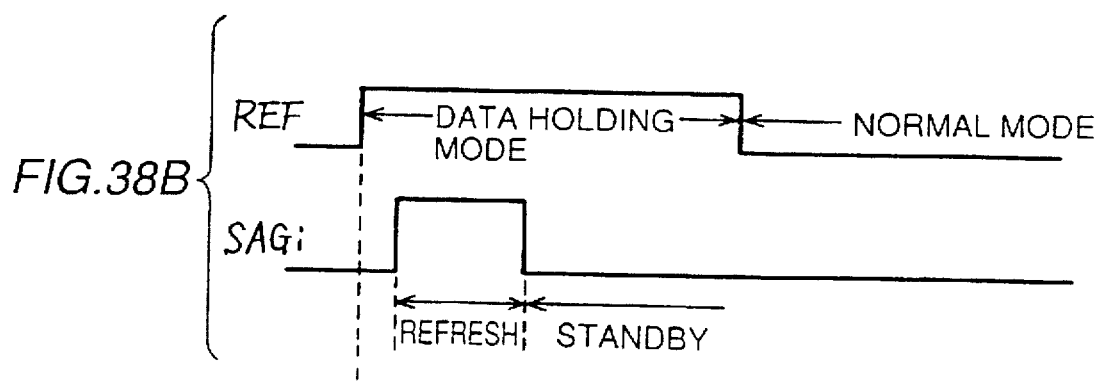
FIG. 38B shows operation waveforms thereof.

According to the waveform diagram of FIG. 38B, when the burst refresh is employed to perform the refreshing on a sub-array basis (i.e., an array block basis) during the refresh period, the current consumption can be further reduced. Signal φCNT may be used instead of signal REF.

[Modification 1]

Figure 39A:
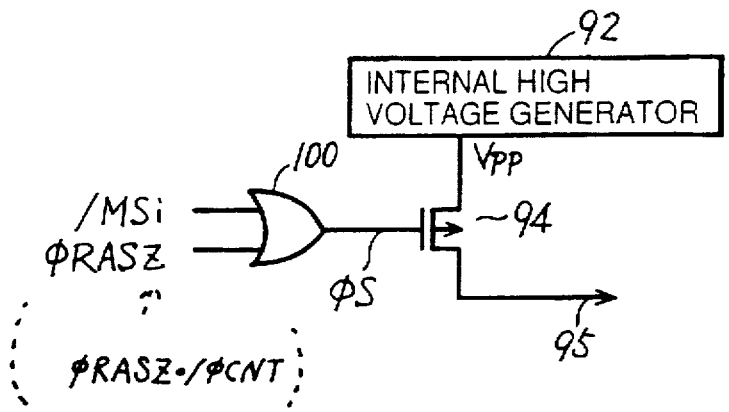
FIG. 39A shows a structure of a modification 1 according to the embodiment 7 of the invention.
Figure 39B:
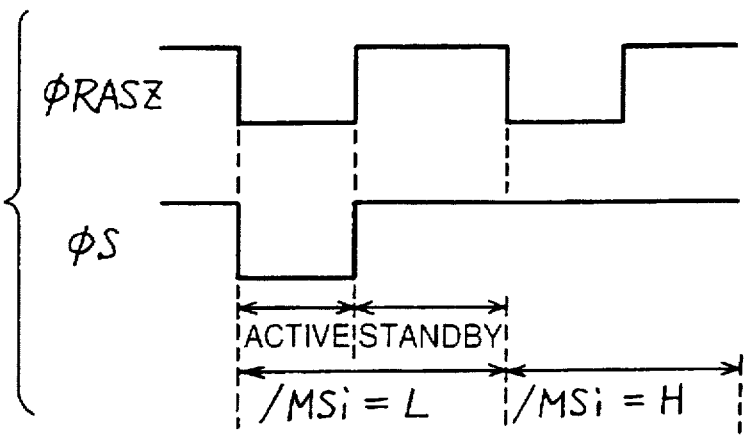
FIG. 39B shows operation waveforms thereof.

FIG. 39A shows a structure of a modification 1 of the embodiment 7 of the invention. In FIG. 39A, switching transistor 94, which is arranged between internal high voltage generating circuit 92a provided corresponding to each memory mat and main internal high voltage line 95, is turned on/off by the output signal of an OR circuit 100 carrying out the logical OR operation on inverted signal /MSi of the memory mat designating signal and internal RAS signal φRASZ. Operation of the structure shown in FIG. 39A will be described below with reference to an operation waveform diagram of FIG. 39B.

In each of the data holding mode and the normal operation mode, internal RAS signal φRASZ is at H-level during standby (precharge state) and is at L-level during the active cycle (i.e., period in which the memory cell is actually selected and the sense amplifier actually operates). In the data holding mode operation cycle, only memory mat designating signal /MSi for the memory mat in which refreshing is to be performed is set to the selected state of L-level. Memory mat designating signal /MSi for the nonselected memory mat is set to H-level, and switching transistor 94 is turned off regardless of the operation cycle. In the selected memory mat, the output signal φS of OR circuit 100 attains L-level or H-level depending on the operation cycle, i.e., active cycle or standby cycle. Switching transistor 94 is turned on in the active cycle, and is turned off in the standby cycle. Therefore, the current consumption can be further reduced during the standby cycle in the data holding mode operation.

In the normal operation mode, memory mat designating signals /MSi are set to the selected state of L-level in all the memory mats. In accordance with the operation cycle, switching transistor 94 is selectively turned on and off in response to the output signal φS of OR circuit 100. Therefore, the standby current in the normal operation mode can be reduced.

While the burst refreshing is being performed, it is not necessary to selectively turn on/off the transistor 94, if the period of standby cycle (RAS-related circuit precharge period) is short. Also, in order to turn on/off the transistor 94 during the standby cycle and active cycle in the normal operation mode, it is necessary only to use the count control signal φCNT already described (see FIGS. 3 and 5) and apply a signal representing a logical product of the inverted signal of count control signal φCNT and internal RAS signal φRASZ to OR circuit 100 instead of signal φRASZ, as represented in parentheses.

[Modification 2]

Figure 40:
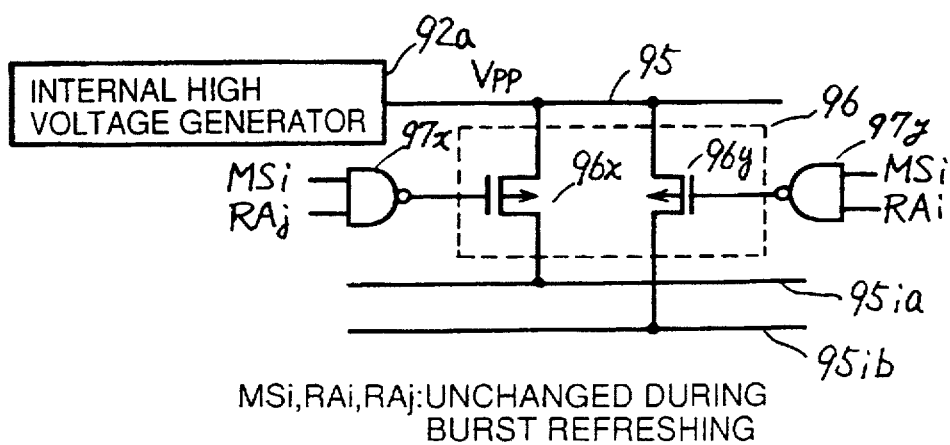
FIG. 40 shows a structure of a modification 2 according to the embodiment 7 of the invention.

FIG. 40 shows a structure of a modification 2 of the embodiment 7 of the invention. In the structure shown in FIG. 40, internal high voltage generating circuit 92a directly supplies internal high voltage Vpp to main internal high voltage line 95. Internal high voltage line 95 is connected to local internal high voltage lines 95ia and 95ib via Vpp switch 96. Vpp switch 96 includes a switching transistor 96x (p-channel MOS transistor) which is selectively turned on in response to the output signal of an NAND circuit 97x receiving memory mat designating signal MSi and array group designating signal RAj, and a switching transistor (p-channel MOS transistor) 96y which is selectively turned on in response to the output signal of an NAND circuit 97y receiving memory mat designating signal MSi and sub-array group designating signal RAi.

Switching transistor 96x is turned on to make electrical connection between the main internal high voltage line 95 and local internal high voltage line 95ia when the sub-array group coupled to local internal high voltage 95ia is designated. Switching transistor 96y is turned on to make electrical connection between the main internal high voltage line 95 and local internal high voltage line 95ib when the sub-array group coupled to local internal high voltage line 95ib is designated.

In the structure shown in FIG. 40, when array group designating signals RAj and RAi are produced based on the signals generated from the row address buffer which operates statically, switching transistor 96x or 96y, which is provided corresponding to the sub-array group to be refreshed, is selectively turned on. In the pause period, memory mat designating signal MSi and array group designating signals RAi and RAj are reset, so that switching transistors 96x and 96y are turned off.

In the normal operation mode, memory mat designating signal MSi is always set to the selected state of H-level. In the active cycle, array group designating signal RAi or RAj corresponding to the selected sub-array attains the H-level, and the corresponding switching transistor 96x or 96x is turned on. In the standby cycle, array group designating signal RAi or RAj is reset to attain L-level, and both switching transistors 96x and 96y are turned off.

By utilizing the structure shown in FIG. 40, internal high voltage Vpp is transmitted to the sub-array group to be refreshed during the burst refreshing period, and internal high voltage line 95 can be isolated from local internal high voltage lines 95ia and 95ib during the pause period. In the normal operation, the switching transistor corresponding to the sub-array group including an operating sub-array is turned on in the active cycle, and both switching transistors 96x and 96y are turned off in the standby cycle. Therefore, it is possible to reduce remarkably the current consumption due to the sub-threshold current in the precharge state (i.e., during the pause period or during the standby cycle in the normal cycle operation mode).

According to the embodiment 7 of the invention, as described above, refreshing of a plurality of memory mats is performed in such a manner that the refreshing is concentratedly executed in one memory mat, and, in this one memory mat under the concentrated refreshing, the internal high voltage is supplied only to the sub-array group to be refreshed. Therefore, the current consumption can be reduced remarkably, compared with the structure in which the internal high voltage is supplied to all the memory mats (because the leak current at the word driver can be reduced).

In this embodiment 7, it has been described that internal high voltage Vpp is transmitted only to the word line drive circuits. However, as shown in the embodiment 4, the internal high voltage Vpp may be used also for generating isolation control signals BLIL and BLIR for making connection between the sense amplifier and sub-array in the "shared sense amplifier" arrangement, in which the sense amplifiers are commonly used by the sub-arrays. In this case, the internal high voltage is not supplied to the nonselected memory block paired with the selected sub-array (memory block). In the other nonselected memory blocks, the isolation control signal must maintain the high voltage Vpp level or internal power supply voltage Vint.

[Embodiment 8]

Figure 41A:
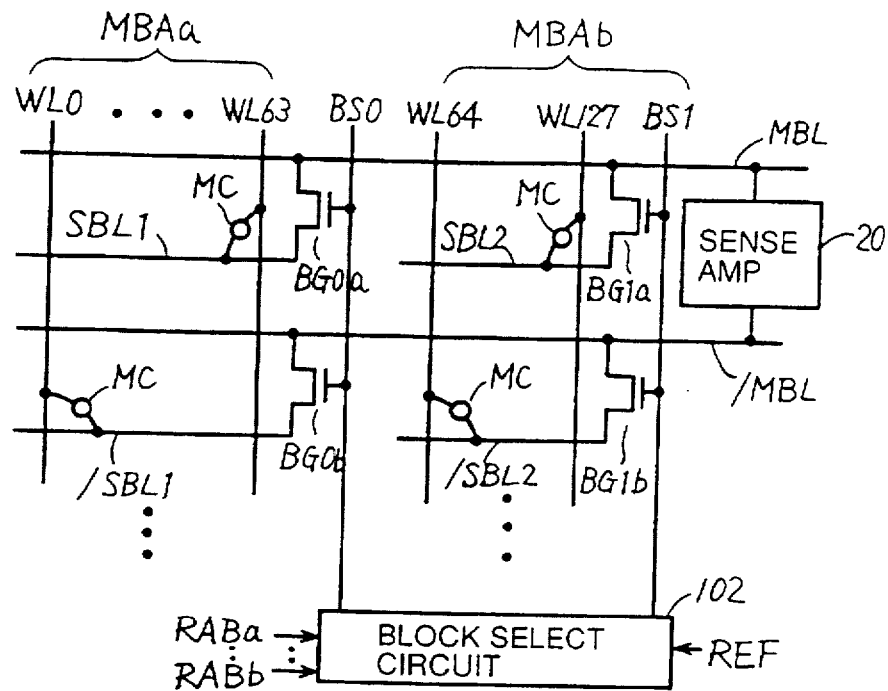
FIGS. 41A and 41B show a structure of a main portion according to an embodiment 8 of the invention and operation waveforms thereof, respectively.

FIG. 41A shows a structure of a main portion of a DRAM according to an embodiment 8 of the invention. More specifically, FIG. 41A shows two memory blocks MBAa and MBAb. Each of memory blocks MBAa and MBAb may be one sub-array, or memory blocks MBAa and MBAb may be included in one sub-array. Memory blocks MBAa and MBAb may be provided three or more in number.

Figure 41B:
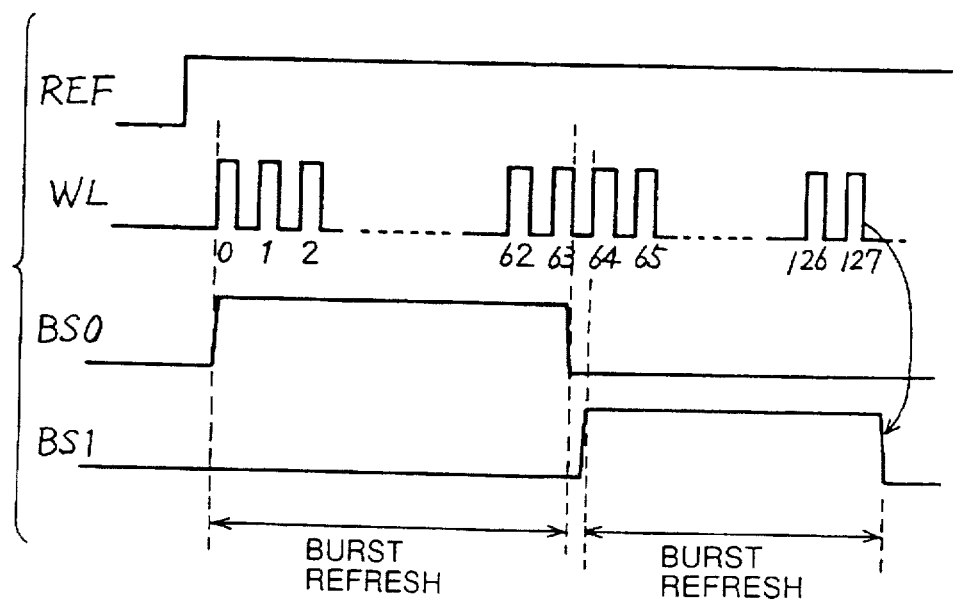

Memory block MBAa includes 64 word lines WL0–WL63, and memory block MBAb includes 64 word lines WL64–WL127. Sub-bit line pairs SBL1 and /SBL1, . . . , each of which is connected to the memory cells in one column of memory block MBAa, extend across word lines WL0–WL63. Similarly, each of sub-bit line pairs SBL2 and /SBL2, . . . in memory block MBAb is connected to the memory cells in one column of memory block MBAb, and extends across word lines WL64–WL127. In FIG. 41, there are representatively shown memory cell MC, which is arranged corresponding to the crossing between word line WL63 and sub-bit line SBL1, as well as memory cell MC, which is arranged corresponding to the crossing between word line WL127 and sub-bit line SBL2.

Main bit line pairs MBL, /MBL, . . . are arranged commonly to all the memory cell columns in the memory blocks MBAa and MBAb. Main bit line pair MBL and /MBL is electrically connected to sub-bit line pair SBL1 and /SBL1 via block select gates BG0a and BG0b which are turned on in response to block select signal BS0, and is electrically connected to sub-bit line pair SBL2 and /SBL2 via block select gates BG1a and BG1b which are turned on in response to block select signal BS1.

Block select signals BS0 and BS1 are generated from a block select circuit 102 in accordance with block designating address signal bits RABa, . . . , RABb and data holding mode designating signal REF. Main bit line pair MBL and /MBL is provided with sense amplifier 20 for sensing and amplifying data which appears on main bit lines MBL and /MBL.

In the operation, when one memory block is selected, sub-bit line pair SBL and /SBL in the selected memory block are connected to the corresponding main bit lines MBL and /MBL. The memory cells connected to main bit lines MBL and /MBL are small in number, so that a parasitic capacitance of main bit lines MBL and /MBL is reduced, and thus data can be sensed and amplified rapidly. This structure of the main bit lines and sub-bit lines is called a "hierarchical bit line structure".

In the normal operation mode, block select signals BS0 and BS1 are deactivated during standby, and only the block select signal for the selected memory block is activated to attain H-level in the active cycle. In the data holding mode operation, the refreshing is performed on a memory block basis. Operation in the data holding mode will be described below with reference to FIG. 41B.

Data holding mode designating signal REF is activated to attain H-level, so that the DRAM enters the data holding mode. It is now assumed that word lines WL0-WL63 included in memory block MBAa are successively refreshed. In this case, block select circuit 102 holds block select signal BS0 at H-level for a period (burst refresh period) during which word lines WL0-WL63 are successively selected. During this, block select signal BS1 is fixed at L-level. When refreshing of memory cells MC in memory block MBAa is completed, block select circuit 102 sets block select signal BS0 to L-level, and sets block select signal BS1 to H-level. Word lines WL64-WL127 are successively selected for refreshing the memory cell data. During this period, block select signal BS1 is held at the selected state of H-level.

During the burst refresh period, i.e., while the word lines in one memory block are successively selected for refreshing, the block select signal for this memory block is held at the selected state, whereby it is not necessary to drive the block select signal to the set/reset states (selected/nonselected states) in each refresh cycle, and thus the current consumption for driving the block select signal can be reduced. Therefore, the current consumption in the data holding mode can be reduced.

Block select circuit 102 shown in FIG. 41A may include the same structure as block select circuit 76 shown in FIG. 27 or 28.

According to the embodiment 8 of the invention, as described above, the memory block has the hierarchical bit line structure, refresh operation is performed on a basis of a memory block defined by the sub-bit lines. In this case, the block select signal for the memory block including a selected word line is always held at the selected state, and the block select signal for the nonselected memory block is always fixed at the nonselected state of L-level. Therefore, it is not necessary to drive the block select signals to the selected state and nonselected state in the data holding mode operation, so that the current consumption for driving the block select signals can be reduced, and thus the current consumption in the data holding mode can be reduced.

According to the invention, as described hereinbefore, the refreshing is concentratedly performed in one memory mat among the plurality of memory mats, and the portions, which have a circuit operation not required, stop their operations during the refresh period. Therefore, the current consumption in the data holding mode can be remarkably reduced, and it is possible to provide a large-capacity DRAM with data holding current reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:

a plurality of memory mats each having a plurality of memory cells arranged in a matrix of rows and columns, each memory mat including a plurality of row blocks of memory cell rows;

detecting means for detecting, in accordance with an externally applied signal, designation of a data holding mode different from a normal operation mode for performing data input and output; and mat changing means, responsive to detection of the data holding mode by said detecting means, for changing a mode of selection of the row blocks in a selected memory mat between the data holding mode and the normal operation mode such that a row block different from a row block in the selected memory mat selected in the normal operation mode is selected in the data holding mode.

2. The semiconductor memory device according to claim 1, wherein said mat changing means comprises means responsive to the detection of said data holding mode for selecting one memory mat out of said plurality of memory mats, and responsive to non-detection of said data holding mode for selecting at least one of said plurality of memory mats at a time.

3. The semiconductor memory device according to claim 1, wherein said plurality of memory mats each include a plurality of row blocks each including a plurality of rows of the memory cells;

said mat changing means includes means responsive to detection of the data holding mode by said detecting means for selecting simultaneously a predetermined number of row blocks in a selected memory mat out of said plurality of memory mats for simultaneously refreshing storage data of the memory cells in the selected row blocks, and responsive to non-detection of said data holding mode for selecting simultaneously a row block in each of said plurality of memory mats for data access.

4. The semiconductor memory device according to claim 1, further comprising:

means for periodically generating a refresh operation activating signal in response to the detection of said data holding mode;

means for simultaneously selecting memory cells to be refreshed in a predetermined number of row blocks in the selected memory mat in response to said refresh operation activating signal;

amplifying means for amplifying and restoring data of simultaneously selected memory cells; and speed changing means responsive to the detection of said data holding mode for reducing an operation speed of said amplifying means below that in said normal operation mode.

5. The semiconductor memory device according to claim 1, further comprising:

input buffer means operating with voltages on power source nodes as operating power supply voltages, for receiving and buffering said externally applied signal for application to said detecting means, and cut off means responsive to said detection of said data holding mode for cutting off a current flow path flowing a current through said input buffer means between said power source nodes.

6. The semiconductor memory device according to claim 1, further comprising;

internal voltage generating means provided for each of said plurality of memory mats, for generating a predetermined internal voltage for application to a corresponding memory mat, and deactivating means responsive to the detection of said data holding mode for disabling the application of the internal voltage to a nonselected memory mat from a corresponding internal voltage generating means.

7. The semiconductor memory device according to claim 1, wherein the number of simultaneously selected row blocks in the data holding mode is the same as the number of simultaneously selected row blocks in the normal operation mode.

8. The semiconductor memory device according to claim 1, wherein said mat changing means includes means, responsive to the detection of the data holding mode, for reducing the number of selected memory mats to a value smaller than the number of memory mats selected in the normal operation mode.

9. A semiconductor memory device comprising:

a plurality of memory mats each having a plurality of memory cells arranged in a matrix form;

detecting means for detecting, in accordance with an externally applied signal, designation of a data holding mode different from a normal operation mode for performing data input and output;

mat changing means, responsive to detection of the data holding mode by said detecting means, for setting the number of selected memory mats among said plurality of memory mats to a value different from that of memory mats selected in said normal operation mode;

refresh address generation means, responsive to the detection of the data holding mode, for generating a refresh address designating memory cells to be refreshed;

a multiplexer, receiving said refresh address and an external address designating a memory cell to be accessed, for selectively passing said refresh address in response to the detection of the data holding mode;

an address buffer receiving and buffering an address signal from said multiplexer to generate an internal address signal; and control means, responsive to said detection of said data holding mode for causing said address buffer to operate statically, and responsive to non-detection of said data holding mode for causing said address buffer to operate dynamically.

10. A semiconductor memory device comprising:

a plurality of memory mats each having a plurality of memory cells arranged in a matrix form, wherein each of said memory mats includes a plurality of row blocks each including a plurality of rows of memory cells;

detecting means for detecting, in accordance with an externally applied signal, designation of a data holding mode different from a normal operation mode for performing data input and output;

mat changing means, responsive to detection of the data holding mode by said detecting means, for setting the number of selected memory mats among said plurality of memory mats to a value different from that of memory mats selected in said normal operation mode; and control means, responsive to the detection of said data holding mode, for repetitively generating a refresh operation activation signal at first intervals a predetermined number of times equal in number to the rows of memory cells in a row block and stopping generation of said refresh operation activation signal for a second interval longer than the first interval and for repeating the generating and stopping while the data holding mode is detected.

11. A semiconductor memory device comprising:

a plurality of memory mats each having a plurality of memory cells:

a plurality of internal power supply circuits provided corresponding to said plurality of memory mats for producing an internal power supply potential from an externally supplied power supply potential and supplying the same to the corresponding memory mats, respectively;

detecting means responsive to an externally applied signal to detect designation of a data holding mode for holding storage data of said memory cells;

refresh control means responsive to detection of the data holding mode by said detecting means for generating periodically an activating signal for performing refreshing of storage data of the memory cells in said plurality of memory mats;

refresh mat designating means responsive to said activating signal, for generating a mat designating signal for designating one of said plurality of memory mats; and power supply control means responsive to the mat designating signal applied from said refresh mat designating means for stopping a supply of the internal power supply potential to said memory mat different from said memory mat designated by said mat designating signal.

12. A semiconductor memory device comprising:

a memory array including a plurality of sub-arrays each having a plurality of memory cells arranged in a matrix form;

holding mode detecting means responsive to an externally applied signal for detecting a designation of a data holding mode for holding storage data of the memory cells of said memory array; and refreshing means responsive to the detection of the data holding mode by said holding mode detecting means, for refreshing the storage data of the memory cells in said plurality of sub-arrays on a sub array by sub array basis, the memory cells in each of the sub-arrays successively refreshed by the refreshing operation performed sub-array by sub-array, and the refreshing of the storage data of the memory cells in the sub-array being performed upon expiration of a predetermined period after completion of the refreshing of the memory cells in a preceding sub-array.

13. The semiconductor memory device according to claim 12, wherein said refreshing means includes:

means responsive to the detection of said data holding mode for generating an activating signal for activating said refresh operation, and address means responsive to the detection of said data holding mode, for producing a refresh address designating a memory cell to be refreshed, said address means being statistically operable to produce said refresh address in response to the detection of said data holding mode; and wherein said semiconductor memory device further comprises refresh driving means for refreshing the storage data of the designated memory cell in accordance with said refresh address.

14. The semiconductor memory device according to claim 12, further comprising:

a plurality of sense amplifier bands arranged between adjacent sub-arrays of said plurality of sub-arrays and commonly used by the adjacent sub-arrays, each of said plurality of sense amplifier bands including a plurality of sense amplifiers arranged corresponding to columns of the memory cells in the corresponding sub-arrays for sensing, amplifying and restoring the storage data of the memory cells read onto the corresponding columns, respectively; and connection/disconnection gate means for mutually connecting the sub-arrays and the corresponding sense amplifier bands, respectively, and wherein said refreshing means includes connection/disconnection control means responsive to said refresh address and the detection of said data holding mode for generating a control signal for controlling turn-on of said connection/disconnection gate means during the refresh operation performed on a sub-array basis, and said connection/disconnection control means includes means for holding the state of said control signal unchangedly during the refresh operation performed on a sub-array basis.

15. The semiconductor memory device according to claim 12, wherein said memory array includes a plurality of main word lines arranged corresponding to rows of the memory cells, respectively, and a plurality of sub-word lines corresponding to said main word lines and arranged corresponding to said sub-arrays, respectively, each of said plurality of sub-word lines connected to the memory cells in a corresponding row of a corresponding sub-array, each of said sub-arrays including the plurality of sub-word lines; and said refreshing means includes means responsive to said refresh address during the refresh operation performed on a sub-array basis, for generating a sub-array designating signal for connecting a sub-word line and a main word line together, the sub-array designating signal generating means including means for holding the state of said sub-array designating signal during the refresh operation performed on a sub-array basis when said data holding mode is detected.

16. The semiconductor memory device according to claim 12, wherein said memory array includes a plurality of main bit line pairs arranged corresponding to columns of said memory cells, respectively, and a plurality of sub-bit line pairs arranged corresponding to said main bit line pairs and to the columns of the memory cells in corresponding sub-arrays and connected to the memory cells in the columns of the corresponding sub-arrays, respectively, each of said sub-arrays including a plurality of sub-bit line pairs; and said refreshing means includes means for continuously establishing a connection state between a sub-bit line pair and a corresponding main bit line pair in the sub-array to be refreshed in response to said refresh address during the refresh operation performed on a sub-array basis.

* * * * *